United States Patent
Aika et al.

(10) Patent No.: US 10,916,500 B2
(45) Date of Patent: Feb. 9, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventors: Tomohiko Aika, Ibaraki (JP); Takayuki Igarashi, Ibaraki (JP); Takehiro Ochi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/523,685

(22) Filed: Jul. 26, 2019

(65) Prior Publication Data

US 2020/0051913 A1 Feb. 13, 2020

(30) Foreign Application Priority Data

Aug. 10, 2018 (JP) .................. 2018-151398

(51) Int. Cl.
*H01L 23/525* (2006.01)
*H01L 21/8234* (2006.01)
*H01L 27/06* (2006.01)

(52) U.S. Cl.
CPC .. *H01L 23/5256* (2013.01); *H01L 21/823443* (2013.01); *H01L 21/823475* (2013.01); *H01L 27/0617* (2013.01)

(58) Field of Classification Search
CPC ......... H01L 23/5256; H01L 21/823443; H01L 21/823475; H01L 27/0617; H01L 29/4958
See application file for complete search history.

(56) References Cited

U.S. PATENT DOCUMENTS

| | | | |
|---|---|---|---|
| 2007/0007621 A1* | 1/2007 | Omura | H01L 27/112 257/529 |
| 2010/0193867 A1* | 8/2010 | Yan | H01L 23/5256 257/355 |
| 2017/0005036 A1* | 1/2017 | Kodama | H01L 21/02532 |
| 2017/0200727 A1* | 7/2017 | Yoon | H01L 23/5226 |

FOREIGN PATENT DOCUMENTS

JP   04-051563 A   2/1992

* cited by examiner

*Primary Examiner* — Changhyun Yi
(74) *Attorney, Agent, or Firm* — McDermott Will & Emery LLP

(57) ABSTRACT

Reliability of a semiconductor device is improved. The semiconductor device includes a silicon pattern for a fuse element, a metal silicide layer formed on an upper surface and a side surface of the silicon pattern, a gate electrode for MISFET, and a metal silicide layer formed on an upper surface of the gate electrode. The height from the lower surface of the silicon pattern to the lower end of the metal silicide layer is lower than the height from the lower surface of the gate electrode to the lower end of the metal silicide layer.

17 Claims, 42 Drawing Sheets

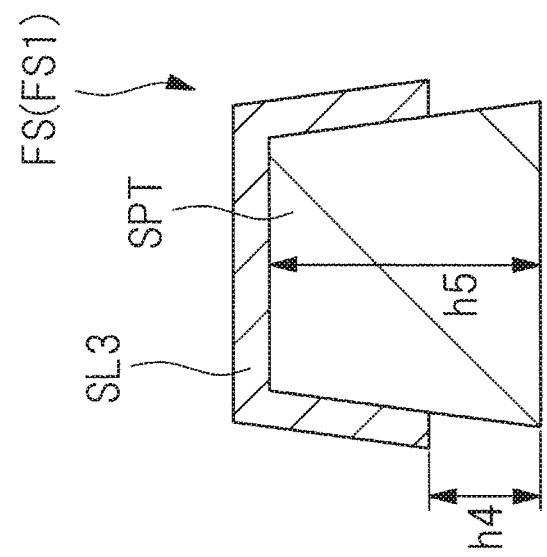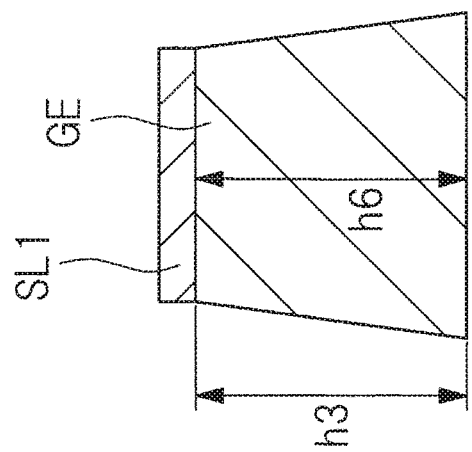

SEMICONDUCTOR DEVICE AND METHOD OF MANUFACTURING THE SAME

CROSS-REFERENCE TO RELATED APPLICATIONS

The disclosure of Japanese Patent Application No. 2018-151398 filed on Aug. 10, 2018 including the specification, drawings and abstract is incorporated herein by reference in its entirety.

BACKGROUND

The present invention relates to a semiconductor device and a manufacturing method thereof, and, for example, the present invention relates to a semiconductor device having a MISFET and a fuse element and a technique useful for the manufacturing technique of the semiconductor device.

The semiconductor device incorporates various semiconductor elements such as a field-effect transistor (MISFET: Metal Insulator Semiconductor Field Effect Transistor).

In addition, a fuse element may be incorporated in a semiconductor device.

For example, a fuse element is provided in advance in a semiconductor device, and the fuse element is cut off as necessary, so that circuit characteristics can be adjusted or a circuit can be eliminated if defective.

For cutting the fuse element, a method of blowing the fuse element by irradiating the fuse element with a laser beam or a method of blowing the fuse element with Joule heat by passing a current is used.

Japanese unexamined Patent Application publication No. 4-51563 describes a technique related to a fuse.

SUMMARY

It is desired to improve reliability of a semiconductor device having a MISFET and a fuse element.

Other objects and novel features will become apparent from the description of this specification and the accompanying drawings. Means of solving the problems According to one embodiment, a semiconductor device includes a silicon pattern for a fuse element, a first metal silicide layer formed on an upper surface and a side surface of the silicon pattern, a gate electrode for MISFET, and a second metal silicide layer formed on an upper surface of the gate electrode.

The first height from the lower surface of the silicon pattern to the lower end of the first metal silicide layer is lower than the second height from the lower surface of the gate electrode to the lower end of the second metal silicide layer.

According to one embodiment, reliability of the semiconductor device can be improved.

BRIEF DESCRIPTION OF THE DRAWINGS

FIG. 40(A) and FIG. 40(B) are cross-sectional views of the gate electrode and the fuse element.

DETAILED DESCRIPTION

Figure 1:
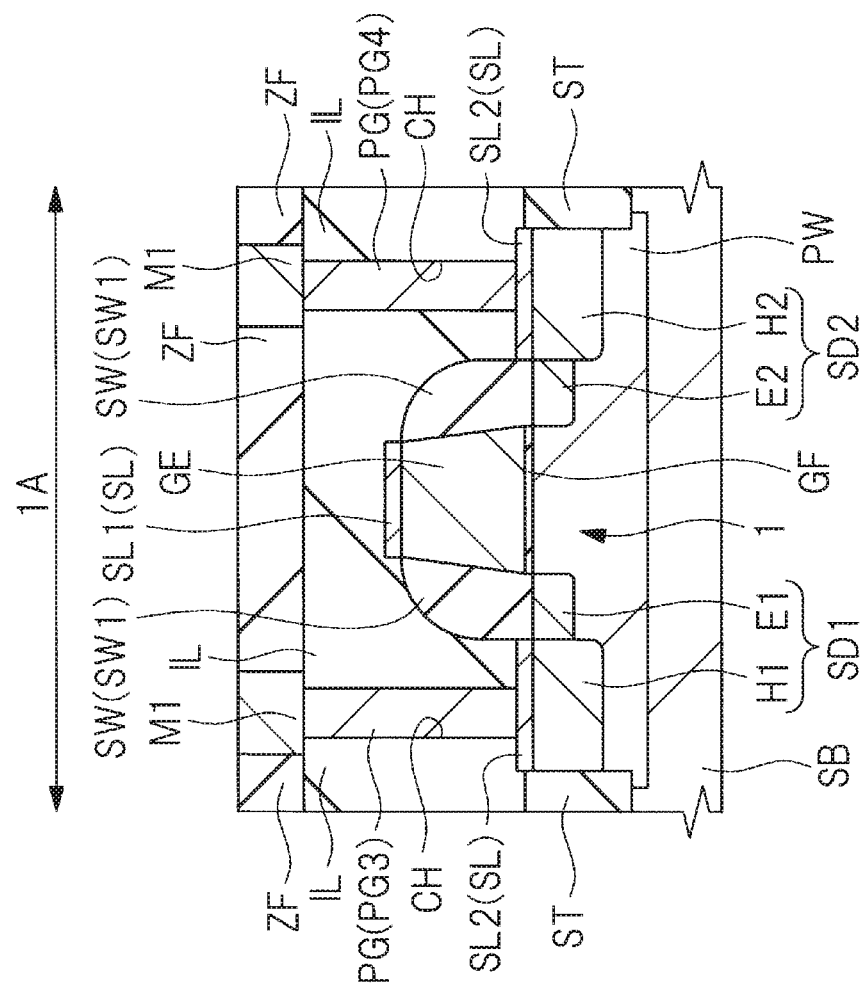
FIG. 1 is a cross-sectional view of a main part of a semiconductor device according to an embodiment.

In the following embodiments, when it is necessary for convenience, the description will be made by dividing into a plurality of sections or embodiments, but except for the case specifically specified, these sections and embodiments are not independent of each other, and one of them is related to some or all of modifications, details, supplementary description, and the like of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted in order to make the drawings easier to see even in a cross-sectional view. In addition, even in a plan view, hatching may be used to make the drawing easier to see.

Figure 2:
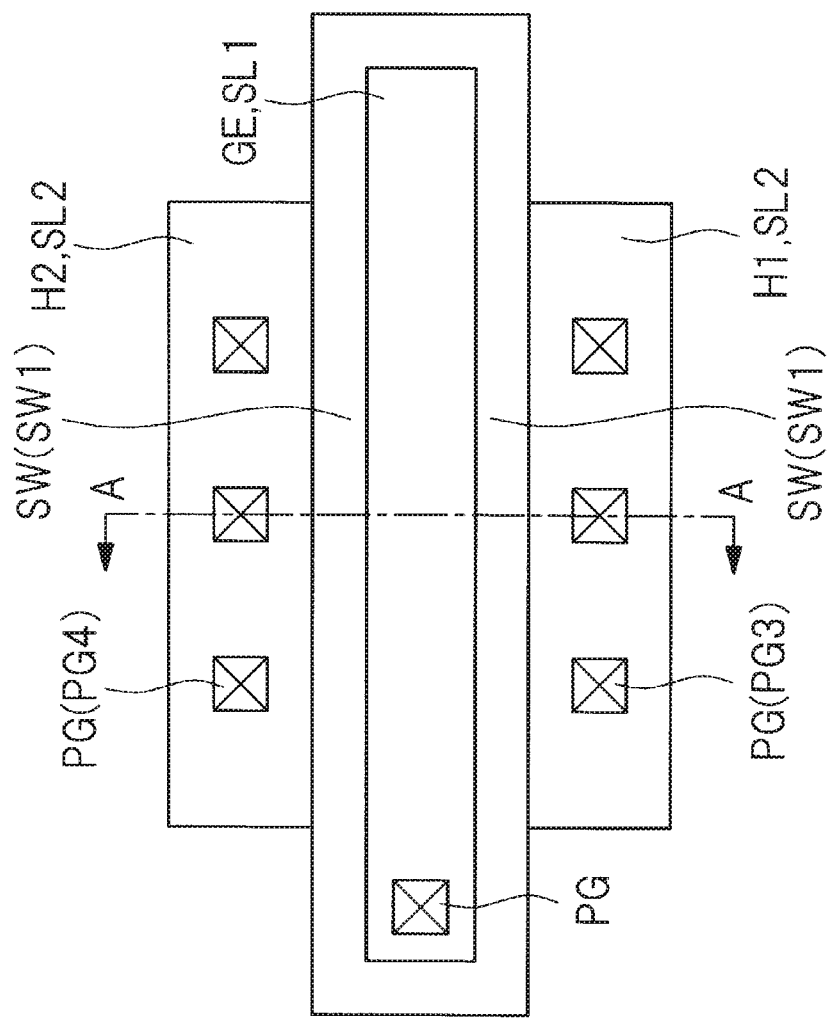
FIG. 2 is a plan view of a main part of the semiconductor device according to the embodiment.
Figure 3:
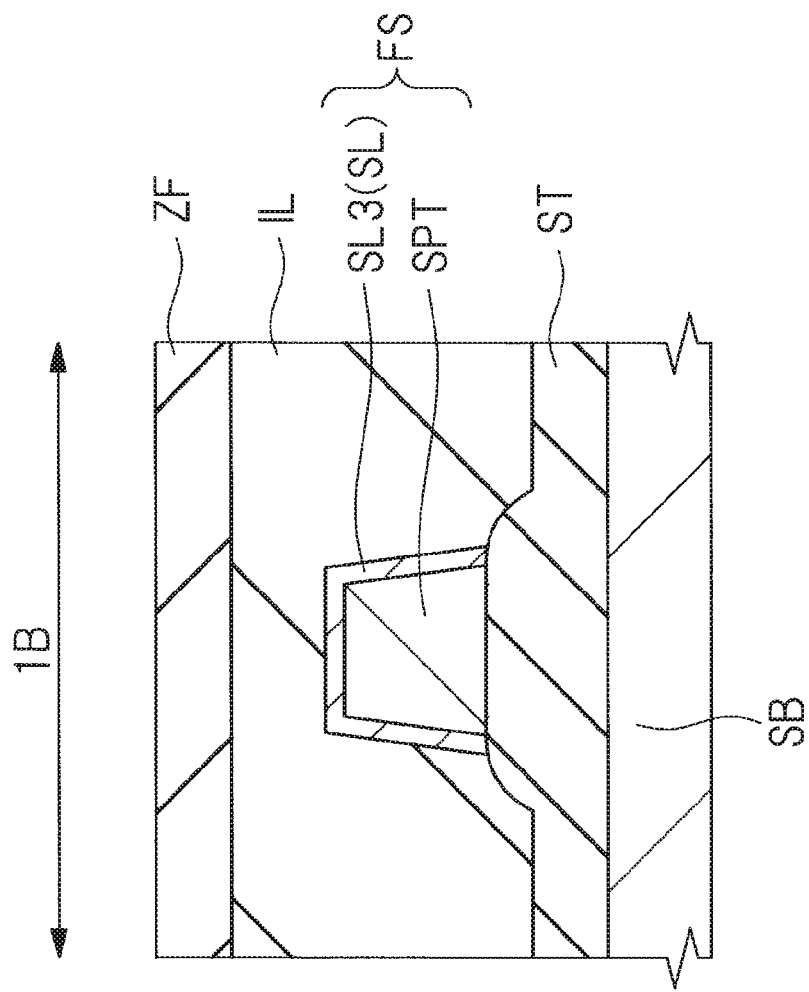
FIG. 3 is a cross-sectional view of a main part of a semiconductor device according to an FIG. 4 is a cross-sectional view of a main part of a semiconductor device according to an embodiment.
Figure 4:
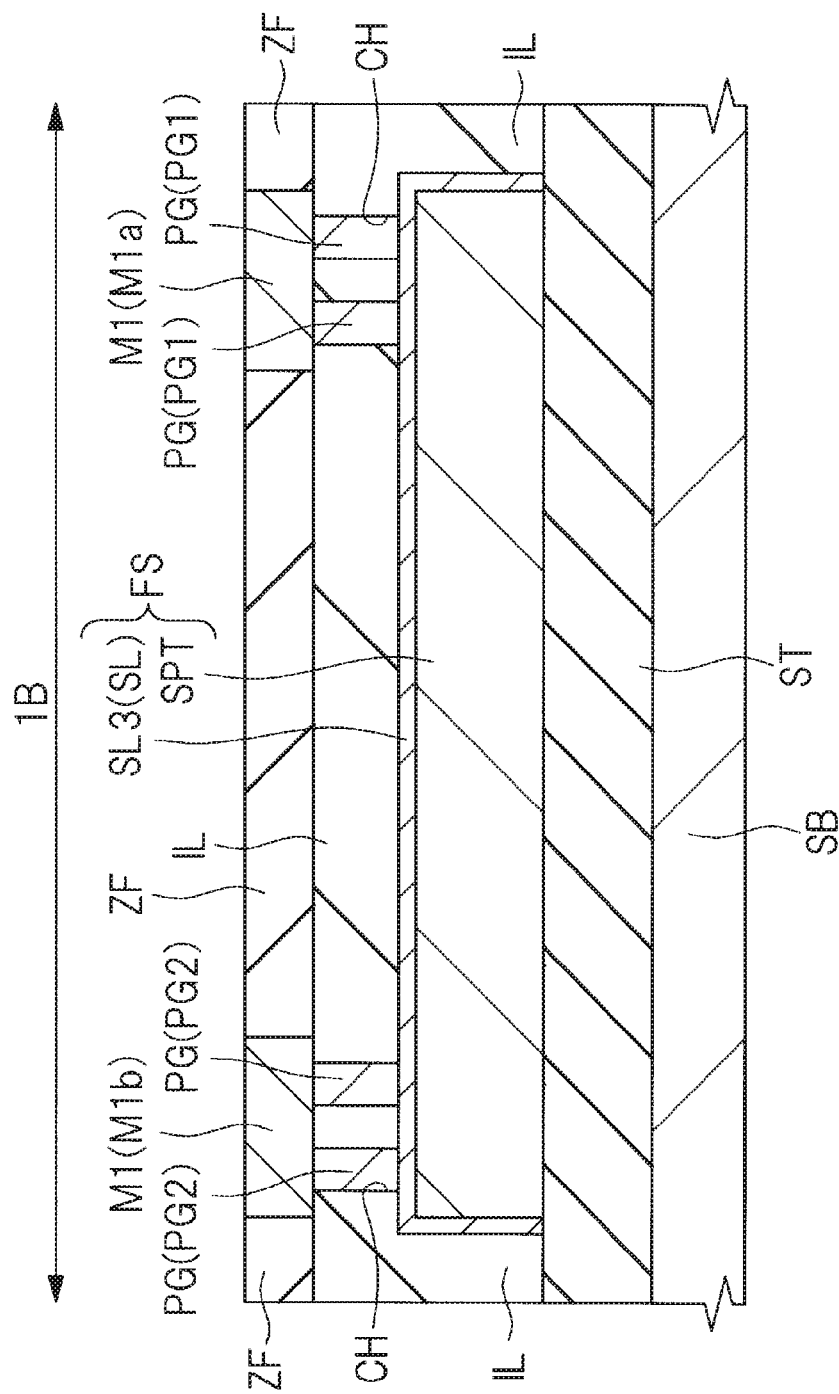
Figure 5:
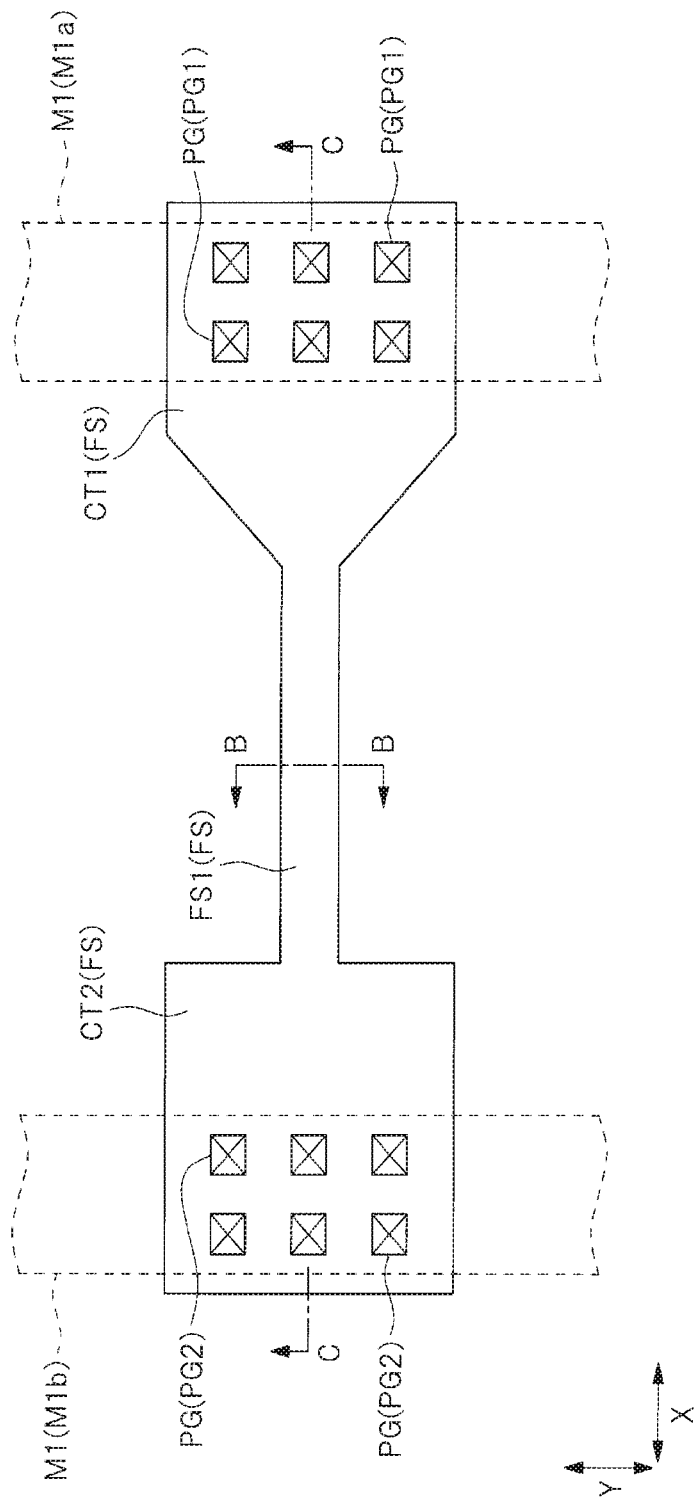
FIG. 5 is a plan view of a main part of the semiconductor device according to the embodiment.

A semiconductor device of the present embodiment will be described with reference to FIGS. 1 to 5. FIGS. 1 to 5 are cross-sectional views of main parts or plan views of main parts of the semiconductor device of the present embodiment. FIGS. 1 and 2 are a cross-sectional view (FIG. 1) and a plan view (FIG. 2) of the MISFET forming area 1A. FIGS. 3 to 5 are cross-sectional views (FIGS. 3 and 4) and plan views (FIG. 5) of the fuse element forming area 1B. FIG. 1 corresponds to a cross-sectional view taken along line A-A of FIG. 2, FIG. 3 corresponds to a cross-sectional view taken along line B-B of FIG. 5, and FIG. 4 corresponds to a cross-sectional view taken along line C-C of FIG. 5.

The semiconductor device of this embodiment mode is a semiconductor device including a MISFET (Metal Insulator Semiconductor Field Effect Transistor) and a fuse element.

Here, the MISFET forming region 1A is a region (planar region) in which a MISFET is formed in (the main surface of) the semiconductor substrate SB. The fuse element forming region 1B is a region (planar region) in which the fuse element FS is formed in (the main surface of) the semiconductor substrate SB. The MISFET forming region 1A and the fuse element forming region 1B exist in the same semiconductor substrate SB. In other words, the MISFET formation region 1A and the fuse element formation region 1B correspond to plane regions on the same main surface of the semiconductor substrate SB, which differ from each other.

In the semiconductor substrate SB constituting the semiconductor device, element isolation regions ST made of an insulator are formed. The isolation regions ST are formed of insulating films, preferably silicon oxide films, buried in trenches formed in the semiconductor substrate SBs. The device isolation region ST defines an active region of the semiconductor substrate SB.

First, referring to FIGS. 1 and 2, a basic configuration of a MISFET1 formed in the semiconductor device of the present embodiment will be described.

Although an n-channel type MISFET is formed in the MISFET formation region 1A in this embodiment mode, a p-channel type MISFET can be formed in the MISFET formation region 1A by reversing the conductivity type, or both an n-channel type MISFET and a p-channel type MISFET can be formed.

As shown in FIGS. 1 and 2, in the semiconductor substrate SB of the MISFET forming region 1A, a p-type well PW is formed in the active region defined by the device isolation region ST. The MISFET1 has n-type semiconductor regions SD1, SD2 for source/drain (source or drain) formed in a p-type well PW of a semiconductor substrate SB, and gate electrodes GE formed on a semiconductor substrate SB (p-type well PW) via an insulating film GF as a gate dielectric film.

The gate electrode GE is formed on a semiconductor substrate SB (p-type well PW) between the semiconductor region SD1 and the semiconductor region SD2 with an insulating film GF interposed between the gate electrode GE and the p-type well PW. The semiconductor region SD1 is a semiconductor region functioning as one of a source region and a drain region, and the semiconductor region SD2 is a semiconductor region functioning as the other of the source region and the drain region. The insulating film GF interposed between the gate electrode GE and the semiconductor substrate SB functions as a gate dielectric film of the MISFET1. The insulating film GF is made of, for example, a silicon oxide film, but an insulating film other than the silicon oxide film can be used as the insulating film GF.

The gate electrode GE is formed of a silicon film such as a polycrystalline silicon film (doped polysilicon film). It is preferable that the silicon film constituting the gate electrode GE has a low resistance by introducing impurities. Metallic silicide layers SL1 are formed on the upper surfaces of the gate electrodes GE. That is, a metallic silicide layer SL1 is formed on the upper surface of the silicon film constituting the gate electrode GE.

Sidewall spacers SW1 are formed on the sidewalls of the gate electrodes GE. That is, the sidewall spacers SW1 are formed so as to adjoin the gate electrodes GE. In other words, the direction spacers SW1 are formed on both sides of the gate electrodes GE. As can be seen from the plan view of FIG. 2, the sidewall spacer SW1 is formed so as to surround the periphery of the gate electrode GE in the plan view of the gate electrode GE. Therefore, in the cross-sectional view of FIG. 1, the sidewall spacers SW1 on both sides of the gate electrode GE are separated from each other by the gate electrode GE, but actually, the sidewall spacers SW1 on both sides of the gate electrode GE are integrally connected to each other. Since the side surface of the gate electrode GE is covered with the sidewall spacer SW1, the metal silicide layer SL1 is formed on the upper surface of the gate electrode GE, but the metal silicide layer SL1 is not formed on the side surface of the gate electrode GE (the side surface covered with the sidewall spacer SW1).

In the semiconductor substrate SB (p-type well PW), the semiconductor regions SD1, SD2 are formed on both sides of the gate electrodes GE (both sides in the gate length direction). That is, in the semiconductor substrate SB (p-type well PW), the semiconductor region SD1 is formed on one of both sides of the gate electrode GE, and the semiconductor region SD2 is formed on the other side of the gate electrode GE. Each of the semiconductor regions SD1, SD2 has a Lightly doped Drain structure. That is, the semiconductor region SD1 has an n-type semiconductor region E1 and an n+type semiconductor region H1, and the semiconductor region SD2 has an n-type semiconductor region E2 and an n+type semiconductor region H2. The n+type semiconductor region H1 has a higher impurity concentration and a deeper junction depth than the n-type semiconductor region E1, and the n+type semiconductor region H2 has a higher impurity concentration and a deeper junction depth than the n-type semiconductor region E2.

In the p-type well PW, the n-type semiconductor regions E1 and E2 are formed mainly below the sidewall spacers SW1 and adjoin the MISFET1 channel formation region, but the n-type semiconductor region E1 and the n-type semiconductor region E2 are located on opposite sides of each other with the MISFET1 channel formation region interposed therebetween. The n+type semiconductor region H1 is adjacent to the n-type semiconductor region E1 and separated from the MISFET1 channel formation region by the n-type semiconductor region E1, and the n+type semiconductor region H2 is adjacent to the n-type semiconductor region E2 and separated from the MISFET1 channel formation region by the n-type semiconductor region E2. In the p-type well PW, a region under the insulating film GF under the gate electrode GE corresponds to a channel-forming region of the MISFET1. Metallic silicide layers SL2 are formed on the upper surfaces of the n+type semiconductor regions H1 and H2, respectively.

The above is the basic configuration of the MISFET1.

Next, a basic configuration of the fuse element FS formed in the semiconductor device of the present embodiment will be described with reference to FIGS. 3 to 5.

The fuse element FS is formed on the element isolation region ST in the fuse element forming region 1B. The fuse element FS is entirely located on the element isolation region ST.

The fuse element FS includes a silicon pattern SPT formed on the isolation regions ST, and a metallic silicide layer SL3 formed on the surface of the silicon pattern SPT. That is, the fuse element FS has a stacked structure of the silicon pattern SPT and the metal silicide layer SL3. The silicon pattern SPT consists of a patterned silicon film, more particularly a patterned polycrystalline silicon film. The metallic silicide layer SL3 is formed not only on the upper surface of the silicon pattern SPT but also on the side surface of the silicon pattern SPT. The resistivity of the metallic silicide layers SL3 is lower than the resistivity of the silicon patterns SPTs.

The fuse element FS includes a silicon pattern SPT formed on the isolation regions ST, and a metallic silicide layer SL3 formed on the surface of the silicon pattern SPT. That is, the fuse element FS has a stacked structure of the silicon pattern SPT and the metal silicide layer SL3. The silicon pattern SPT consists of a patterned silicon film, more particularly a patterned polycrystalline silicon film. The metallic silicide layer SL3 is formed not only on the upper surface of the silicon pattern SPT but also on the side surface of the silicon pattern SPT. The resistivity of the metallic silicide layers SL3 is lower than the resistivity of the silicon patterns SPTs.

The metal silicide layer SL1, the metal silicide layer SL2, and the metal silicide layer SL3 are formed in the same process. Therefore, the metal silicide layer SL1, the metal silicide layer SL2, and the metal silicide layer SL3 have the same metal elements as each other. In this embodiment mode, a cobalt silicide layer is preferably used as the metallic silicide layer SL1, SL2, SL3; however, a nickel silicide layer, a tungsten silicide layer, a titanium silicide layer, or the like can be used instead of the cobalt silicide layer.

However, when the metal silicide layer SL3 is a cobalt silicide layer, the metal silicide layer SL1 and the metal silicide layer SL2 are cobalt silicide layers, respectively, and when the metal silicide layer SL3 is a nickel silicide layer, the metal silicide layer SL1 and the metal silicide layer SL2 are also nickel silicide layers, respectively. When the metal silicide layer SL3 is a tungsten silicide layer, the metal silicide layer SL1 and the metal silicide layer SL2 are tungsten silicide layers, respectively, and when the metal silicide layer SL3 is a titanium silicide layer, the metal silicide layer SL1 and the metal silicide layer SL2 are also titanium silicide layers, respectively.

The metal silicide layer SL1 of the gate electrode GE, the metal silicide layer SL2 on the n+type semiconductor region H1, the metal silicide layer SL2 on the n+type semiconductor region H2, and the metal silicide layer SL3 on the silicon patterns SPT are not in contact with each other, but are separated from each other.

The fuse element FS extends in the X direction on the element isolation region ST. Note that the X direction and the Y direction shown in FIG. 5 are directions substantially parallel to the main surface of the semiconductor substrate SB, and the X direction and the Y direction are directions perpendicular to each other. The extending direction of the gate electrode GE, that is, the gate width direction of the gate electrode GE may be the X direction or the Y direction.

Specifically, the fuse element FS has a fuse element portion FS1 extending in the X direction, a contact portion CT1 integrally connected to one end portion (end portion in the X direction) of the fuse element portion FS1, and a contact portion CT2 integrally connected to the other end portion (end portion in the X direction) of the fuse element portion FS1. That is, the fuse element FS integrally includes a pair of contact portions CT1, CT2 arranged in the X-direction and a fuse element portion FS1 having a small width connecting the contact portions CT1, CT2. The width (width in the Y direction) of the fuse element portion FS1 is smaller than the width (width in the Y direction) of each of the contact portions CT1, CT2. In FIG. 5, the contact portion CT1 is gradually reduced as it approaches the fuse element portion FS1.

An interlayer insulating film IL is formed as an insulating film on the semiconductor substrate SB so as to cover the fuse element FS, the element isolation regions ST, the gate electrodes GE, the sidewall spacers SW1, and the metal silicide layer SL1, SL2, SL3. A plurality of contact holes (through holes) CH are formed in the interlayer insulating film IL, and conductive plugs PG are formed (buried) in the contact holes CH, respectively. A wiring M1 is formed on the interlayer insulating film IL in which the plugs PG are buried. In FIG. 1, FIG. 3, and FIG. 5, the wiring M1 is a buried wiring buried in the insulating film ZF formed on the interlayer insulating film IL by a damascene technique. In FIG. 1, FIG. 3, and FIG. 5, the structures above the insulating film ZF in which the wiring M1 is buried are not shown.

The plug PG includes a plug PG1 connected to the contact portion CT1 of the fuse element FS, a plug PG2 connected to the contact portion CT2 of the fuse element FS, a plug PG3 connected to the n+type semiconductor region H1, a plug PG4 connected to the n+type semiconductor region H2, and a plug (not shown in FIG. 1) connected to the gate electrode GE. The wiring M1 also includes a wiring M1 an extending over the plug PG1 and connected to the plug PG1, and a wiring M1b extending over the plug PG2 and connected to the plug PG2.

In the MISFET forming region 1A, the plug PG3 is disposed on the n+type semiconductor region H1, and the bottom surface of the plug PG3 is in contact with and electrically connected to the metallic silicide layer SL2 formed on the n+type semiconductor region H1. The plug PG4 is disposed on the n+type semiconductor region H2, and the bottom surface of the plug PG4 is in contact with and electrically connected to the metallic silicide layer SL2 formed on the n+type semiconductor region H2. Although not shown in the cross section of FIG. 1, the bottom surface of the plug PG disposed on the gate electrode GE is electrically connected to the metal silicide layer SL1 formed on the gate electrode GE.

In the fuse element FS, the contact portion CT1 is a portion for connecting the plug PG1, and the contact portion CT2 is a portion for connecting the plug PG2. For this reason, one or more plugs PG1 are disposed on the contact portions CT1, more regularly, the metal silicide layers SL3 of the contact portions CT1, and the wiring M1 *a* is electrically connected to the contact portions CT1 via the plugs PG1. In addition, one or more plugs PG2 are disposed on the contact portions CT2, more regularly, the metal silicide layers SL3 of the contact portions CT2, and the wiring M1b is electrically connected to the contact portions CT2 through the plugs PG2. The plug PG1 is disposed between the contact portion CT1 and the wiring M1a, the bottom surface of the plug PG1 is in contact with and electrically connected to the metal silicide SL3 of the contact portion CT1, and the top surface of the plug PG1 is in contact with the wiring M1a. The plug PG2 is disposed between the contact portion CT2 and the wiring M1b, the bottom surface of the plug PG2 is in contact with and electrically connected to the metallic silicide SL3 of the contact portion CT1, and the top surface of the plug PG2 is in contact with the wiring M1b. The wiring M1a and the wiring M1b are separated from each other.

The contact portion CT1, CT2 is preferably wider than the fuse element portion FS1 in the Y-direction, which makes it easier to connect the plug PG1, PG2 to the contact portion CT1, CT2, and enables the number of plugs PG1, PG2 connected to the contact portion CT1, CT2 to be increased. However, the contact portion CT1 need only have a width capable of connecting a necessary number of plugs PG1, and the contact portion CT2 need only have a width capable of connecting a necessary number of plugs PG2, and the width of the contact portion CT1,CT2 does not necessarily have to be larger than the width of the fuse element portion FS1.

Figure 6:
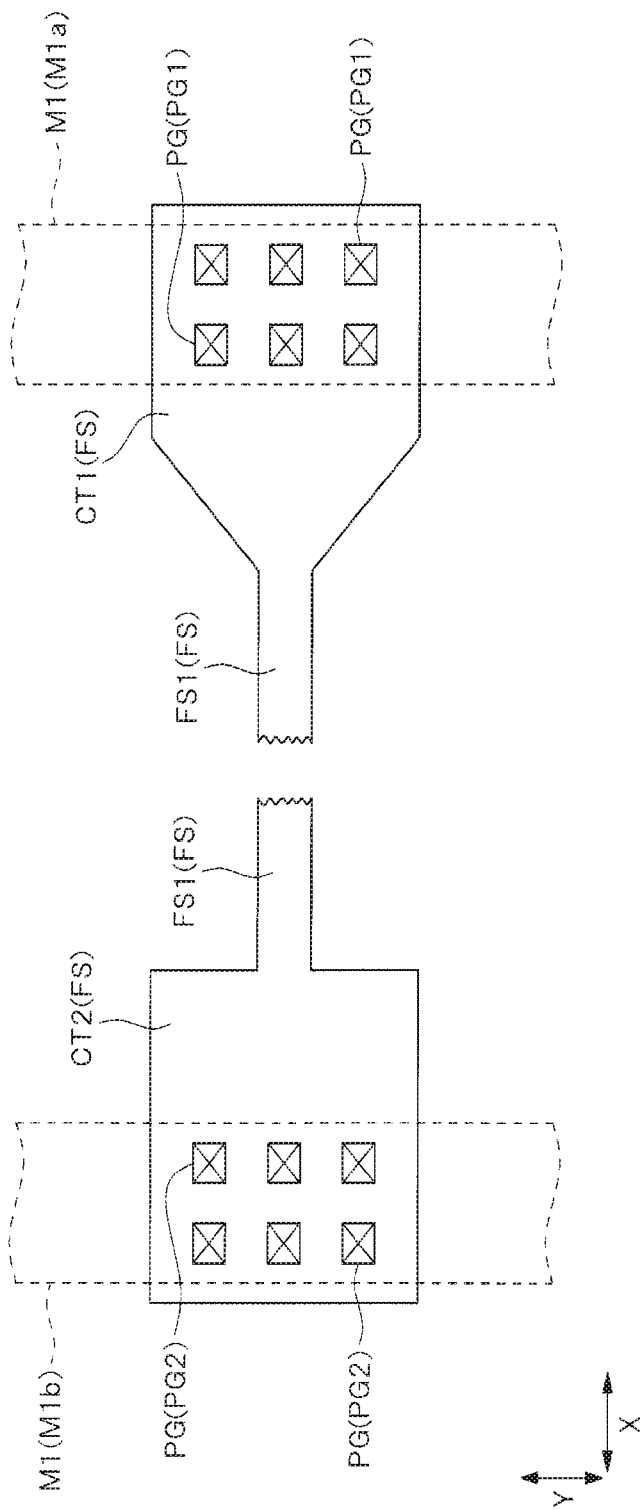
FIG. 6 is a plan view showing a fuse element which has been cut.

When the fuse element FS is not cut, the wiring M1a and the wiring M1b are electrically connected to each other via the plug PG1, the fuse element FS, and the plug PG2. When cutting the fuse element FS, a current passing through the fuse element FS is caused to flow between the plug PG1 and the plug PG2, thereby cutting the fuse element FS, more specifically, the fuse element portion FS1. FIG. 6 is a plan view showing the cut fuse element FS, and a plan view corresponding to FIG. 5 is shown.

In the present embodiment, for cutting the fuse element FS, a method of blowing the fuse element with Joule heat by flowing a current through the fuse element is used instead of a method of blowing the fuse element by irradiating a laser beam. That is, the fuse element FS is a current fusing type fuse element.

Specifically, when cutting the fuse element FS, voltages for cutting the fuse element FS are applied between the wiring M1a and the wiring M1b. As a result, a current flows between the wiring M1a and the wiring M1b through the plug PG1, the contact portion CT1 of the fuse element FS, the fuse element portion FS1 of the fuse element FS, the contact portion CT2 of the fuse element FS, and the plug PG2. The fuse element FS, in particular, the fuse element portion FS1, is heated by the Joule heat generated by the current flowing, and the temperature rises, and as a result, the fuse element portion FS1 of the fuse element FS is blown.

Figure 7:
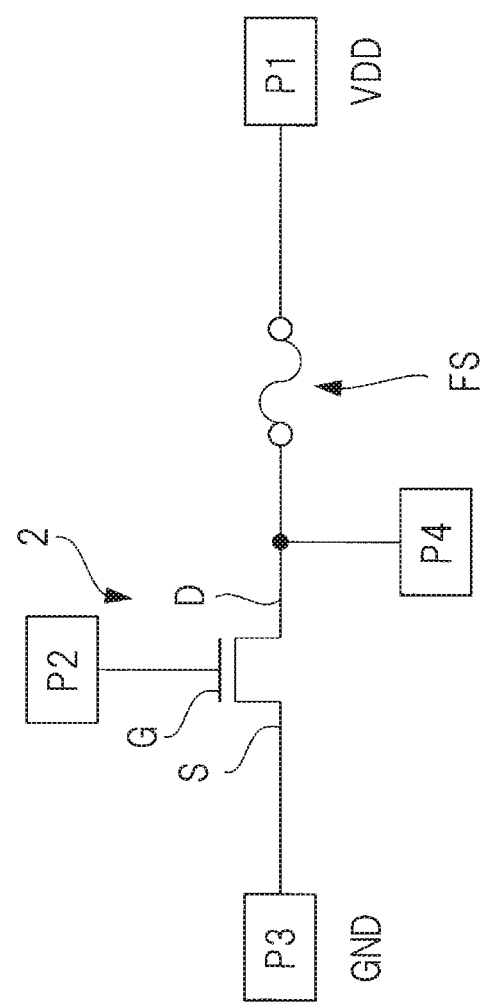
FIG. 7 is a circuit diagram showing an example of a circuit using a fuse element.

FIG. 7 is a circuit diagram showing a circuit example using the fuse element FS. In FIG. 7, the fuse element FS and the fuse element MISFET2 are connected in series. The MISFET2 is a transistor for cutting the fuse element FS, and the above MISFET1 configuration can be applied to the fuse element FS.

In FIG. 7, the fuse element FS and the MISFET2 are connected in series between the terminal P1 and the terminal P3, one of the contact portions CT1,CT2 of the fuse element FS is connected to the terminal P1, the other of the contact portions CT1,CT2 of the fuse element FS is connected to the drain D of the MISFET2, and the source S of the MISFET2 is connected to the terminal P3. The gates G of the MISFET2 are connected to the terminal P2. A terminal P4 is also connected to the drain D of the MISFET.

The terminal P1 is connected to the power supply potential VDD, and the terminal P3 is connected to the ground potential GND. Therefore, the power supply potential VDD is supplied to the drain D of the MISFET2 via the fuse element FS, and the ground potential GND is supplied to the source S of the MISFET2. The fuse element FS can function as a resistance element. When a voltage equal to or higher than the MISFET2 threshold voltage is supplied from the terminal P2 to the gate G of the MISFET2, the MISFET2 is turned on, and a current passing through the fuse element FS and the fuse element MISFET2 flows between the terminal P1 and the terminal P3. The fuse element FS generates heat by the Joule heat generated by the current flowing through the fuse element FS, and as a result, the fuse element FS, more particularly, the fuse element portion FS1 is cut.

Figure 8:
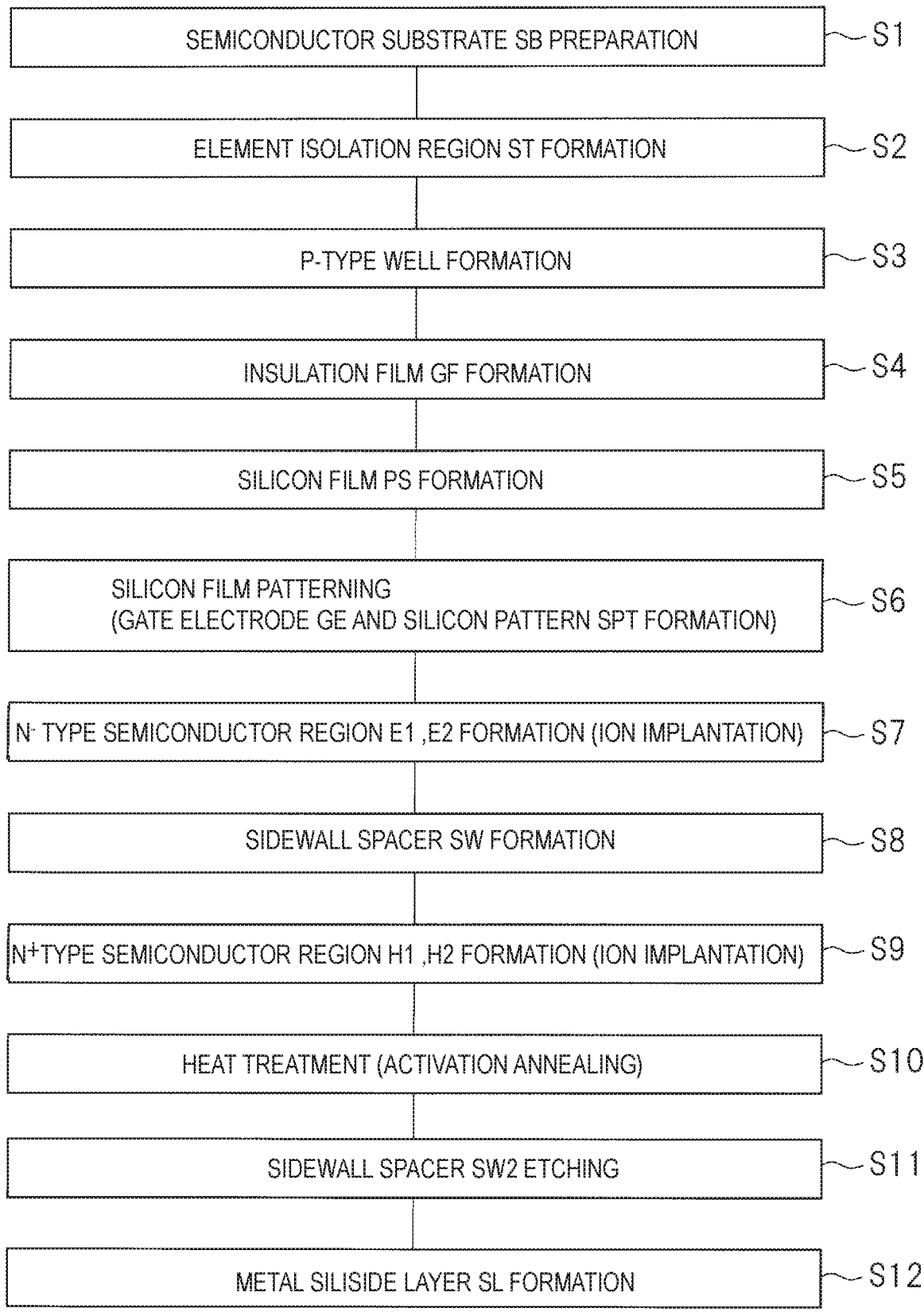
FIG. 8 is a process flow diagram showing a manufacturing process of the semiconductor device according to the embodiment.
Figure 9:
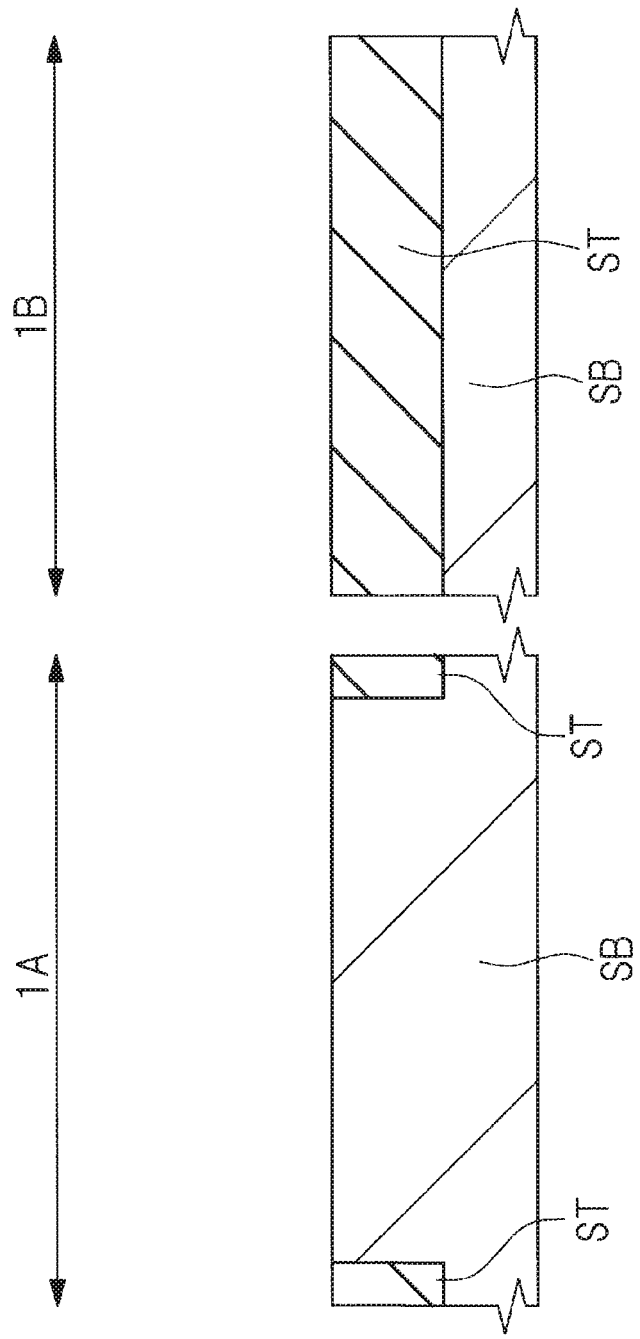
FIG. 9 is a cross-sectional view of a main part during a manufacturing process of the semiconductor device according to the embodiment.

The manufacturing process of the semiconductor device of the present embodiment will be described with reference to the drawings. FIG. 8 is a process flow diagram showing a part of the manufacturing process of the semiconductor device of the present embodiment. FIGS. 9 to 24 are cross-sectional views of main parts during the manufacturing process of the semiconductor device of the present embodiment. The cross-sectional views of FIGS. 9 to 24 show cross-sectional views of main parts of the MISFET formation region 1A and the fuse element formation region 1B, and show a state in which a MISFET1 is formed in the MISFET formation region 1A and a fuse element FS is formed in the fuse element formation region 1B. In FIGS. 9 to 24, a cross section corresponding to FIG. 1 is shown in the cross section of the MISFET formation region 1A, and a cross section corresponding to FIG. 3 is shown in the cross section of the fuse element formation region 1B.

First, as shown in FIG. 1, a semiconductor substrate (semiconductor wafer) SB made of, for example, p-type monocrystalline silicon having a resistivity of about 1 to 10 Ωcm is prepared (step S1 in FIG. 8). In step S2 of FIG. 8, isolation regions ST are formed on the main surface of the semiconductor substrate SB.

The device isolation regions ST are made of an insulator (insulating film) such as silicon oxide, and can be formed by, for example, an STI (Shallow Trench Isolation) method or the like. For example, after a trench for element isolation is formed in the main surface of the semiconductor substrate SB, an insulating film (e.g., a silicon oxide film) for forming element isolation regions is formed on the semiconductor substrate SB so as to fill the trench for element isolation. Then, by removing the insulating film outside the trench for element isolation, the element isolation region ST made of the insulating film buried in the trench for element isolation can be formed.

The device isolation region ST defines an active region of the semiconductor substrate SB. In plan view, the active region of the semiconductor substrate SB is surrounded by an isolation region ST. That is, the active region of the semiconductor substrate SB corresponds to a planar region in which the element isolation region ST is not formed in the semiconductor substrate SB and the periphery of which is surrounded by the element isolation region ST. A MISFET is formed in the active region defined by the isolation region ST in the MISFET forming region 1A as described later. In the fuse element forming region 1B, an element isolation region ST is formed over the entire fuse element forming region.

A fuse element is formed on the element isolation region ST in the fuse element forming region 1B as described later.

Figure 10:
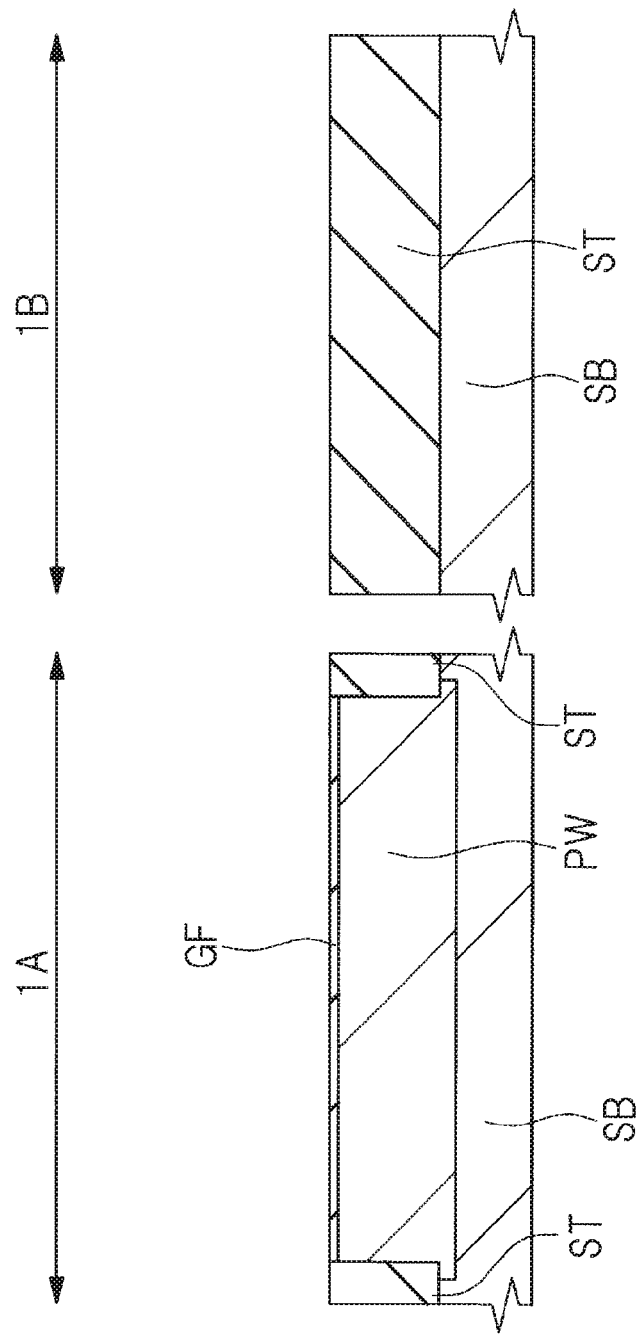
FIG. 10 is a cross-sectional view of a main part during the manufacturing process of the semiconductor device continued from FIG. 9.

Next, as shown in FIG. 10, in the MISFET forming region 1A, a p-type well (p-type semiconductor region) PW is formed over a predetermined depth from the main surface of the semiconductor substrate SB (step S3 in FIG. 8). The p-type well PW can be formed by, for example, ion-implanting a p-type impurity such as boron (B) into the semiconductor substrate SB.

Next, after the surface of the semiconductor substrate SB is cleaned by, for example, wet etching using hydrofluoric acid (HF) aqueous solution or the like, an insulating film (gate dielectric film) GF made of a silicon oxide film or the like is formed on the surface of the semiconductor substrate SB (the surface of the p-type well PW in the MISFET forming area 1A) (step S4 in FIG. 8). The insulating film GF formed in the MISFET forming area 1A is an insulating film for gate dielectric film of MISFET, and can be formed by, for example, a thermal oxidation method. When the insulating film GF is formed by the thermal oxidation method, the insulating film GF is formed on the surface of the semiconductor substrate SB, but the insulating film GF is not formed on the device isolation regions ST.

Figure 11:
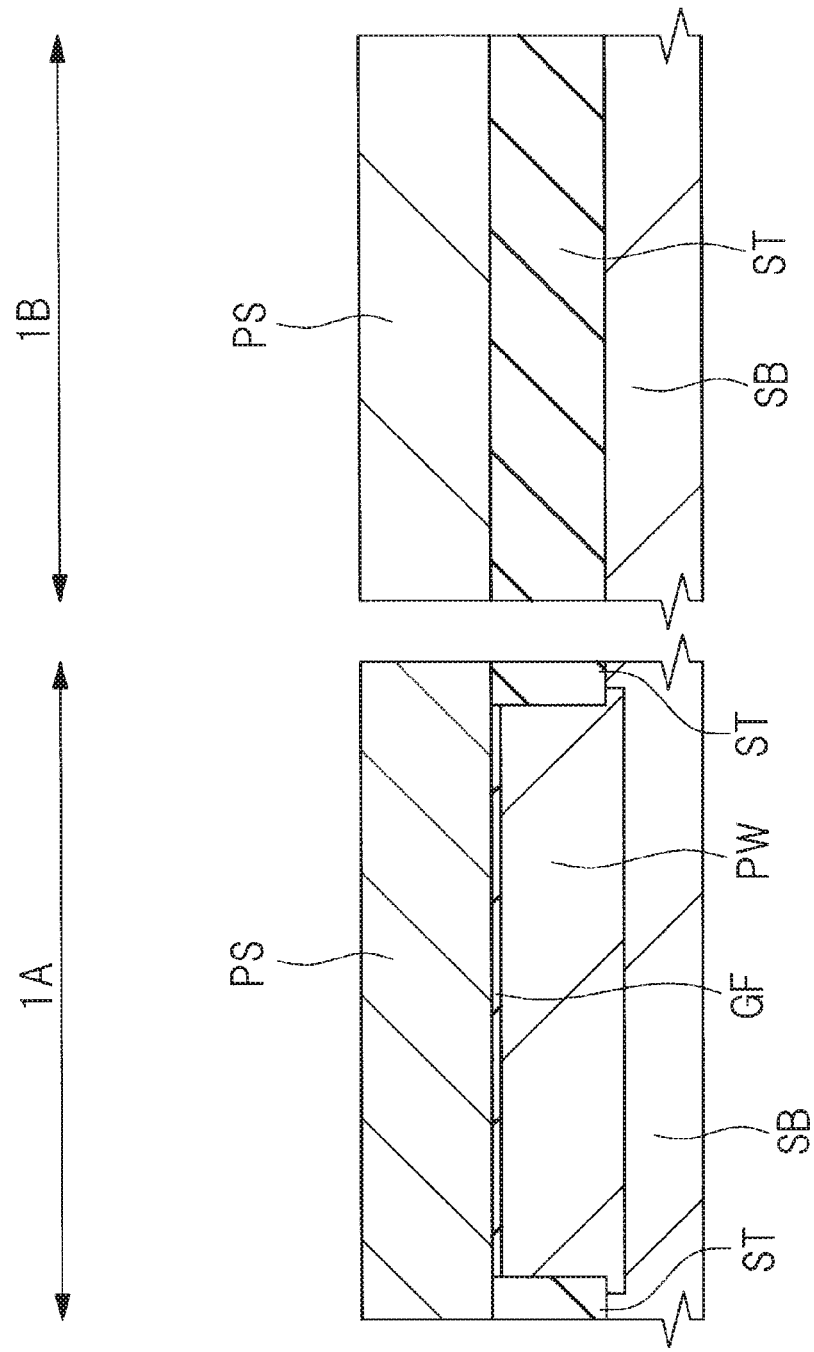
FIG. 11 is a cross-sectional view of a main part during the manufacturing process of the semiconductor device continued from FIG. 10.

Next, as shown in FIG. 11, a silicon film PS such as a polycrystalline silicon film (doped polysilicon film) is formed (deposited) as a conductive film on the entire main surface of the semiconductor substrate SB (step S5 in FIG. 8). The silicon film PS is formed on the insulating film GF and the element isolation region ST. The silicon film PS can be formed into a semiconductor film (conductive material film) having a low resistivity by introducing impurities at the time of film formation or after film formation. The silicon film PS, which was an amorphous silicon film at the time of film formation, can also be converted into a polycrystalline silicon film by heat treatment after film formation.

Figure 12:
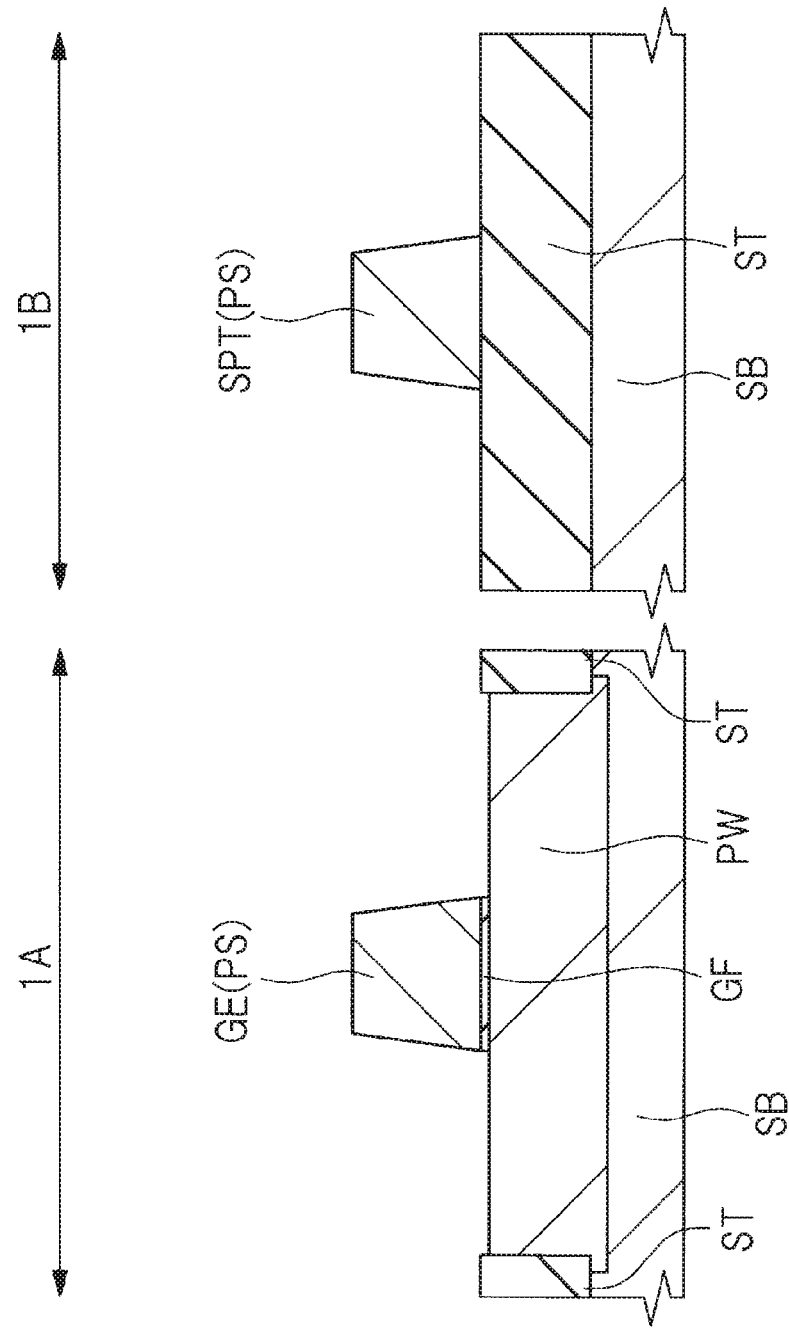
FIG. 12 is a cross-sectional view of a main part during the manufacturing process of the semiconductor device continued from FIG. 11.

Next, the silicon film PS is patterned by photolithography and dry etching to form a gate electrode GE and a silicon pattern SPT for a fuse element, as shown in FIG. 12, in step S6 of FIG. 8. Each of the gate electrode GE and the silicon pattern SPT is formed of a patterned silicon film PS. The gate electrode GE and the silicon pattern SPT may have a tapered shape.

The gate electrode GE is formed on the p-type well PW with the insulating film GF interposed between the gate electrode GE and the gate electrode GE in the MISFET forming region 1A. That is, the gate electrodes GE are formed on the insulating films GF on the surfaces of the p-type wells PW in the MISFET forming regions 1A. Note that although the gate electrode GE is formed in the active region defined (surrounded) by the element isolation region ST, a part of the gate electrode GE (more specifically, both ends in the gate width direction) is located on the element isolation region ST surrounding the active region. The silicon pattern SPT is formed on the element isolation region ST in the fuse element forming region 1B.

Figure 13:
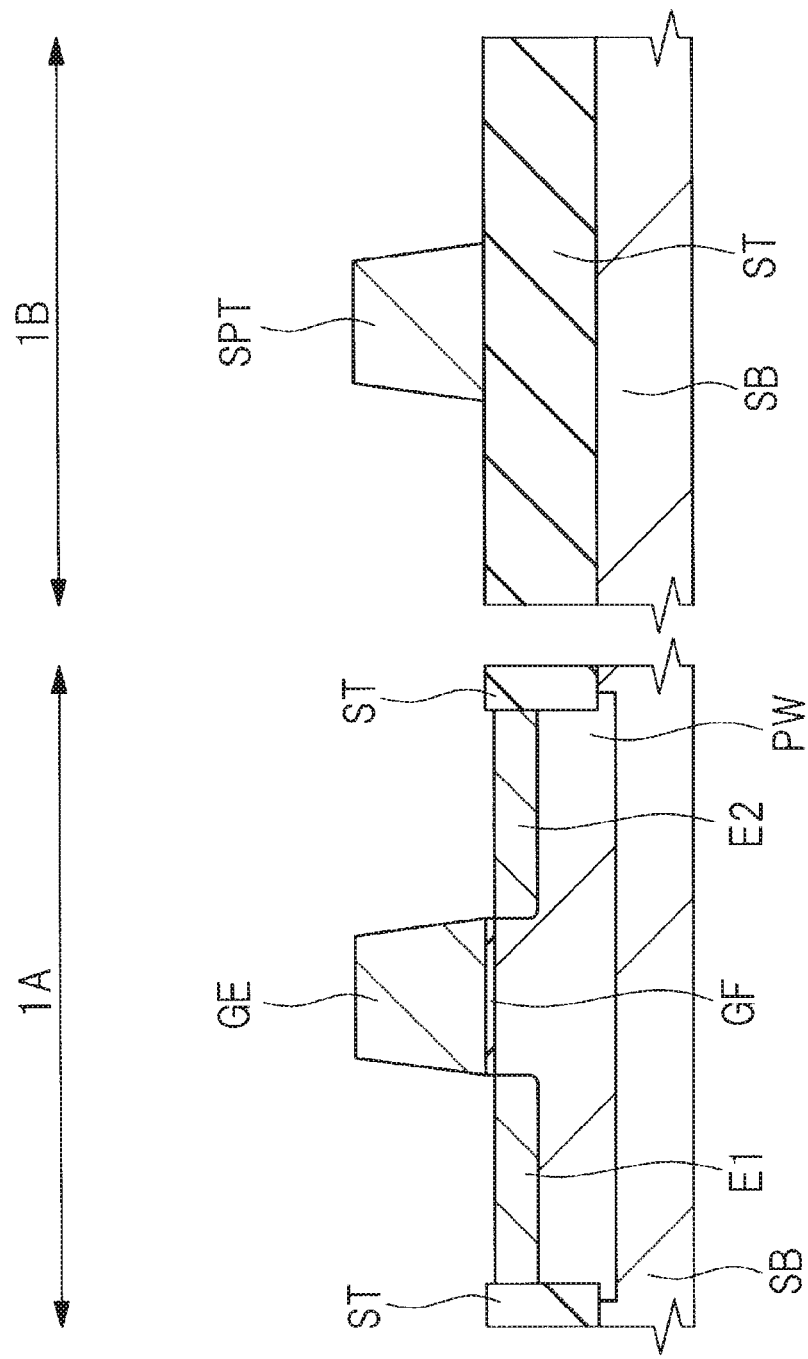
FIG. 13 is a cross-sectional view of a main part during the manufacturing process of the semiconductor device continued from FIG. 12.

Next, as shown in FIG. 13, n-type impurities such as phosphorus (P) or arsenic (As) are ion-implanted into the p-type well PW of the MISFET forming region 1A using the gate electrode GE as a mask (ion implantation blocking mask), thereby forming a pair of n-type semiconductor regions (extension regions) E1 and E2 on both sides of the gate electrode GE in the p-type well PW (step S7 in FIG. 8). Since the gate electrode GE can function as an ion implantation blocking mask at the time of the ion implantation in S7, the impurity is not ion-implanted into the region immediately below the gate electrode GE in the p-type well PW, and the n-type semiconductor regions E1 and E2 are formed in self-alignment with the side surface of the gate electrode GE. Therefore, in step S7, n-type semiconductor regions E1 and E2 are formed in regions of the semiconductor substrate SB (p-type well PW) located on both sides of the gate electrode GE in plan view.

It is preferable to form a photo-resist pattern (not shown) covering the fuse element forming region 1B and exposing the MISFET forming region 1A prior to the ion implantation (S7). Then, since the ion implantation of step S7 is performed in a state where the silicon pattern SPT is covered with the photoresist pattern, it is possible to prevent the impurity from being implanted into the silicon pattern SPT by the ion implantation of step S7. As a result, the impurity concentration of the silicon pattern SPT can be easily controlled to a desired value. The photoresist pattern is removed after the ion implantation in step S7.

Next, sidewall spacers (sidewall spacers, sidewall insulating films) SW are formed as sidewall insulating films on the side surfaces (both side surfaces) of the gate electrode GE and on the side surfaces (both side surfaces) of the silicon pattern SPT (step S8 in FIG. 8). The sidewall spacer SW is made of, for example, a silicon oxide film.

Figure 14:
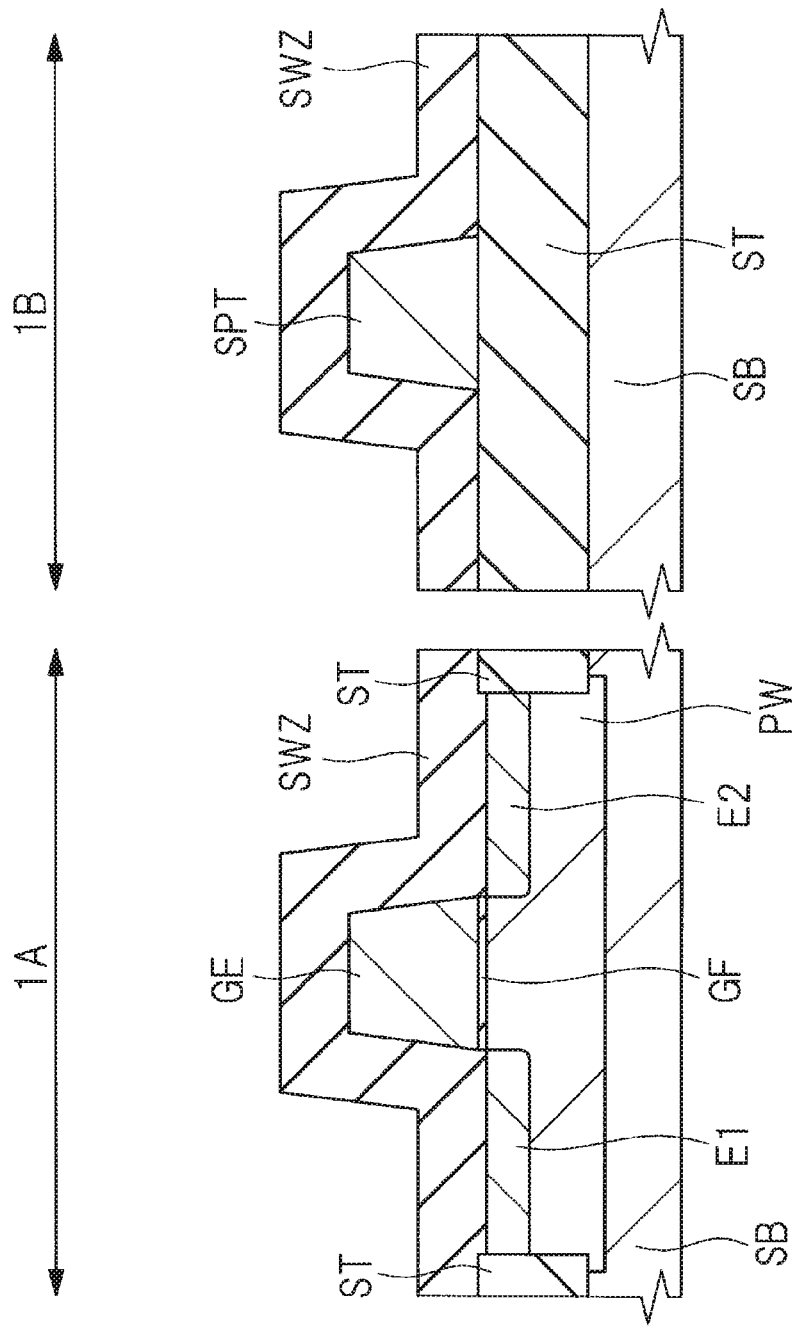
FIG. 14 is a cross-sectional view of a main part during the manufacturing process of the semiconductor device continued from FIG. 13.
Figure 15:
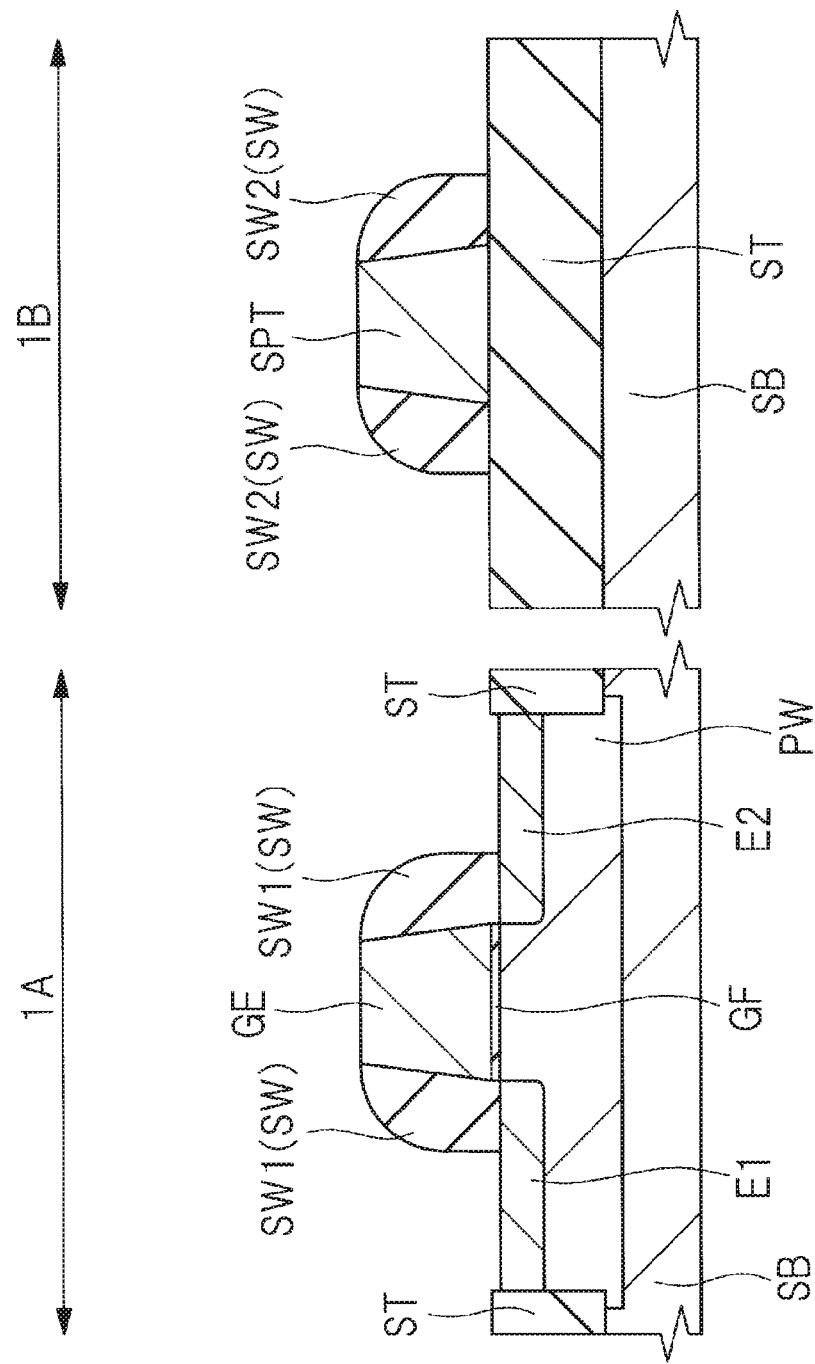
FIG. 15 is a cross-sectional view of a main part during the manufacturing process of the semiconductor device continued from FIG. 14.

The sidewall spacers SW can be formed, for example, as follows. That is, first, as shown in FIG. 14, an insulating film SWZ is formed on the entire main surface of the semiconductor substrate SB so as to cover the gate electrodes GE and the silicon patterns SPT. As the insulating film SWZ, for example, a silicon oxide film can be suitably used. Then, the insulating film SWZ is anisotropically etched back by RIE (Reactive Ion Etching) or the like. By this anisotropic etching, portions of the insulating film SWZ other than the portion to be the sidewall spacer SW are removed, and as shown in FIG. 15, the insulating film SWZ selectively remains on the side surface of the gate electrode GE and on the side surface of the silicon pattern SPT to form the sidewall spacer SW.

In the sidewall spacers SW, the sidewall spacers SW formed on the side surfaces of the gate electrodes GE are referred to as sidewall spacers SW1, and the sidewall spacers SW formed on the side surfaces of the silicon patterns SPT are referred to as sidewall spacers SW2.

The sidewall spacers SW1 are formed on both sides of the gate electrode GE, and are formed so as to surround the periphery of the gate electrode GE in plan view. The sidewall spacers SW2 are formed on both sides of the silicon pattern SPT, and are formed so as to surround the periphery of the silicon pattern SPT in plan view. Therefore, in the cross-sectional view of FIG. 15, the sidewall spacers SW1 on both sides of the gate electrode GE are separated from each other by the gate electrode GE, but actually, the sidewall spacers SW1 on both sides of the gate electrode GE are integrally connected to each other. In the cross-sectional view of FIG. 15, the sidewall spacers SW2 on both sides of the silicon pattern SPT are separated from each other by the silicon pattern SPT, but actually, the sidewall spacers SW2 on both sides of the silicon pattern SPT are integrally connected to each other. The sidewall spacer SW1 and the sidewall spacer SW2 are separated from each other in both cross-sectional and planar views.

Figure 16:
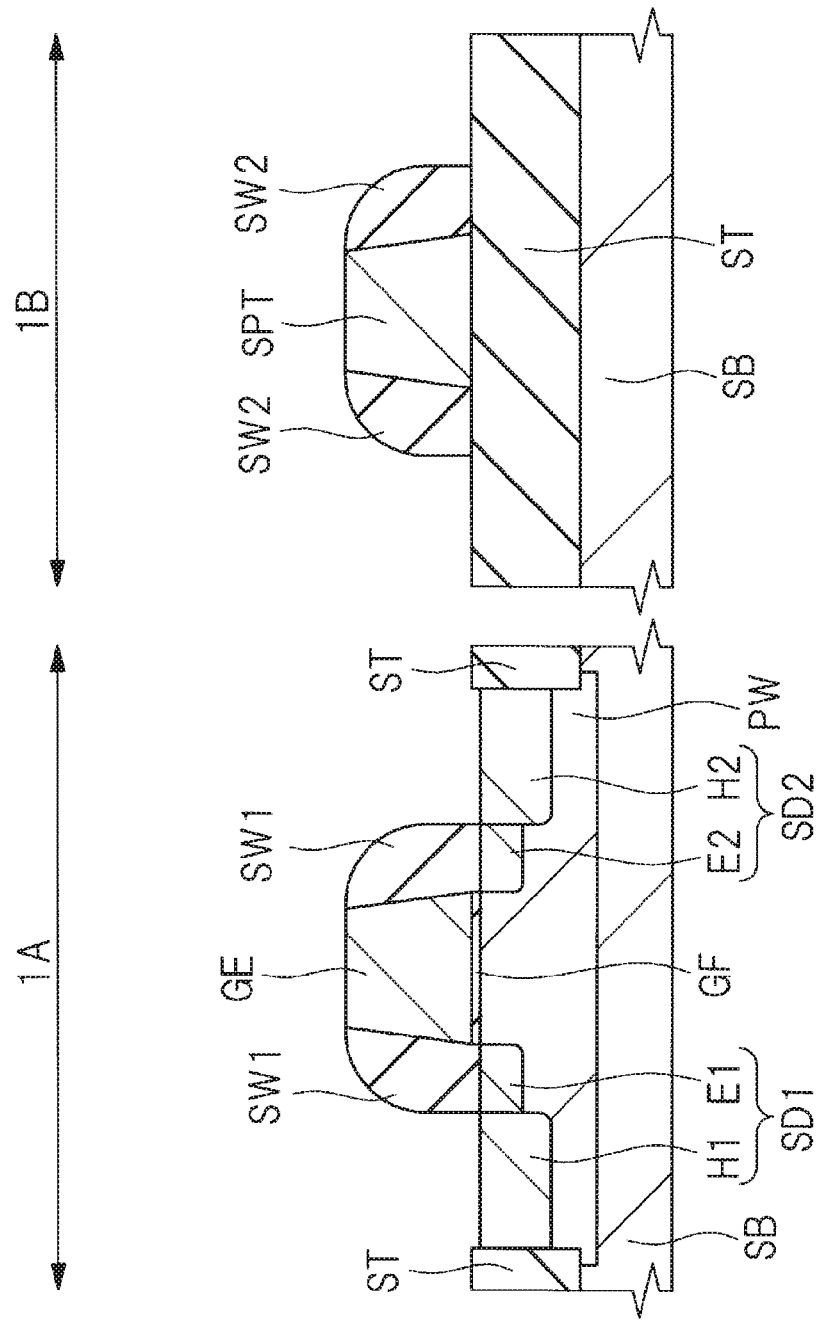
FIG. 16 is a cross-sectional view of a main part during the manufacturing process of the semiconductor device continued from FIG. 15.

Next, as shown in FIG. 16, in the p-type well PW, a pair of n+type semiconductor regions (source/drain regions) H1 and H2 are formed on both sides of the structure composed of the gate electrode GE and the sidewall spacer SW1 in the p-type well PW by ion implantation (step S9 in FIG. 8). The n+type semiconductor regions H1 and H2 have deeper junctions and higher impurity concentrations (n-type impurity concentrations) than the n-type semiconductor regions E1 and E2.

The ion implantation in S9 is performed by ion-implanting an n-type impurity such as phosphorus (P) or arsenic (As) into the p-type well PW of the MISFET forming area 1A using the gate electrode GE and the sidewall spacer SW1 as a mask (ion implantation blocking mask). Therefore, at the time of the ion implantation in S9, the impurity is not ion-implanted into the region directly under the gate electrode GE and the region directly under the sidewall spacer SW1 in the p-type well PW. Therefore, n+type semiconductor regions H1 and H2 are formed in regions of the semiconductor substrate SB (p-type well PW) adjacent to the sidewall spacers SW1 in plan view.

The n-type semiconductor regions E1 and E2 having a low impurity concentration and the n+type semiconductor regions H1 and H2 having a higher impurity concentration form an LDD-structured semiconductor region SD1, SD2. Although the semiconductor region SD1,SD2 may be regarded as a source/drain region, the n+type semiconductor regions H1 and H2 may be regarded as source/drain regions having a high impurity concentration, and the n-type semiconductor regions E1 and E2 may be regarded as extension regions having a low impurity concentration.

It is preferable to form a photo-resist pattern (not shown) covering the fuse element forming region 1B and exposing the MISFET forming region 1A prior to the ion implantation (S9). Then, since the ion implantation of step S9 is performed in a state where the silicon pattern SPT is covered with the photoresist pattern, it is possible to prevent the impurity from being implanted into the silicon pattern SPT by the ion implantation of step S9. As a result, the impurity concentration of the silicon pattern SPT can be easily controlled to a desired value. The photoresist pattern is removed after the ion implantation in step S9.

Next, activation annealing, which is a heat treatment for activating the impurity introduced into the source/drain regions (n-type semiconductor regions E1 and E2 and n+type semiconductor regions H1 and H2) and the like, is performed (S 10 in FIG. 8).

Figure 17:
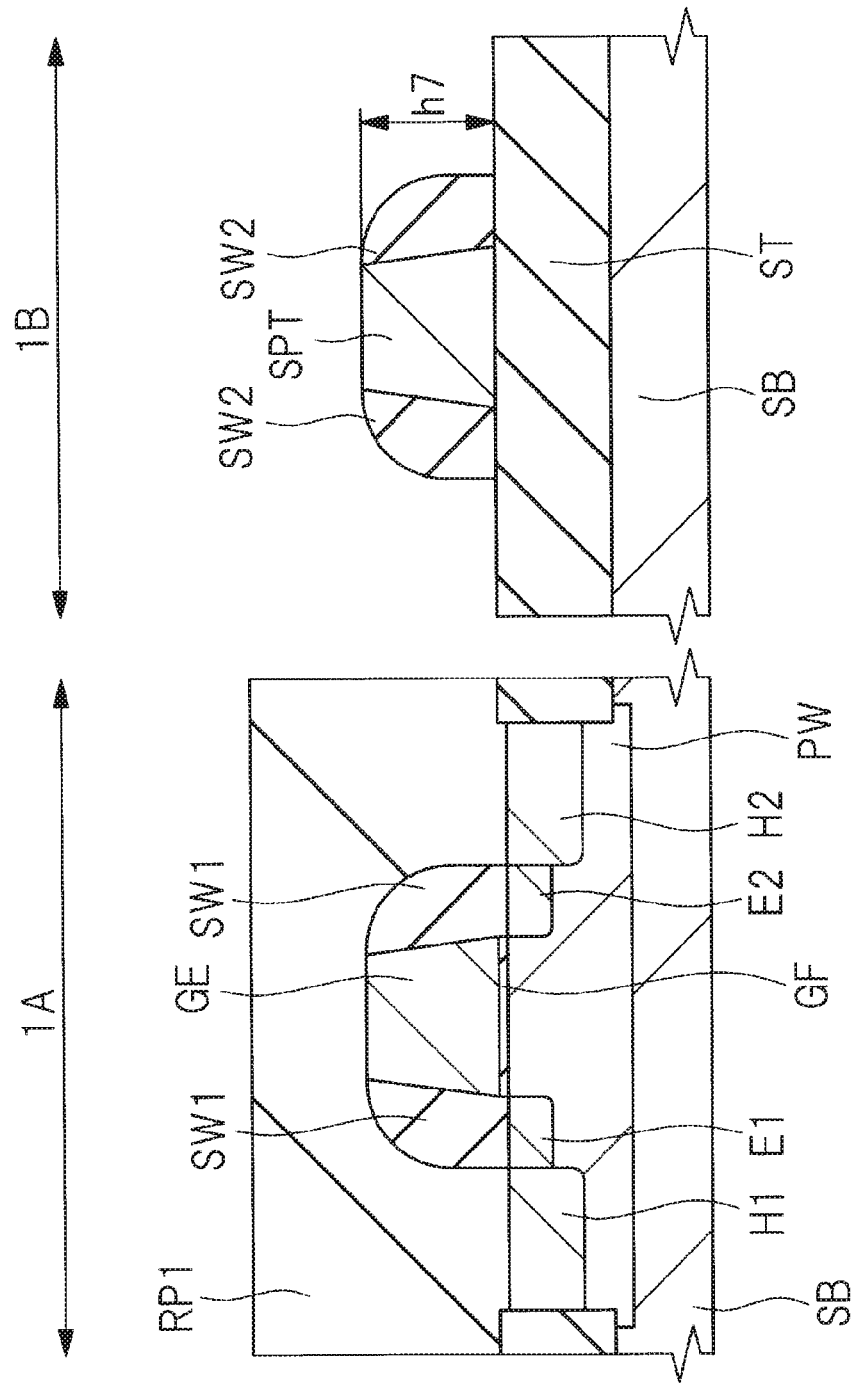
FIG. 17 is a cross-sectional view of a main part during the manufacturing process of the semiconductor device continued from FIG. 16.

Next, as shown in FIG. 17, a photoresist pattern (resist pattern, mask layer) RP1 covering the MISFET formation region 1A and exposing the fuse element formation region 1B is formed as a mask layer by photolithography. The photolithography technique is a technique of forming a photoresist film, exposing and developing the photoresist film, and obtaining a photoresist pattern having a desired planar shape.

Since the MISFET formation region 1A is covered with the photoresist pattern RP1, the MISFET constituent elements formed in the MISFET formation region 1A, that is, the gate electrode GE, the sidewall spacer SW1, the n-type semiconductor regions E1 and E2, and the n+type semiconductor regions H1 and H2 are covered with the photoresist pattern RP1.

On the other hand, since the photoresist pattern RP1 is not formed in the fuse element forming area 1B, the silicon pattern SPT and the sidewall spacer SW2 are exposed without being covered with the photoresist pattern RP1. In the fuse element forming region 1B, the silicon pattern SPT and the element isolation region ST around the sidewall spacer SW2 in plan view are also exposed without being covered with the photoresist pattern RP1.

Figure 18:
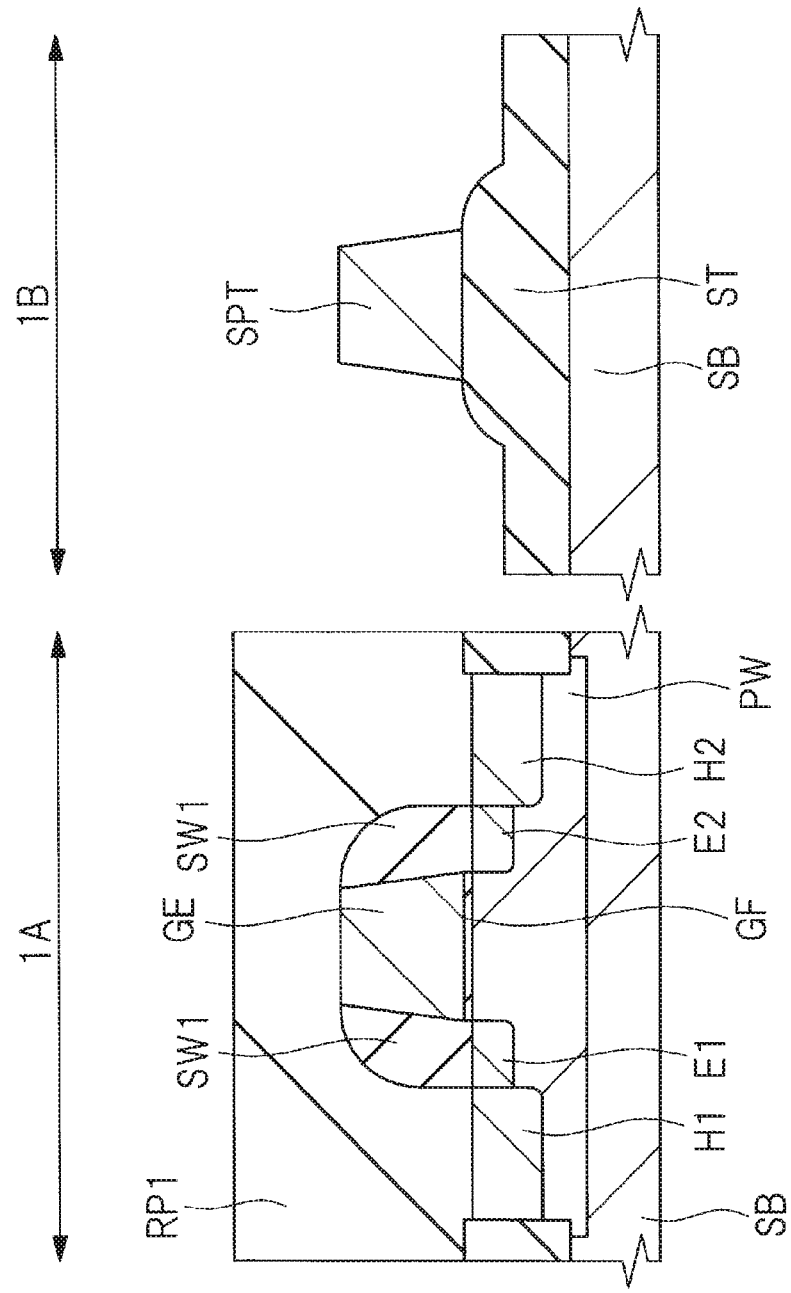
FIG. 18 is a cross-sectional view of a main part during the manufacturing process of the semiconductor device continued from FIG. 17.

Next, as shown in FIG. 18, the sidewall spacers SW2 of the fuse element forming regions 1B are etched in operation S11 of FIG. 8. FIG. 18 shows a stage at which the etching process of step S11 is completed.

In operation S11, the silicon pattern SPT is etched under a condition that the sidewall spacer SW2 is more easily etched than the silicon pattern SPT. In other words, in S11, the silicon pattern SPT is etched under the condition that the silicon pattern SPT is hardly etched as compared with the sidewall spacer SW2. This allows selective etching of the sidewall spacer SW2 in step S11 to inhibit or prevent the silicon pattern SPT from being etched. The fact that the silicon pattern SPT is hardly etched as compared with the sidewall spacer SW2 corresponds to the fact that the etching rate of the silicon pattern SPT is lower than the etching rate of the sidewall spacer SW2.

Wet etching is preferably used for the etching in step S11. The etchant used in the etching in S11 depends on the materials of the sidewall spacer SW2, but when the sidewall spacer SW2 is made of silicon oxide, hydrofluoric acid (diluted hydrofluoric acid, an aqueous solution of hydrofluoric acid) can be suitably used, for example.

In addition, in operation S11, the exposed portion of the element isolation region ST in the fuse element forming region 1B, which is not covered with the photoresist pattern RP1, may also be etched. Therefore, in the fuse element forming region 1B, the upper surface of the element isolation region ST not covered with the sidewall spacers SW2 and the silicon pattern SPT is etched back in step S11, and the height position of the element isolation region ST becomes lower.

In addition, since the etching in S11 is performed with the photoresist pattern RP1 formed on the MISFET forming area 1A, the photoresist pattern RP1 can function as an etching mask. Therefore, the constituent elements of the MISFET formed in the MISFET forming region 1A, i.e., the gate electrode GE, the sidewall spacer SW1, the n-type semiconductor regions E1 and E2, and the n+type semiconductor regions H1 and H2 are not etched in step S11. In addition, in S11, the isolation regions ST covered with the photoresist patterns RP1 are not etched.

Figure 19:
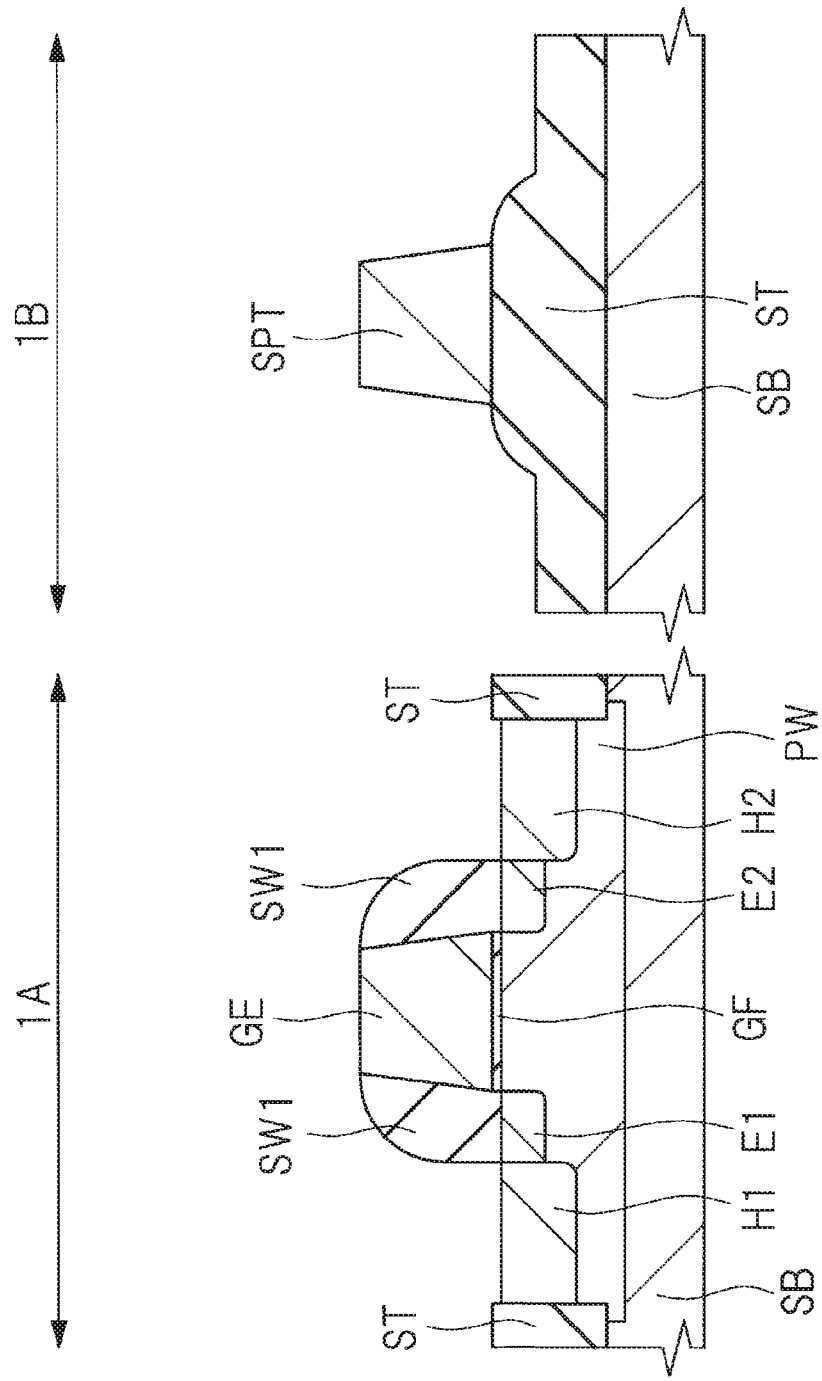
FIG. 19 is a cross-sectional view of a main part during the manufacturing process of the semiconductor device continued from FIG. 18.

After the step S11, as shown in FIG. 19, the photoresist pattern RP1 is removed by asking or the like.

As described above, since the gate electrode GE and the silicon pattern SPT are formed by patterning the common silicon film PS, the height (thickness) of the gate electrode GE and the height (thickness) of the silicon pattern SPT are substantially the same. The sidewall spacers SW1 and SW2 are formed by etching back the same insulating film SWZ by anisotropic etching. Therefore, the height of the sidewall spacer SW1 and the height of the sidewall spacer SW2 are substantially the same in the stage prior to the step S11.

The direction substantially perpendicular to the main surface of the semiconductor substrate SB (i.e., the thickness direction of the semiconductor substrate SB) is set as the height direction, the side approaching the main surface of the semiconductor substrate SB is set as the lower side above the main surface of the semiconductor substrate SB, and the side away from the main surface of the semiconductor substrate SB is set as the higher side.

In this embodiment, in S11, the etching is performed until the entire sidewall spacer SW2 is removed, that is, until the sidewall spacer SW2 disappears. Therefore, in S11, the sidewall spacer SW2 is removed, and the entire upper surface and the entire side surface of the silicon pattern SPT are exposed. In the modified examples shown in FIG. 25 to FIG. 29, the etch of S11 is completed when a part of the sidewall spacer SW2 remains.

Next, a metal silicide layer SL is formed in step S12 of FIG. 8. The metallic silicide layers SL can be formed by so-called Silicide: Self Aligned Silicide processes. The process of forming the metal silicide layer SL in step S12 will be described in detail below.

Figure 20:
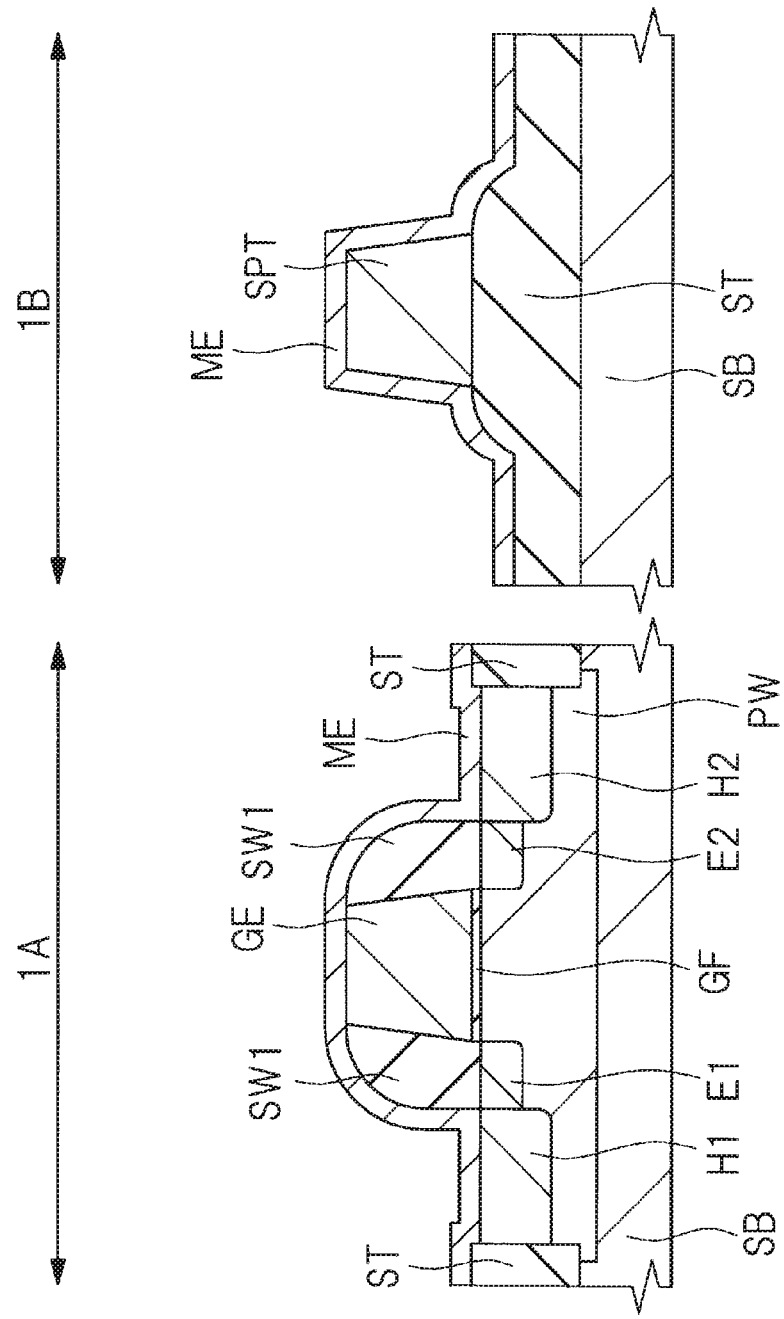
FIG. 20 is a cross-sectional view of a main part during the manufacturing process of the semiconductor device continued from FIG. 19.

First, as shown in FIG. 20, a metal film ME is formed (deposited). As the metal film ME, a cobalt (Co) film can be suitably used, but a nickel (Ni) film, a tungsten (W) film, a titanium (Ti) film, or the like can also be used. The metal film ME can be formed by a sputtering method or the like.

The metallic film ME is formed on the entire main surface of the semiconductor substrate SB. That is, the metallic film ME is formed on the semiconductor substrate SB so as to cover the gate electrodes GE, the sidewall spacers SW (SW1), and the silicon patterns SPT. Therefore, in the MISFET forming region 1A, the metallic film ME is formed on the upper surface of the gate electrode GE, on the sidewall spacer SW1, on the upper surfaces of the n+type semiconductor regions H1 and H2, and on the device isolation region ST. In the fuse element forming region 1B, the metallic film ME is formed on the upper surface and the side surfaces of the silicon pattern SPT and on the element isolation region ST.

In order to form the metal film ME with the upper surfaces of the n+type semiconductor regions H1 and H2, the upper surfaces of the gate electrodes GE, and the upper surfaces and side surfaces of the silicon patterns SPT exposed, when the metal film ME is formed, the upper surfaces of the n+type semiconductor regions H1 and H2, the upper surfaces of the gate electrodes GE, and the upper surfaces and side surfaces of the silicon patterns SPT are in contact with the metal film ME.

Figure 21:
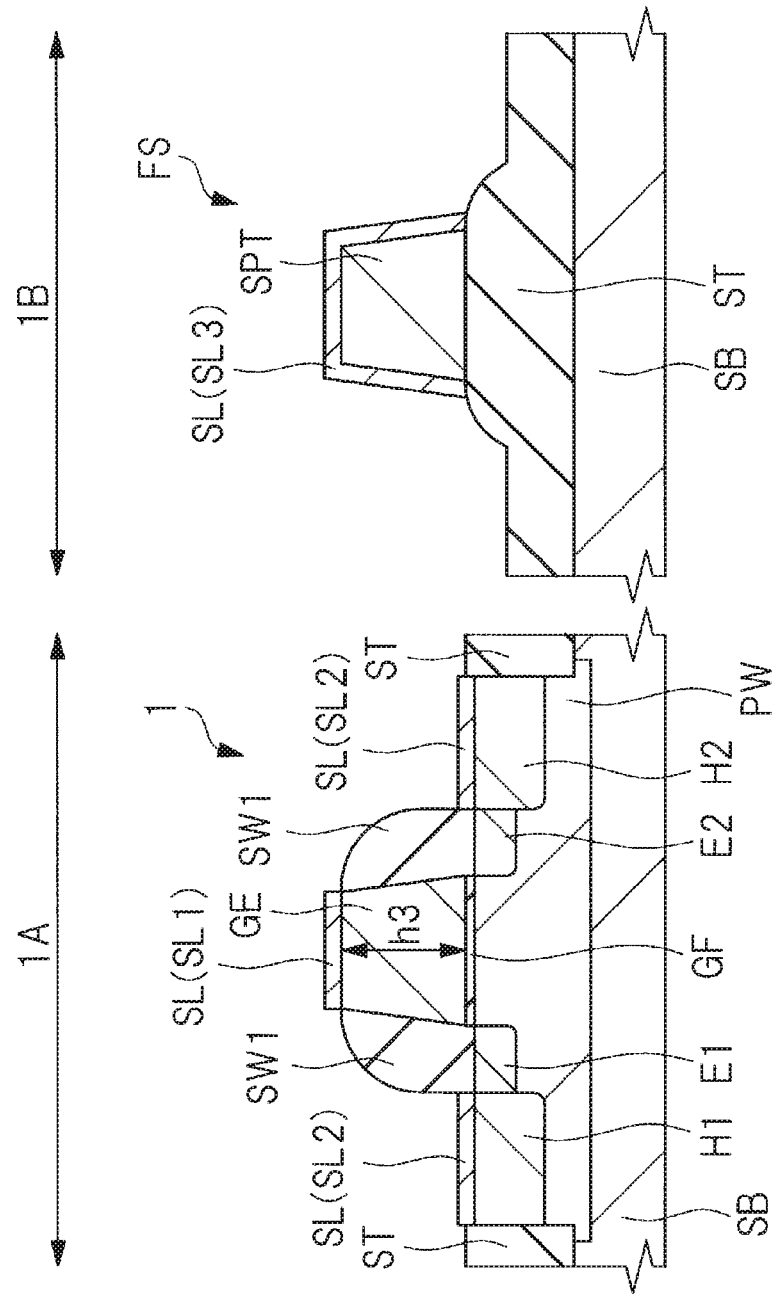
FIG. 21 is a cross-sectional view of a main part during the manufacturing process of the semiconductor device continued from FIG. 20.

Next, the semiconductor substrate SB is subjected to a heat treatment (annealing treatment), whereby the metal film ME is reacted with the surface layer portions (portions in contact with the metal film ME) of the n+type semiconductor regions H1 and H2, the gate electrodes GE, and the silicon patterns SPT. That is, the monocrystalline silicon and the metal film ME constituting the n+type semiconductor region H1, the monocrystalline silicon and the metal film ME constituting the n+type semiconductor region H2, the polycrystalline silicon and the metal film ME constituting the gate electrodes GE, and the polycrystalline silicon and the metal film ME constituting the silicon patterns SPT are selectively reacted with each other to form the metal silicide layer SL as the metal/semiconductor reacting layer. As a result, as shown in FIG. 21, metallic silicide layers SL are formed on the upper surfaces (upper portions) of the n+type semiconductor regions H1, the upper surfaces (upper portions) of the n+type semiconductor regions H2, the upper surfaces (upper portions) of the gate electrodes GE, and the upper surfaces (upper portions) and the side surfaces (side portions) of the silicon patterns SPT, respectively. The heat treatment at this time can be performed under an atmospheric pressure filled with an inert gas (e.g., argon (Ar) gas, neon (Ne) gas, or helium (He) gas), a nitrogen (N2) gas, or a mixed gas thereof, and can be performed using, for example, RTA (Rapid Thermal Anneal) method.

Thereafter, the unreacted metal film ME (i.e., the n+type semiconductor regions H1 and H2, the gate electrode GE, or the portion of the gate electrode ME that has not reacted with the silicon pattern SPT) is removed by wet etching or the like. At this time, the unreacted metal film ME is removed, but the metal silicide layer SL remains. Therefore, an etchant is used which can selectively remove the unreacted metal film ME and slows the etching rate of the metal silicide layer SL compared to the metal film ME. FIG. 21 shows a cross-sectional view of this stage. After removing the unreacted metal film ME, the semiconductor substrate SB may be annealed as required to further react the metal silicide layers SL with the n+type semiconductor regions H1, the n+type semiconductor regions H2, the gate electrodes GE, or the silicon patterns SPT.

In this manner, the metal silicide layer SL can be formed by performing step S12. When the metal film ME is a cobalt film, the metal silicide layer SL is composed of a cobalt silicide (CoSi) layer, and when the metal film ME is a nickel film, the metal silicide layer SL is composed of a nickel silicide (NiSi) layer. When the metal film ME is a tungsten film, the metal silicide layer SL is formed of a tungsten silicide (WSi) layer, and when the metal film ME is a titanium film, the metal silicide layer SL is formed of a titanium silicide (TiSi) layer. By forming the metal silicide layer SL, the diffusion resistance, the contact resistance, and the like can be reduced.

The metal silicide layer SL formed on the surface of the gate electrode GE by reacting the gate electrode GE with the metal film is the metal silicide layer SL1. The metal silicide layer SL formed on the surfaces of the n+type semiconductor regions H1 and H2 by reacting the n+type semiconductor regions H1 and H2 with the metal film is the metal silicide layer SL2. The metal silicide layer SL formed on the surface of the silicon pattern SPT by reacting the silicon pattern SPT with the metal film is the metal silicide layer SL3.

Since the side surface of the gate electrode GE is covered with the sidewall spacer SW1, when the metal film ME is formed, the upper surface of the n+type semiconductor region H1, the upper surface of the n+type semiconductor region H2, and the upper surface of the gate electrode GE contact the metal film ME, but the side surface of the gate electrode GE does not contact the metal film ME. Therefore, in the MISFET forming region 1A, the metal silicide layer SL is formed on the upper surface of the n+type semiconductor region H1, the upper surface of the n+type semiconductor region H2, and the upper surface of the gate electrode GE, but the metal silicide layer SL is not formed on the side surface of the gate electrode GE. On the other hand, in order to form the metal film ME after the side surface of the silicon pattern SPT is exposed by etching the sidewall spacer SW2 in operation S11, the upper surface and the side surface of the silicon pattern SPT contact the metal film ME when the metal film ME is formed. For this reason, in the fuse element forming area 1B, the metal silicide layers SL are formed on the upper surfaces and the side surfaces of the silicon patterns SPT.

In this manner, an n-channel MISFET1 is formed as a field-effect transistor in the MISFET forming region 1A, and a fuse element FS composed of silicon patterns SPTs and metallic silicide layers SL3 is formed in the fuse element forming region 1B.

Figure 22:
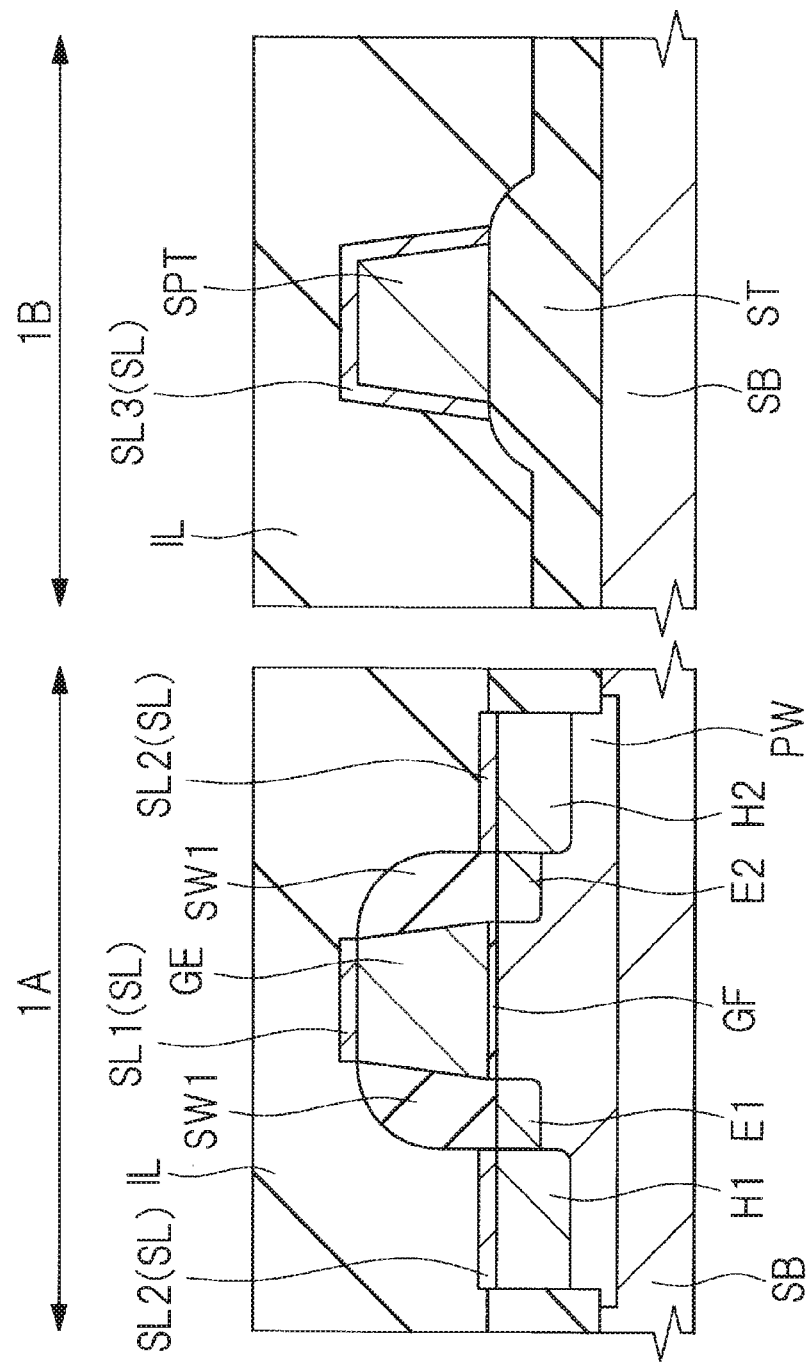
FIG. 22 is a cross-sectional view of a main part during the manufacturing process of the semiconductor device continued from FIG. 21.

Next, as shown in FIG. 22, an interlayer insulating film IL is formed as an insulating film on the entire main surface of the semiconductor substrate SB so as to cover the gate electrodes GE, the silicon patterns SPT, the metal silicide layers SL, and the sidewall spacers SW.

The interlayer insulating film IL is formed of a single insulating film or a stacked insulating film in which a plurality of insulating films are stacked. For example, a stacked film of a silicon nitride film and a silicon oxide film formed on the silicon nitride film and thicker than the silicon nitride film can be used as the interlayer insulating film IL. The interlayer insulating film IL can be formed by, for example, a chemical vapor deposition (Chemical Vapor Deposition) method. After the interlayer insulating film IL is formed, the upper surface of the interlayer insulating film IL can be planarized by, for example, polishing the upper surface of the interlayer insulating film IL by a chemical mechanical polishing (Chemical Mechanical Polishing) method as required.

Figure 23:
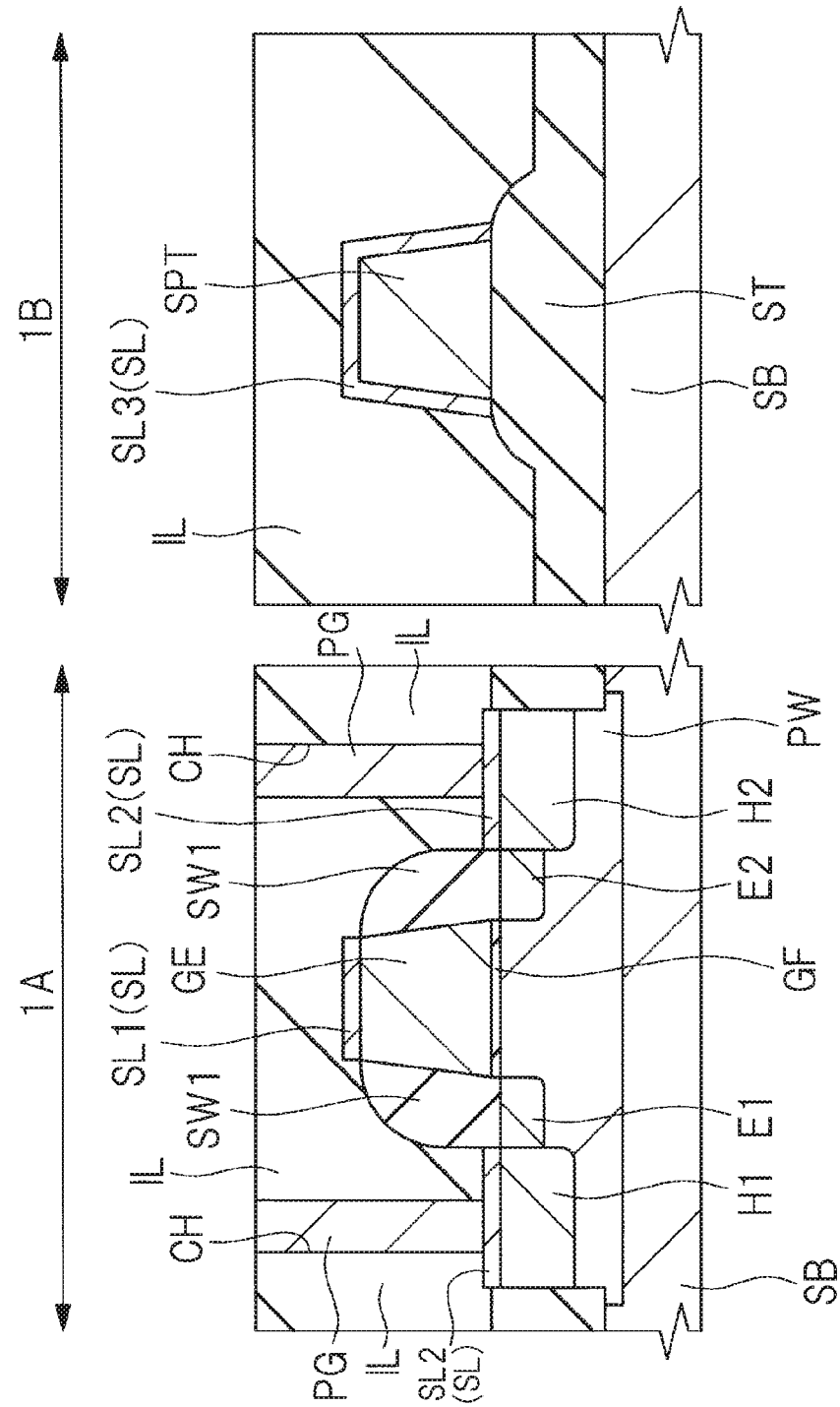
FIG. 23 is a cross-sectional view of a main part during the manufacturing process of the semiconductor device continued from FIG. 22.

Next, as shown in FIG. 23, the interlayer insulating film IL is dry-etched using a photoresist pattern (not shown) formed on the interlayer insulating film IL by photolithography as an etching mask, thereby forming a contact hole (through hole) CH in the interlayer insulating film IL.

Next, a conductive plug (contact plug) PG made of tungsten (W) or the like is formed in the contact hole CH as a conductor portion for connection. For example, the plug PG can be formed by sequentially forming the barrier conductor film and the tungsten film on the interlayer insulating film IL including the inside of the contact hole CH and then removing the unnecessary tungsten film and the barrier conductor film outside the contact hole CH by a CMP method or the like. The plug PG includes the plug PG1, PG2, PG3, PG4.

Figure 24:
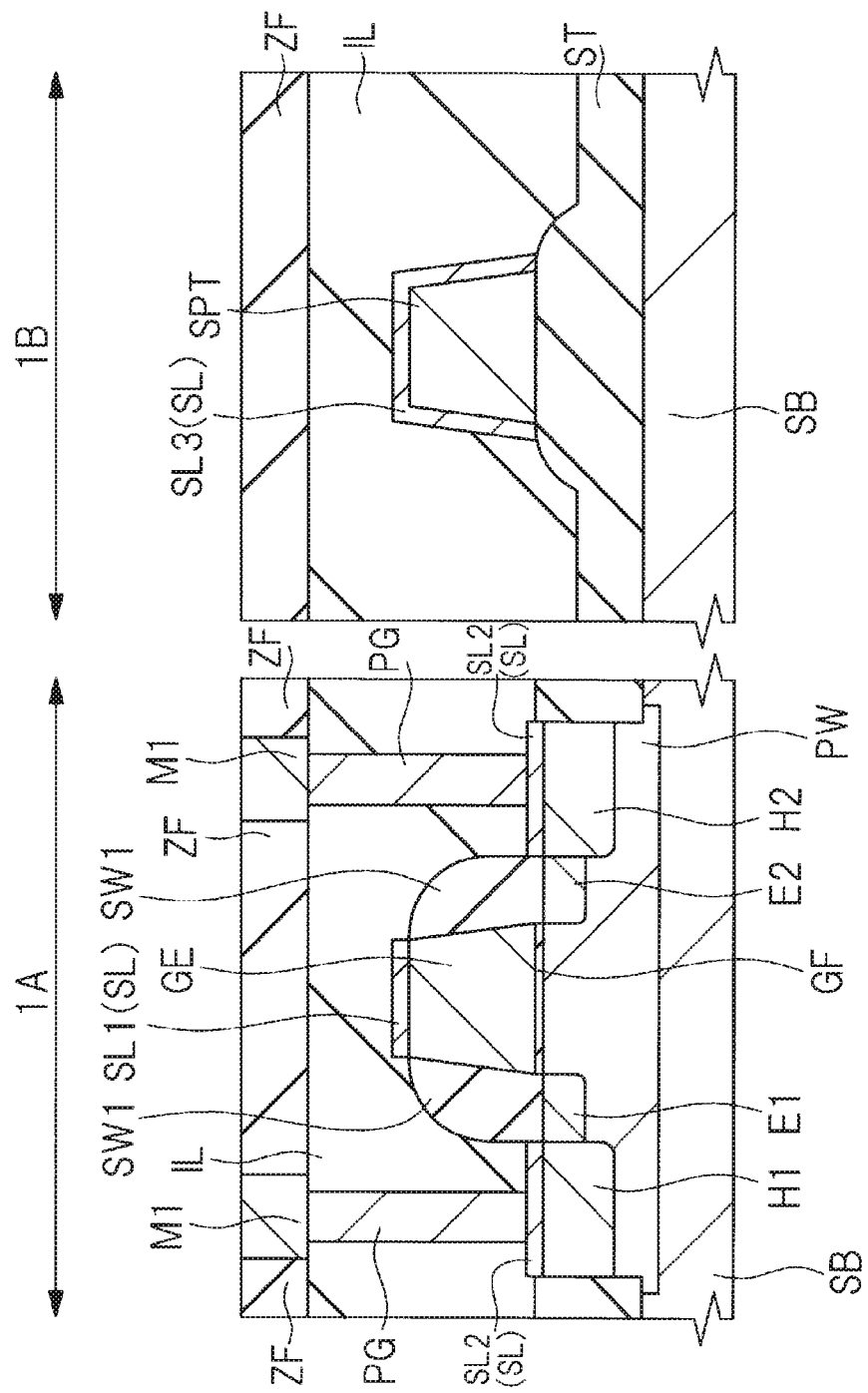
FIG. 24 is a cross-sectional view of a main part during the manufacturing process of the semiconductor device continued from FIG. 23.

Next, wiring M1, which is a first-layer wiring, is formed on the interlayer insulating film IL in which the plugs PG are buried. For example, as shown in FIG. 24, after an insulating film ZF is formed on the interlayer insulating film IL in which the plugs PG are buried, a wiring trench is formed in the insulating film ZF, and then a wiring M1 is formed in the wiring trench using a single damascene technique. The wiring M1 is, for example, a copper wiring containing copper as a main component. The wiring M1 is electrically connected to the n+type semiconductor region H1, the n+type semiconductor region H2, the gate electrode GE, the fuse element FS, and the like via the plugs PG.

Thereafter, the second and subsequent layers of wiring are formed by a dual damascene method or the like, but illustration and explanation thereof are omitted here. The wiring M1 and the wiring above it are not limited to damascene wiring, but may be formed by patterning a conductive film for wiring, such as tungsten wiring or aluminum wiring.

As described above, the semiconductor device of the present embodiment is manufactured.

A modification of the present embodiment will be described with reference to FIGS. 25 to 29. FIGS. 25 to 29 are cross-sectional views of main parts during the manufacturing process of the semiconductor device of the modification example.

In FIG. 18, the entire sidewall spacer SW2 is removed in the etch step S11. Therefore, when step S11 is completed, the entire upper surface and the entire side surface of the silicon pattern SPT are exposed as shown in FIG. 18. In this case, in the semiconductor device after manufacturing, as shown in FIG. 3, the sidewall spacers are not formed at positions adjacent to the silicon pattern SPT.

Figure 25:
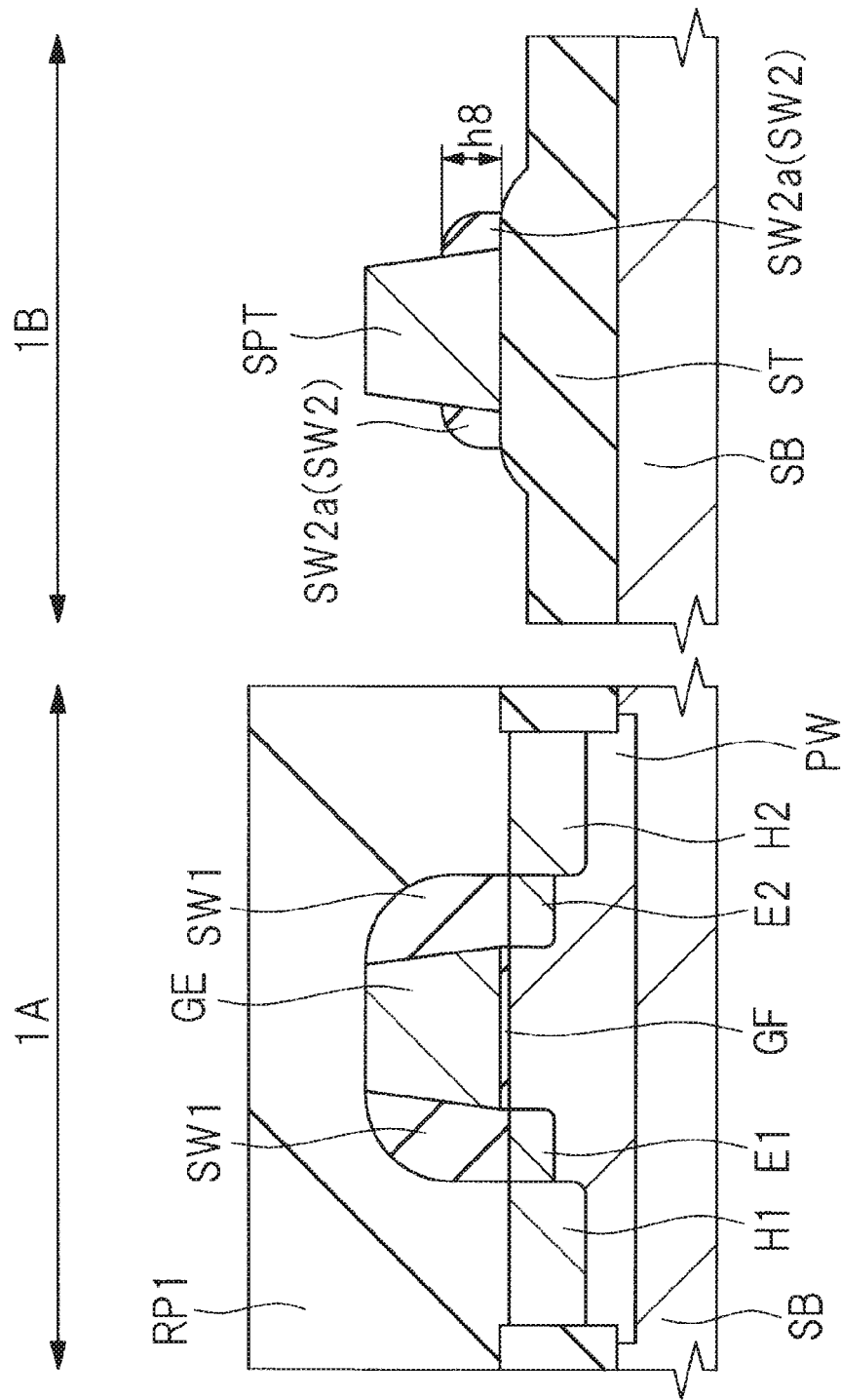
FIG. 25 is a cross-sectional view of a main part during a manufacturing process of the semiconductor device of the modification example.
Figure 26:
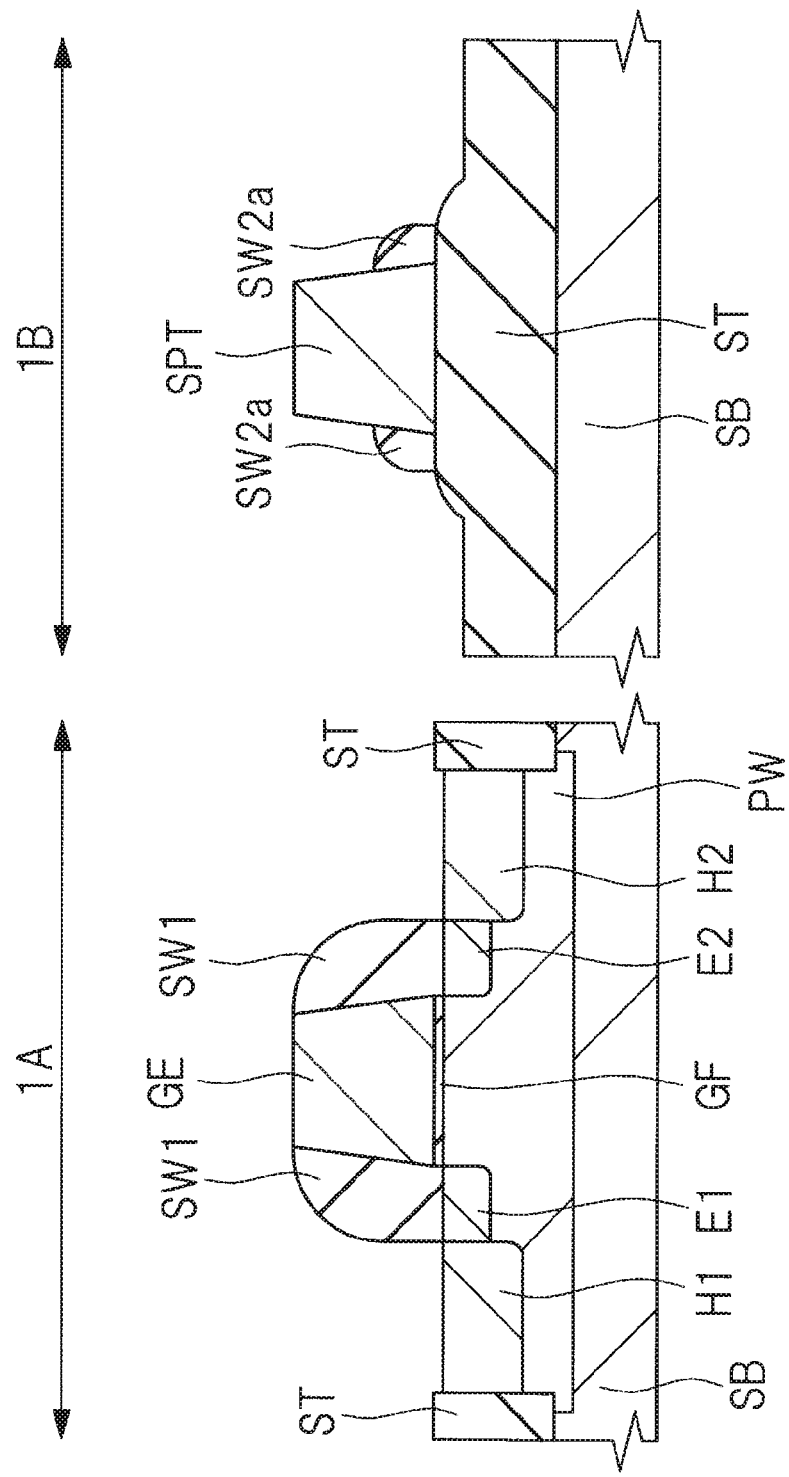
FIG. 26 is a cross-sectional view of a main part during the manufacturing process of the semiconductor device continued from FIG. 25.

On the other hand, in the modification, the sidewall spacer SW2 is etched in step S11 after the structure shown in FIG. 17 is obtained, but the etching is not performed until the sidewall spacer SW2 disappears, but the etching in step S11 is terminated at a stage where a part of the sidewall spacer SW2 remains as shown in FIG. 25. FIG. 25 shows a stage in which the etching process of step S11 is finished in the case of the modification. The remaining portion of the sidewall spacer SW2 after performing S11 is referred to as a sidewall spacer SW2a with reference numeral SW2a. In the case of FIG. 18, there is no sidewall spacer SW2a, but in the case of the modification, as shown in FIG. 25, there is a sidewall spacer SW2a at a position adjoining the silicon pattern SPT. Thereafter, as shown in FIG. 26, the photoresist pattern RP1 is removed.

In the etching step S11, the sidewall spacer SW2 is etched, and the sidewall spacer SW1 is not etched. Therefore, the height of the sidewall spacer SW1 does not change before and after the etching step of step S11, but the height of the sidewall spacer SW2 becomes lower after the etching step of step S11 than before the etching step of step S11. Therefore, the height (h8) of the sidewall spacer SW2a after the etching step of step S11 is lower than the height (h7) of the sidewall spacer SW2 prior to the etching step of step S11. After the etching step S11 is performed, the height (h8) of the sidewall spacer SW2a is lower than the height of the sidewall spacer SW1. After the step S11 is performed, the height of the sidewall spacers SW1 is substantially the same as the height of the gate electrodes GE, but the height (h8) of the sidewall spacers SW2a is lower than the height of the silicon patterns SPT.

In the modification, since a part of the sidewall spacer SW2 is removed in the etching step of step S11, when step S11 is completed, the entire upper surface and a part of the side surface of the silicon pattern SPT are exposed as shown in FIG. 25. That is, a portion of the side surface of the silicon pattern SPT higher than the height of the sidewall spacer SW2a is exposed, and a portion of the silicon pattern SPT lower than the height of the sidewall spacer SW2a is covered with the sidewall spacer SW2a.

The subsequent steps are basically the same as the steps of FIGS. 20 to 24 in the case of the modified example. That is, the metal film ME is formed as shown in FIG. 27 corresponding to FIG. 20, the metal silicide layer SL is formed as shown in FIG. 28 corresponding to FIG. 21, and the interlayer insulating film IL, the contact hole CH, the plugs PG, the insulating film ZF, and the wiring M1 are formed as shown in FIG. 29 corresponding to FIG. 24.

Figure 27:
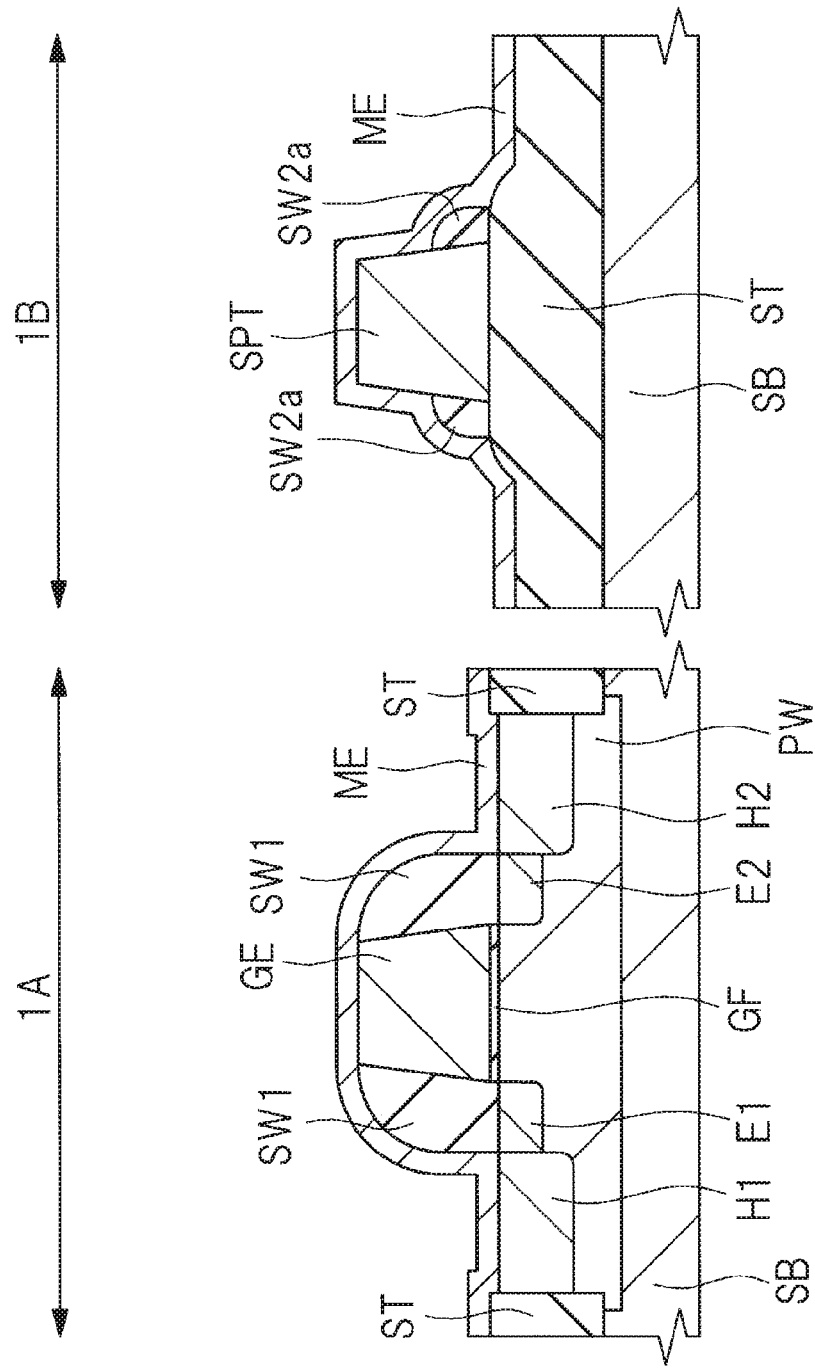
FIG. 27 is a cross-sectional view of a main part during the manufacturing process of the semiconductor device continued from FIG. 26.
Figure 28:
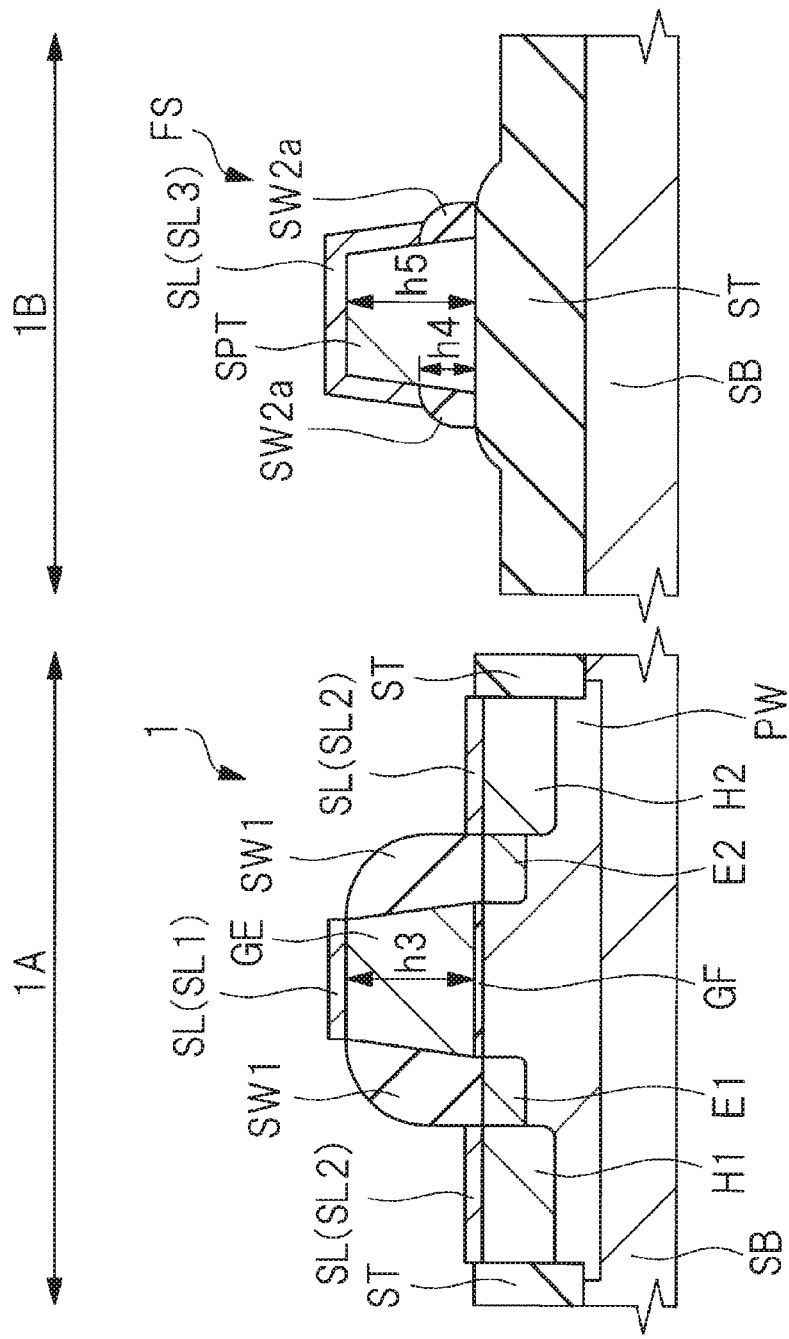
FIG. 28 is a cross-sectional view of a main part during the manufacturing process of the semiconductor device continued from FIG. 27.

However, in the modification, as shown in FIG. 27, when the metal film ME is formed, a portion of the side surface of the silicon pattern SPT that is not covered with the sidewall spacer SW2a is in contact with the metal film ME, but a portion of the silicon pattern SPT that is covered with the sidewall spacer SW2a is not in contact with the metal film ME. That is, in the case of FIG. 20, the entire upper surface and the entire side surface of the silicon pattern SPT are in contact with the metal film ME, but in the case of FIG. 27, the entire upper surface and a part of the side surface of the silicon pattern SPT (i.e., a part not covered with the sidewall spacer SW2a) are in contact with the metal film ME. Therefore, in the modification, as shown in FIG. 29, when the metal silicide layer SL is formed by heat treatment, the metal silicide layer SL is formed in a portion of the side surface of the silicon pattern SPT which is not covered with the sidewall spacer SW2a, but the metal silicide layer SL is not formed in a portion which is covered with the sidewall spacer SW2a.

Figure 29:
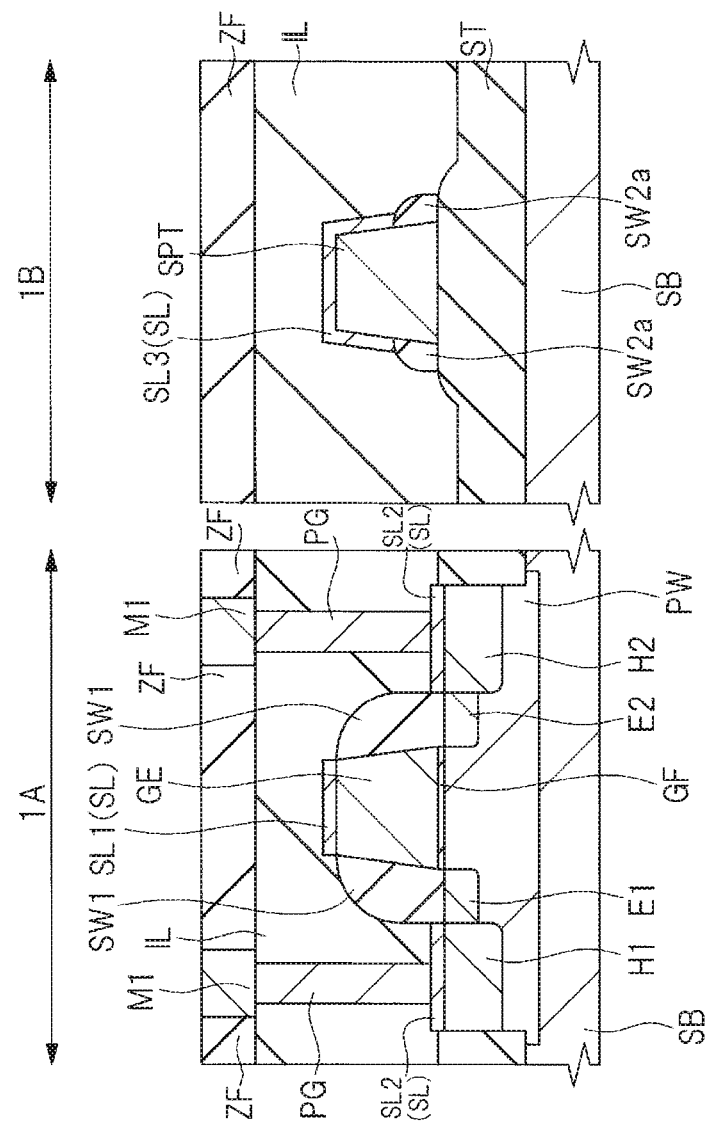
FIG. 29 is a cross-sectional view of a main part during the manufacturing process of the semiconductor device continued from FIG. 28.

In the semiconductor device according to the modification, as shown in FIG. 29, sidewall spacers SW2a are present on both sides of the silicon patterns SPTs constituting the fuse element FS. The height of the sidewall spacer SW2a is lower than the height of the sidewall spacer SW1 and lower than the height of the silicon pattern SPT. The metal silicide layer SL3 is formed not only on the upper surface of the silicon pattern SPT but also on the side surface of the silicon pattern SPT, but the metal silicide layer SL3 is not formed on the part of the side surface of the silicon pattern SPT covered with the sidewall spacer SW2a. Other structures of the semiconductor device of the modification example are substantially the same as those of the semiconductor device described with reference to FIGS. 1 to 5, and therefore repetitive description thereof is omitted here.

In the following description, the term "the present embodiment" includes not only the cases of FIGS. 1 to 5 and FIGS. 8 to 24 but also the cases of the modified examples of FIGS. 25 to 29.

The present inventor has examined a fuse element. When the fuse element is cut, a voltage is applied to the fuse element to flow a current, and the fuse element is blown by Joule heat generated in accordance with the current.

It is also conceivable to form a fuse element with only a silicon pattern. However, when a fuse element is formed only with a silicon pattern, the resistance (electric resistance) of the fuse element becomes relatively large, so that even if a voltage is applied to the fuse element in order to cut the fuse element, the current flowing through the fuse element does not become so large. In this case, the Joule heat generated in the fuse element does not become so large that the fuse element is difficult to be blown. Therefore, in the case where the fuse element is formed only by the silicon pattern, it is necessary to increase the voltage applied to the fuse element, but this may complicate the circuit necessary for cutting the fuse element and cause an increase in the size of the semiconductor device.

Therefore, the present inventor has studied a fuse element having a laminated structure of a silicon pattern and a metal silicide layer formed on the silicon pattern as a fuse element. In this case, the resistivity of the metal silicide layer is lower than the resistivity of the silicon pattern. Therefore, when a fuse element is formed by the silicon pattern and the metal silicide layer, the resistance of the fuse element can be lowered, so that when a voltage is applied to the fuse element in order to cut the fuse element, the current flowing through the fuse element can be increased. In this case, since the Joule heat generated in the fuse element increases, the fuse element is easily blown. Therefore, in the case where the fuse element is formed by the silicon pattern and the metal silicide layer, the voltage applied to the fuse element does not need to be so high, so that the circuit necessary for cutting the fuse element can be simplified, and the semiconductor device can be increased in size.

When the fuse element is formed by the silicon pattern and the metal silicide layer, the cutting mechanism of the fuse element is considered as follows.

That is, since the resistivity of the metal silicide layer is lower than the resistivity of the silicon pattern, when a voltage is applied to the fuse element in order to cut the fuse element, a current mainly flows through the metal silicide layer constituting the fuse element. Therefore, Joule heat is mainly generated in the metal silicide layer constituting the fuse element, so that the temperature of the metal silicide layer rises rapidly. When the temperature of the metal silicide layer becomes equal to or higher than the melting point of the metal silicide layer, the metal silicide layer melts and is cut. In the region where the metal silicide layer is fused, the current flows through the silicon pattern constituting the fuse element, the temperature of the silicon pattern rises, the silicon pattern becomes thinner, and the silicon pattern is fused. Since both the metal silicide layer and the silicon pattern are blown, the fuse element is cut. The reason for the temperature rises of the silicon pattern may be that Joule heat generated in the metal silicide layer is conducted to the silicon pattern, and Joule heat generated in the silicon pattern itself by a current flowing through the silicon pattern.

The reason why the fuse element is configured not by the silicon pattern alone but by the silicon pattern and the metal silicide layer is to increase the Joule heat generated in the fuse element when the fuse element is cut, as described above, so that the fuse element can be easily cut. However, the inventors of the present invention have found that there is room for improvement in a fuse element formed of a silicon pattern and a metal silicide layer.

Figure 30:
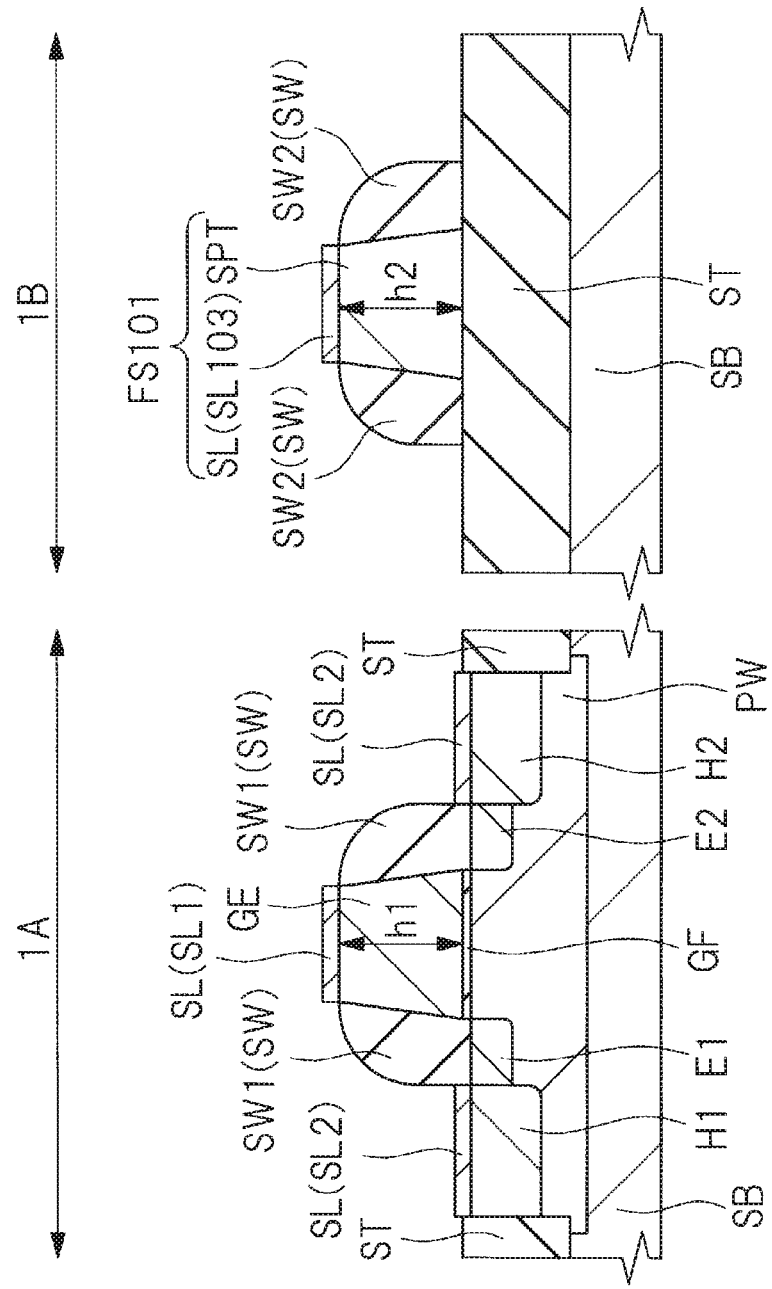
FIG. 30 is a cross-sectional view of a main part during a manufacturing process of the semiconductor device of the first study example.

FIG. 30 is a cross-sectional view of a main part during the manufacturing process of the semiconductor device of the first study example examined by the present inventor. FIG. 30 corresponds to the process step corresponding to FIG. 21, that is, the step of forming the metal silicide layer SL.

The first examination example of FIG. 30 corresponds to the case where the etching process of step S11 is not performed. That is, in the case of the first examination example of FIG. 30, the steps of FIGS. 17 to 19 are not performed. Reflecting this, the structure of the MISFET formation region 1A in FIG. 30 is substantially the same as the structure in FIG. 21, whereas the structure of the fuse element formation region 1B in FIG. 30 differs from the structure in FIG. 21 in the following points.

That is, in the first study of FIG. 30, since the metal silicide layer SL is formed by the salicide process while the sidewall spacers SW2 remain on both sides of the silicon pattern SPT, the metal silicide layer SL is formed on the upper surface of the silicon pattern SPT, but the metal silicide layer SL is not formed on the side surface of the silicon pattern SPT. That is, in the case of the first study example of FIG. 30, since the sidewall spacers SW are formed on both sides of the gate electrode GE and on both sides of the silicon pattern SPT, the metal silicide layer SL is formed on the upper surface of the gate electrode GE and the upper surface of the silicon pattern SPT, respectively, but the metal silicide layer SL is not formed on the side surface of the gate electrode GE and the side surface of the silicon pattern SPT. This is because the metal silicide layer is not formed in the portion of the surface of the gate electrode GE and the surface of the silicon pattern SPT covered with the sidewall spacer SW by the salicide process.

Here, in the first examination example of FIG. 30, the metal silicide layer SL formed on the surface of the silicon pattern SPT is referred to as a metal silicide layer SL103 with the symbol SL103, and the fuse element of the first examination example formed of the silicon pattern SPT and the metal silicide layer SL103 on the upper surface thereof is referred to as a fuse element FS101 with the symbol FS101.

In the semiconductor device including the fuse element FS101 of the first study example shown in FIG. 30, it has been found that the resistance of the fuse element FS101 varies after the fuse element FS101 is blown by passing a current, and there is a possibility that the semiconductor device may not be in a sufficiently high resistance state (see FIG. 31 to be described later). If the resistance of the fuse element after blowing is not sufficiently large, the long-term reliability of the semiconductor device is deteriorated. For example, there is a concern that a leak path may be formed in the fuse element that has been blown. In order to improve the reliability of the semiconductor device, it is desired that the fuse element can be cut stably and that the fuse element after cutting be in a sufficiently high resistance state.

The semiconductor device of the present embodiment is a semiconductor device including a MISFET and a fuse element. One of the main features of the present embodiment is that a metal silicide layer SL1 is formed on the upper surfaces of the gate electrodes GE for MISFET, and a metal silicide layer SL3 is formed on the upper surfaces and the side surfaces of the silicon patterns SPT for fuse elements.

That is, after the n+type semiconductor regions H1 and H2 (source/drain regions) for MISFET are formed in step S9 and before the metal silicide layer SL is formed in step S12, the side wall spacer SW2 is etched in step S11 with the gate electrode GE and the side wall spacer SW1 covered with the mask layer (photoresist pattern RP1). Thus, when the metal silicide layer SL is formed in step S12, the metal silicide layer SL3 can be formed not only on the upper surface of the silicon pattern SPT for the fuse element but also on the side surface of the silicon pattern SPT.

Since the metal silicide layer SL3 is formed not only on the upper surface side but also on the side surface side of the silicon pattern SPT, the fuse element FS can be cut stably when a cutting current is supplied to the fuse element FS composed of the silicon pattern SPT and the metal silicide layer SL3.

That is, in both the fuse element FS101 of the first examination example of FIG. 30 and the fuse element FS of the present embodiment, when a cutting current is flown to the fuse elements FS101 and FS, the current first flows mainly to the metal silicide layer SL3,SL103 and Joule heat is generated in the metal silicide layer SL3,SL103. Therefore, the temperature of the metal silicide layer SL3, SL103 rises rapidly, and heat is conducted from the metal silicide layer SL3,SL103 to the silicon patterns SPTs.

In the fuse element FS101 of the first study example shown in FIG. 30, the silicon pattern SPT is heated from the upper surface side by Joule heat generated in the metal silicide layer SL103 on the upper surface side of the silicon pattern SPT, but is not heated from the side surface side of the silicon pattern SPT. Therefore, after the metallic silicide layers SL103 are fused, it takes some time to fuse the silicon patterns SPTs.

On the other hand, in the fuse element FS of the present embodiment, when a cutting current is supplied to the fuse element FS, the silicon pattern SPT is heated from the upper surface side by Joule heat generated in the metal silicide layer SL3 on the upper surface side of the silicon pattern SPT, and is also heated from the metal silicide layer SL3 on the side surface side of the silicon pattern SPT. This is because Joule heat can be generated even in the metal silicide layer SL3 on the side surface of the silicon pattern SPT, and since the thermal conductivity of the metal silicide layer SL3 is higher than the thermal conductivity of the silicon pattern SPT, the temperature of the entire metal silicide layer SL3 becomes higher than the temperature of the silicon pattern SPT. That is, since the metal silicide layer SL3 on the upper surface side of the silicon pattern SPT and the metal silicide layer SL3 on the side surface side of the silicon pattern SPT are integrally connected, when Joule heat is generated in the metal silicide layer SL3, heat is conducted from the metal silicide layer SL3 on the upper surface side of the silicon pattern SPT and the metal silicide layer SL3 on the side surface side of the silicon pattern SPT to the silicon pattern SPT.

Therefore, compared with the fuse element FS101 of the first examination example of FIG. 30, in the fuse element FS of the present embodiment, since the silicon pattern SPT is relatively uniformly heated by the Joule heat generated in the metal silicide layer SL3, the time required for melting the silicon pattern SPT after the metal silicide layer SL3 is melted is shortened, and the silicon pattern SPT can be quickly melted. As a result, the fuse element FS can be stably cut off.

Therefore, in the fuse element FS of the present embodiment, variation in resistance of the fuse element FS after the fuse element FS is blown by flowing a current is suppressed, and the resistance of the fuse element FS after the blown can be sufficiently increased. As a result, the reliability of the semiconductor device can be improved over a long period of time. For example, it is possible to more accurately suppress or prevent a leak path from being formed in the fuse element FS that has been blown.

Figure 31:
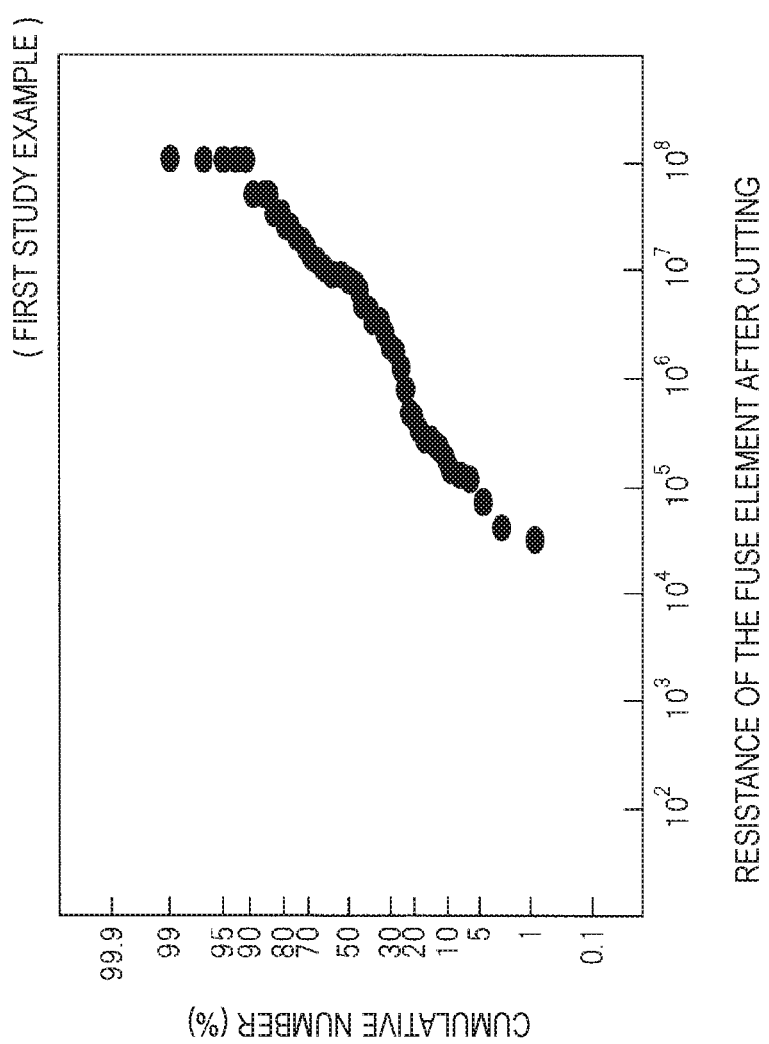
FIG. 31 is a graph showing the result of checking the resistance of the fuse element after cutting when the fuse element of the first study example is applied.
Figure 32:
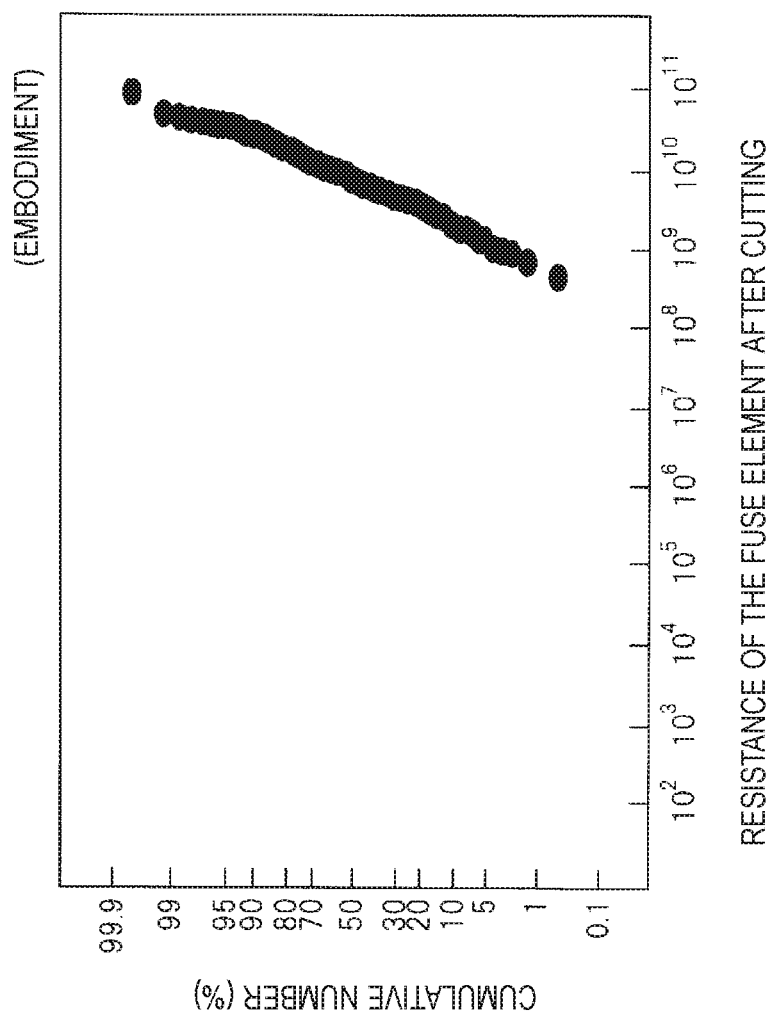
FIG. 32 is a graph showing the result of checking the resistance after cutting the fuse element when the fuse element of the embodiment is applied.

FIG. 31 is a graph showing the result of checking the resistances of the fuse elements after cutting when the fuse element FS101 of the first examination example of FIG. 30 is applied. FIG. 32 is a graph showing the result of checking the resistance of the fuse element after cutting when the fuse element FS of the present embodiment is applied. The horizontal axis of each of the graphs of FIGS. 31 and 32 corresponds to the resistance value of the fuse element after cutting. The vertical axis of the graphs of FIGS. 31 and 32 corresponds to the accumulation rate.

From FIG. 31, it can be seen that when the fuse element FS101 of the first study of FIG. 30 is applied, the resistance values of the fuse elements after cutting vary, and a fuse element in which the resistance is sufficiently high and a fuse element in which the resistance is slightly lower coexist. On the other hand, FIG. 32 shows that when the fuse element FS of the present embodiment is applied, variation in the resistance value of the fuse element after cutting is suppressed, and almost all the fuse elements are in a sufficiently high resistance state after cutting. For example, in FIG. 32, the total number of fuse elements have resistances of 108Ω or more after the fuse elements are cut.

Although there is no problem in the circuit even if the resistance value of the fuse element after cutting is somewhat small, it is preferable that the resistance value of the fuse element after cutting is large to some extent in consideration of long-term reliability. If the resistance value of the fuse element after cutting is large, the risk that a defect caused by the fuse element, for example, formation of a leak path, will occur in the future becomes small. By applying the fuse element FS of this embodiment, variation in the resistance value of the fuse element after cutting can be suppressed and the resistance value of the fuse element after cutting can be sufficiently increased, so that long-term reliability of the semiconductor device can be improved.

As described above, it is desirable to form the metallic silicide layers SL3 not only on the upper surface but also on the side surfaces of the silicon patterns SPTs. For this reason, the sidewall spacer SW2 is etched in step S11, so that the metallic silicide layers SL3 are also formed on the side surfaces of the silicon patterns SPTs in step S12.

However, when the metallic silicide layers SL3 are formed on the upper surface and the side surfaces of the silicon patterns SPTs, the MISFET may be adversely affected depending on the method.

Figure 33:
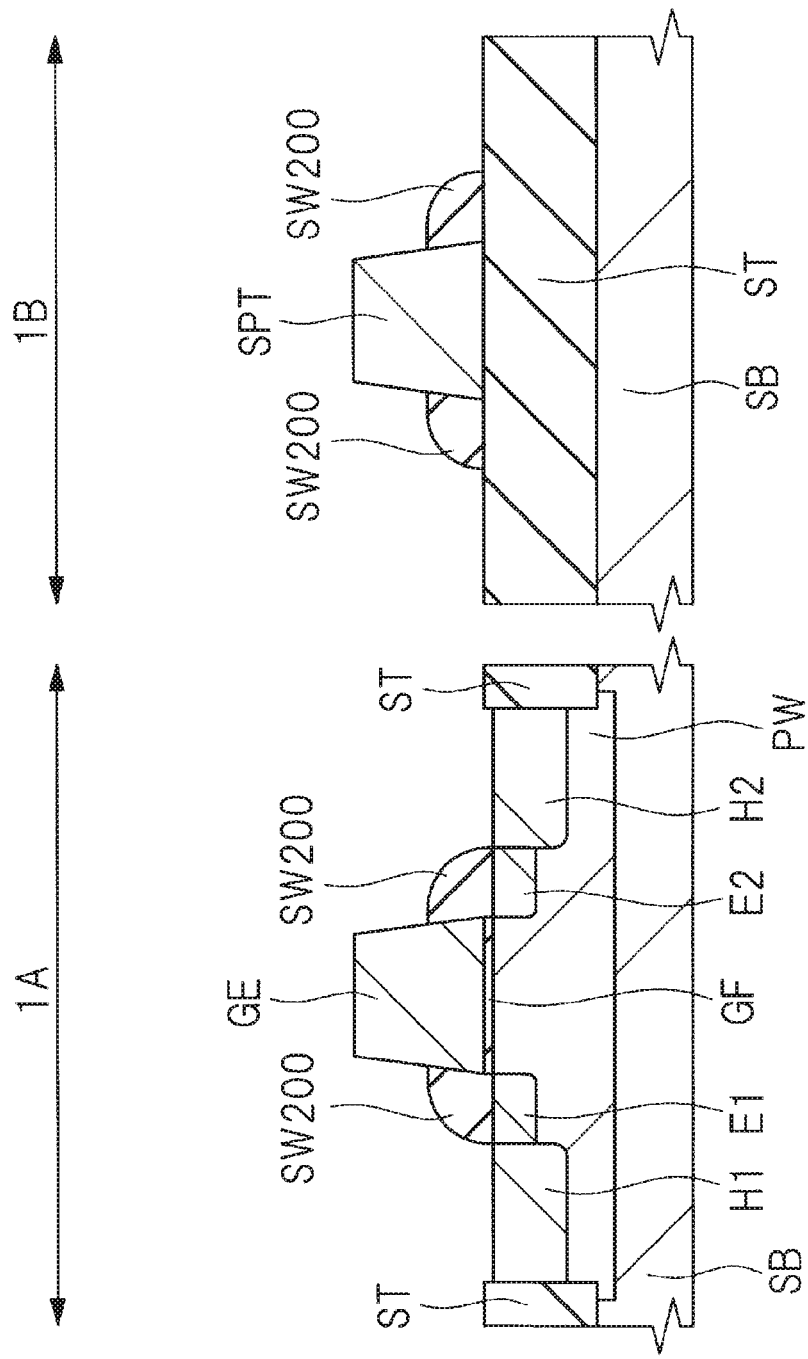
FIG. 33 is a cross-sectional view of a main part during a manufacturing process of the semiconductor device of the second study example.
Figure 34:
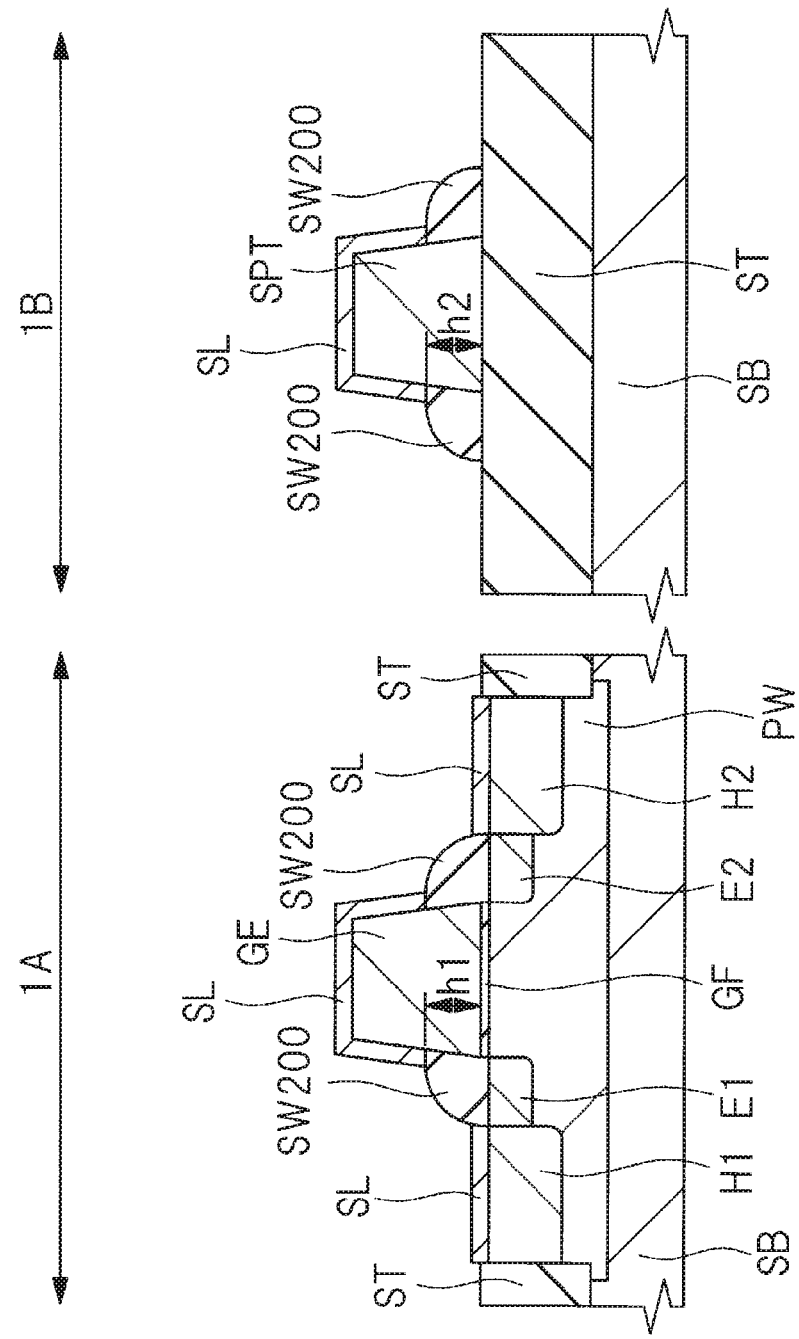
FIG. 34 is a cross-sectional view of a main part during the manufacturing process of the semiconductor device continued from FIG. 33.

FIG. 33 and FIG. 34 are cross-sectional views of main parts during the manufacturing process of the semiconductor device of the second study example examined by the present inventor. FIG. corresponds to the process step of FIG. 15, and FIG. 34 corresponds to the process step of FIG. 21.

Although the sidewall spacer SW is formed by etching back the insulating film SWZ after forming the insulating film SWZ as shown in FIG. 14, in the second study example, the height of the sidewall spacer SW to be formed is lowered by increasing the etching back amount of the insulating film SWZ as shown in FIG. 33. Here, the sidewall spacers SW formed in the second study examples are referred to as sidewall spacers SW200 by reference numerals SW200.

The height of the sidewall spacer SW200 in FIG. 33 (second study example) is significantly lower than the height of the sidewall spacer SW in FIG. 15, and therefore significantly lower than the height of the gate electrode GE and the silicon pattern SPT. As a result, the upper portions of the side surfaces of the gate electrodes GE and the silicon patterns SPT are not covered with the sidewall spacers SW200.

In the second study, after the sidewall spacer SW200 is formed, the same steps as in steps S9 and S10 are performed to form the n+type semiconductor regions H1 and H2, and thereafter, without performing step S11, the metal silicide layers SL are formed by performing the same steps as in step S12, whereby the structure of FIG. 34 is obtained.

In the second study, since the height of the sidewall spacer SW200 is lowered at the stage of forming the sidewall spacer SW200, the metal silicide layers SL are formed not only on the upper surfaces but also on the upper surfaces of the gate electrodes GE and the silicon patterns SPT in each of the gate electrodes GE and the silicon patterns SPT, as shown in FIG. 34, even if the above-mentioned step S11 is not performed.

However, in the second study, the height of the sidewall spacer SW200 has been lowered at the stage of ion implantation in S9. Therefore, when the n+type semiconductor regions H1 and H2 are formed by the ion implantation in step S9, the impurity ions to be implanted may penetrate the sidewall spacer SW200, and the source/drain regions of the LDD structure may not be accurately formed. This leads to deterioration in the performance and reliability of the semiconductor device. In the second study, when the height of the sidewall spacer SW200 is increased, the metallic silicide layers SL are not formed on the side surfaces of the silicon patterns SPT.

On the other hand, in the present embodiment, after the n+type semiconductor regions H1 and H2 are formed by ion implantation in step S9, the sidewall spacer SW2 is etched in step S11, thereby enabling the metallic silicide layers SL to be formed on the side surfaces of the silicon patterns SPT. Since the sidewall spacer SW2 is etched in step S11 after the ion implantation in step S9, the height of the sidewall spacer SW2 does not need to be lowered at the time of the ion implantation in step S9. That is, in the present embodiment, the metal silicide layer SL can be formed on the upper surface and side surfaces of the silicon pattern SPT by etching the side wall spacer SW2 in step S11, even if the height of the side wall spacer SW2 is not lowered during ion implantation of the step. Therefore, in this embodiment, when the n+type semiconductor regions H1 and H2 are formed by the ion implantation in S9, the impurity ions to be implanted can be prevented from penetrating the sidewall spacer SW2, and the source/drain regions of the LDD-structure can be accurately formed. Thus, the performance and reliability of the semiconductor device can be improved.

Figure 35:
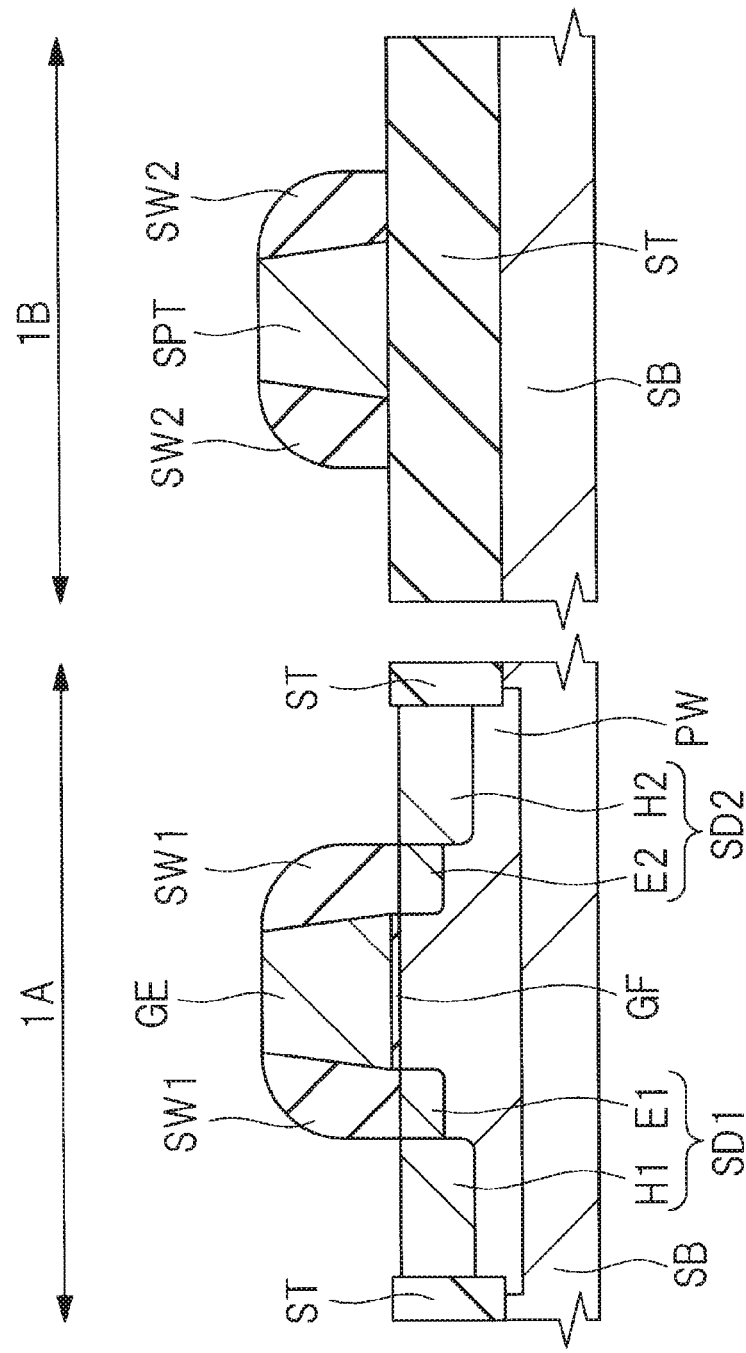
FIG. 35 is a cross-sectional view of a main part during a manufacturing process of the semiconductor device of the third study example.
Figure 36:
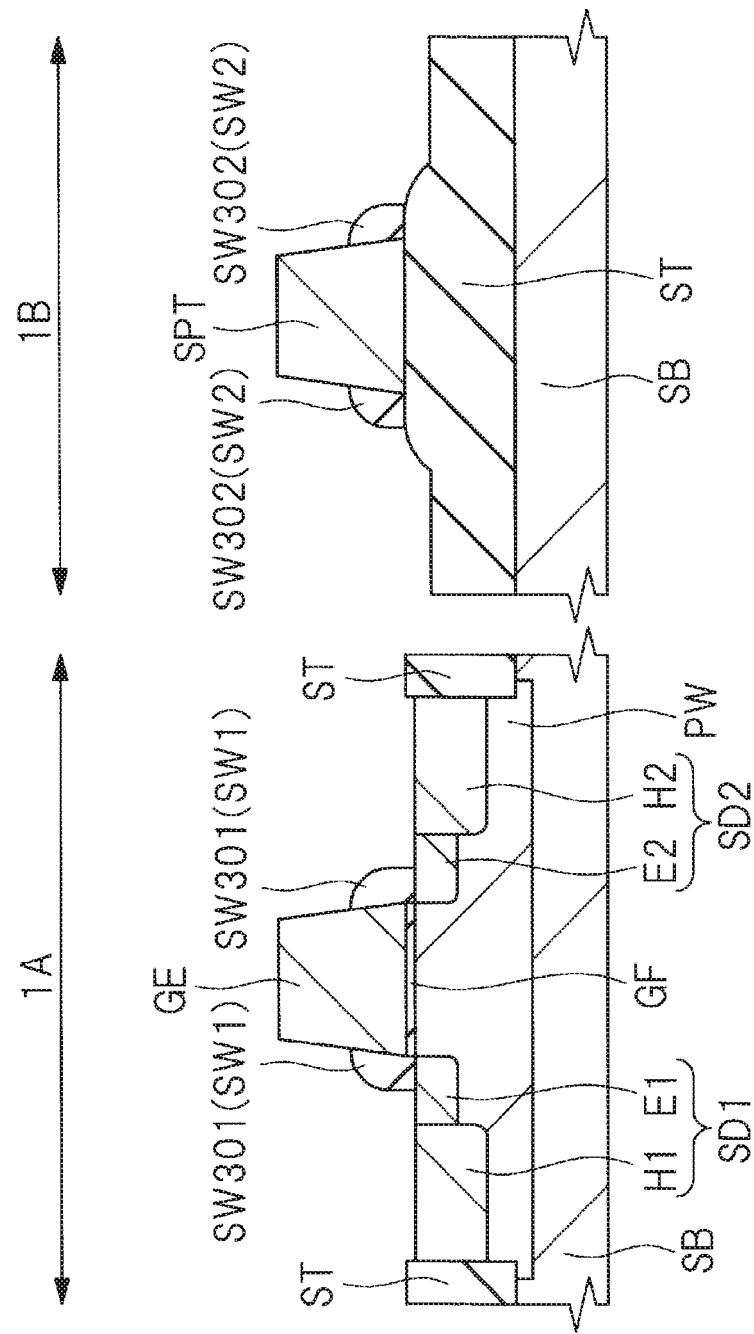
FIG. 36 is a cross-sectional view of a main part during the manufacturing process of the semiconductor device continued from FIG. 35.
Figure 37:
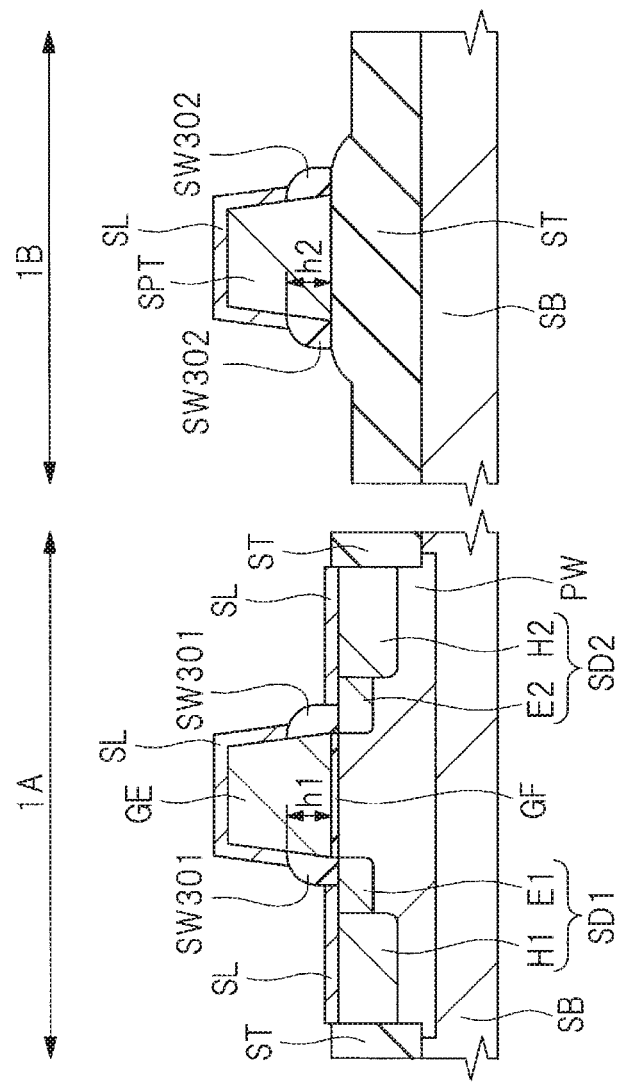
FIG. 37 is a cross-sectional view of a main part during the manufacturing process of the semiconductor device continued from FIG. 36.

FIGS. 35 to 37 are cross-sectional views of main parts during the manufacturing process of the semiconductor device of the third study example examined by the present inventor.

In the third study, after the manufacturing processes of steps S9 and S10 are performed to obtain the same structure as the structure of FIG. 35 in FIG. 16, the sidewall spacer SW1, SW2 is etched without forming the photoresist pattern RP1. Hereinafter, this etching process is referred to as an etching process of FIG. 36, and FIG. 36 shows a stage where this etching process is completed.

In the etching process of FIG. 36 of the third study, since the etching is performed without forming the photoresist pattern RP1, not only the silicon pattern SPT and the sidewall spacers SW2 but also the gate electrode GE, the sidewall spacers SW1, and the n+type semiconductor regions H1 and H2 are exposed to perform the etching. Therefore, in the etching step of FIG. 36, not only the sidewall spacer SW2 but also the sidewall spacer SW1 are etched.

Here, the sidewall spacer SW1 after the etching step of FIG. 36 is denoted by SW301, and the sidewall spacer SW2 after the etching step of FIG. 36 is denoted by SW302, as the sidewall spacer SW302. The height of the sidewall spacer SW301 is lower than the height of the sidewall spacer SW1 before the etching step of FIG. 36, and the height of the sidewall spacer SW302 is lower than the height of the sidewall spacer SW2 before the etching step of FIG. 36.

Thereafter, in the third study example, the metal silicide layer SL is formed by performing the same process as that in step S12, thereby obtaining the structure of FIG. 37.

In the third study, the sidewall spacer SW1, SW2 is etched in the etching process of FIG. 36 after the above steps S9 and S10 are performed and before the metallic silicide layers SL are formed, thereby lowering the height of the sidewall spacer SW301,SW302. Therefore, in each of the gate electrode GE and the silicon pattern SPT, the metal film ME is formed in a state in which not only the upper surface but also the upper portion of the side surface are exposed. Therefore, when the salicide process is performed, as shown in FIG. 37, the metal silicide layer SL is formed not only on the upper surface but also on the upper portion of the side surface in each of the gate electrode GE and the silicon pattern SPT.

However, in the third study, not only the sidewall spacers SW2 but also the sidewall spacers SW1 are etched, but this may lead to a short circuit between the gate electrodes GE and the n+type semiconductor regions H1 and H2.

That is, if the sidewall spacer SW1 disappears by the etch process of FIG. 36, the metal silicide layers formed on the surfaces of the gate electrodes GE and the metal silicide layers formed on the surfaces of the source/drain regions GE are connected to each other by the subsequent salicide process. This causes a short circuit between the gate electrode GE and the source/drain regions. Therefore, in order to improve the reliability of the semiconductor device, it is desirable to reliably prevent the sidewall spacer SW1 from disappearing prior to the salicide process. Even if the sidewall spacer SW1 does not disappear by the etching step of FIG. 36, if the width of the sidewall spacer SW301 becomes small, the metal silicide layers SL are formed not only on the n+type semiconductor regions H1 and H2 but also on the n-type semiconductor regions E1 and E2 having low impurity concentrations. This leads to deterioration of the performance of the semiconductor device. The width of the sidewall spacer corresponds to the width of the sidewall spacer in the gate length direction of the gate electrode.

That is, in the third study, the etching of the sidewall spacer SW2 in the etching step of FIG. 36 is advantageous because it leads to the formation of the metallic silicide layers SL on the upper surface and the side surfaces of the silicon patterns SPT, and furthermore, as described above, it leads to the suppression of the variation in the resistance value of the fuse element after cutting and the increase in the resistance value of the fuse element after cutting. In addition, even if the sidewall spacer SW2 disappears in the etch process of FIG. 36, no particular problem occurs.

On the other hand, in the third study, it is preferable not to etch the sidewall spacer SW1 in the etching step of FIG. 36 because the sidewall spacer SW1 may be excessively etched and disappear. In addition, from the viewpoint of preventing the metallic silicide layers SL from being formed on the n-type semiconductor regions E1 and E2 having low impurity concentrations, it is preferable not to etch the sidewall spacer SW1 in the etching step of FIG. 36. In addition, if the etching quantity is strictly controlled so that the sidewall spacer SW1 is not excessively etched in the etching process of FIG. 36, it becomes difficult to control the manufacturing process of the semiconductor device. Further, when the etching process of FIG. 36 is performed by anisotropic etching, there is a concern that the n+type semiconductor regions H1 and H2 are damaged, whereas when the etching process of FIG. 36 is performed by isotropic etching, there is a concern that the metallic silicide layers SL are formed on the n-type semiconductor regions E1 and E2 having low impurity concentrations.

In contrast, in the present embodiment, in step S11, a mask layer (here a photoresist pattern RP1) is formed that covers the gate electrode GE and the sidewall spacer SW1 and exposes the silicon pattern SPT and the sidewall spacer SW2, and then etches the sidewall spacer SW2 and then removes the mask layer. That is, in the present embodiment, the sidewall spacer SW2 is etched while the gate electrode GE and the sidewall spacer SW1 are covered with a mask layer (here, the photoresist pattern RP1). Therefore, in step S11, the sidewall spacer SW2 is etched, but the sidewall spacer SW1 does not have to be etched, so that there is no fear that the sidewall spacer SW1 is lost by the etching in step S11. In addition, it is possible to prevent the sidewall spacer SW1 from becoming smaller by the etch in S11. Therefore, in the present embodiment, since the metal silicide layer SL can be formed by performing step S12 with the sidewall spacer SW1 surely present, it is possible to prevent the gate electrode GE and the source/drain regions from being short-circuited through the metal silicide layer SL. In addition, the metallic silicide layers SLs can be prevented from being formed on the n-type semiconductor regions E1 and E2 having low impurity concentrations. As a result, the reliability of the semiconductor device can be accurately improved.

In the present embodiment, it is preferable that not only the gate electrode GE and the sidewall spacer SW1 but also the n+type semiconductor regions H1 and H2 are covered with the mask layer (photoresist pattern RP1). As a result, the n+type semiconductor regions H1 and H2 can be prevented from being etched by the etching in S11. This aspect can also contribute to improvement in reliability of the semiconductor device.

Further, even if the sidewall spacer SW2 disappears in the etch of S11, no particular problem occurs. Therefore, the process control of the etching in step S11 is easy.

In other words, in the present embodiment, the sidewall spacer SW2 is etched in step S11, whereby the metallic silicide layers SL can be formed on the upper surface and the side surfaces of the silicon patterns SPT, thereby suppressing variations in the resistance values of the fuse elements after cutting and increasing the resistance values of the fuse elements after cutting as described above. Thus, the reliability of the semiconductor device can be improved. By preventing the sidewall spacer SW1 from being etched in operation S11, the problem described in the third study can be solved or improved.

Here, in the first examination example shown in FIG. 30, when the metal silicide layers SL are formed, the heights of the sidewall spacers SW1 on both sides of the gate electrodes GE are the same as the heights of the sidewall spacers SW2 on both sides of the silicon patterns SPT. Further, in the second examination example shown in FIG. 34, when the metal silicide layers SL are formed, the heights of the side wall spacers SW200 on both sides of the gate electrodes GE are the same as the heights of the side wall spacers SW200 on both sides of the silicon patterns SPT. In addition, in the third study example shown in FIG. 37, when the metal silicide layers SL are formed, the heights of the sidewall spacers SW301 on both sides of the gate electrodes GE are the same as the heights of the sidewall spacers SW302 on both sides of the silicon patterns SPT. This is because, in any of the first study example, the second study example, and the third study example, the manufacturing process of etching only the sidewall spacer SW2 of the sidewall spacer SW1, SW2 as in step S11 is not introduced.

Therefore, in each of the first study example, the second study example, and the third study example, the height (distance) h1 from the lower surface of the gate electrode GE to the lower end of the metal silicide layer SL1 formed on the surface of the gate electrode GE and the height (distance) h2 from the lower surface of the silicon pattern SPT to the lower end of the metal silicide layer SL formed on the surface of the silicon pattern SPT are the same (i.e., h1=h2). The heights h1 and h2 are shown in FIGS. 30, 34 and 37.

In contrast, in the present embodiment, when the sidewall spacer SW1, SW2 is formed in S8, the height of the sidewall spacer SW1 and the height of the sidewall spacer SW2 are substantially the same.
However, in S11, the sidewall spacer SW2 is etched, and the sidewall spacer SW1 is not etched. Therefore, when the metal silicide layer SL is formed in step S12, the sidewall spacers SW1 are formed on both sides of the gate electrode GE as shown in FIG. 21, but the sidewall spacers are not formed on both sides of the gate electrode GE. Alternatively, when the metallic silicide layers SL are formed in S12, the heights of the sidewall spacers SW2a on both sides of the silicon patterns SPT are lower than the heights of the sidewall spacers SW1 on both sides of the gate electrodes GE, as shown in FIG. 28.

Therefore, in the present embodiment (FIG. 21 or FIG. 28), the height h4 from the lower surface of the silicon pattern SPT to the lower end of the metal silicide layer SL3 is lower (smaller) than the height h3 from the lower surface of the gate electrode GE to the lower end of the metal silicide layer SL1 (i.e., h4<h3). In other words, in the present embodiment (FIG. 21 or FIG. 28), the height (distance) h3 from the lower surface of the gate electrode GE to the lower end of the metal silicide layer SL1 is higher (larger) than the height (distance) h4 from the lower surface of the silicon pattern SPT to the lower end of the metal silicide layer SL3.

The heights h3 and h4 are shown in FIGS. 21 and 28 and FIGS. 40 to 42 to be described later. However, in FIG. 21, since the lower end of the metal silicide layer SL3 is located at substantially the same height as the lower surface of the silicon pattern SPT, the height h4 is substantially zero, and therefore the reference code h4 is not shown in FIG. 21.

Here, the height h3 corresponds to the height from the lower surface of the gate electrode GE to the lower end of the metallic silicide layers SL1 in the cross-sectional view perpendicular to the gate widthwise direction of the gate electrode GE. The lower end of the metal silicide layer SL1 corresponds to the lowest portion (lowest portion) of the metal silicide layer SL1 in a cross-section (cross-sectional view) perpendicular to the gate widthwise directions of the gate electrodes GE. The height h1 is also defined in the same manner as the height h3. The cross section perpendicular to the gate width direction of the gate electrode GE has the same meaning as the cross section along the gate length direction of the gate electrode GE. The cross-sectional views of the MISFET forming regions 1A shown in FIGS. 1, 21, and 28 correspond to cross-sections perpendicular to the gate widthwise directions of the gate electrodes GEs.

The height h4 corresponds to the height from the lower surface of the silicon pattern SPT to the lower end of the metallic silicide layers SL3 in the cross-sectional view perpendicular to the extension of the silicon pattern SPT. The lower end of the metal silicide layer SL3 corresponds to the lowest portion (lowest portion) of the metal silicide layer SL1 in a cross-section (cross-sectional view) perpendicular to the extension direction of the silicon patterns SPTs. The height h2 is also defined in the same manner as the height h4. The cross-sectional views of the fuse element forming regions 1B shown in FIGS. 3, 21, and 28 correspond to cross-sections perpendicular to the extension directions of the silicon patterns SPTs.

In the present embodiment, since the metal silicide layer SL3 is also formed on the side surface of the silicon pattern SPT, the height h4 corresponds to the height from the lower surface of the silicon pattern SPT to the lower end of the metal silicide layer SL3 formed on the side surface of the silicon pattern SPT in the cross-sectional view perpendicular to the extension direction of the silicon pattern SPT.

The height is a distance (dimension) in the height direction, and the height direction coincides with a direction substantially perpendicular to the main surface of the semiconductor substrate SB, that is, the thickness direction of the semiconductor substrate SB.

In the case where the height h1 is the same as the height h2, when the metal silicide layer SL is actively formed on the side surface of the silicon pattern SPT, the metal silicide layer SL is also actively formed on the side surface of the gate electrode GE. In this case, when the metal silicide layer SL is also formed on the side surface of the silicon pattern SPT to lower the height h2, the metal silicide layer SL is also formed on the side surface of the gate electrode GE to lower the height h1, which is accompanied by lowering the height of the sidewall spacers on both sides of the gate electrode GE. Reducing the height of the sidewall spacers on both sides of the gate electrode GE leads to the problem of the second study example or the problem of the third study example.

That is, in order to solve the problem of the first examination example, it is effective to form the metallic silicide layer SL also on the side surface of the silicon pattern SPT to lower the height h2, while in order to solve the problem of the second examination example and the third examination example, it is effective to increase the height of the sidewall spacer SW1 at the stage of the salicide process, that is, to increase the height h1. However, when the height h1 and the height h2 are the same, the solution of the problem of the first study example and the solution of the problem of the second study example and the third study example cannot be compatible with each other.

On the other hand, in the present embodiment, the height h4 from the lower surface of the silicon pattern SPT to the lower end of the metal silicide layer SL3 is lower (smaller) than the height h3 from the lower surface of the gate electrode GE to the lower end of the metal silicide layer SL1 (h4>h3). That is, while the metal silicide layer SL3 is actively formed on the side surfaces of the silicon patterns SPTs, the metal silicide layer SL1 is not formed on the side surfaces of the gate electrodes GEs as much as possible. Therefore, by actively forming the metallic silicide layer SL3 on the side surface of the silicon pattern SPT to reduce the height h4, the problem of the first study example can be solved or improved. Since the height h3 from the lower surface of the gate electrode GE to the lower end of the metal silicide layer SL1 is increased, the height of the sidewall spacer SW1 can be increased in the step of forming the n+type semiconductor regions H1 and H2 and the step of forming the metal silicide layer SL, and thus the problems of the second study example and the third study example can be solved or improved. That is, by forming the metallic silicide layer SL3 not only on the upper surface but also on the side surface of the silicon pattern SPT, and by making the height h4 lower than the height h3 (h4<h3), any of the problems of the first study example, the second study example, and the third study example can be solved or improved.

Therefore, in the present embodiment, the manufactured semiconductor device is characterized in that the metallic silicide layers SL3 are formed not only on the upper surface but also on the side surfaces of the silicon patterns SPTs for fuse elements, and the height h4 is lower (smaller) than the height h3.

Although the height h4 is lower than the height h3, it is more preferable if the height h4 is 0.7 times or less the height h3, i.e., h4≤h3×0.7. As a result, it is possible to accurately obtain the effect of decreasing the height h4, that is, the effect of suppressing the variation in the resistance value of the fuse element after cutting and sufficiently increasing the resistance value of the fuse element after cutting, and it is possible to accurately obtain the effect of increasing the height h3, that is, the effect of solving the problems of the second study example and the third study example.

The height h4 is more preferably equal to or less than 0.7 times the height (thickness) h5 of the silicon pattern SPT (i.e., h4≤h5×0.7). As a result, the area of the side surface of the silicon pattern SPT covered with the metallic silicide layer SL3 can be increased, and the effect of reducing the height h4, that is, the effect of suppressing the variation in the resistance value of the fuse element after cutting and sufficiently increasing the resistance value of the fuse element after cutting can be accurately obtained.

The height h8 of the sidewall spacer SW2 (SW2a immediately after the etching in step S11 is preferably 0.7 times or less (i.e., h8≤h7×0.7) of the height h7 of the sidewall spacer SW2 immediately before the etching in step S11. Thereby, when the metal silicide layer SL is formed, the height h4 can be accurately reduced, and the above-mentioned relationship of h4≤h3×0.7 and the relationship of h4≤h5×0.7 can be easily achieved. The height h8 is shown in FIG. 25, and the height h7 is shown in FIG. 17. In the case of FIG. 18, the height h8 is substantially zero.

Figure 38:
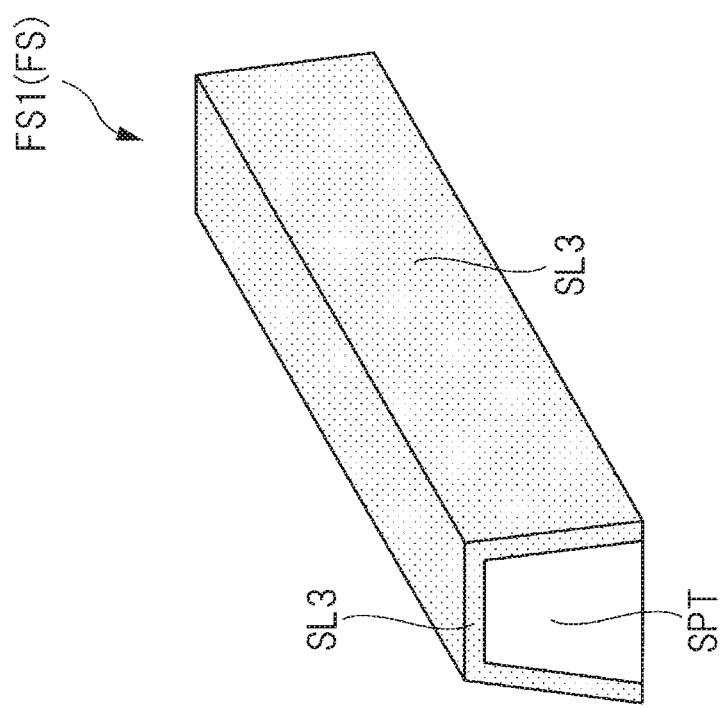
FIG. 38 is a perspective view of the fuse element.

In the present embodiment, in step S12, it is necessary to form the metal film ME not only on the upper surface of the gate electrode GE and the upper surface of the silicon pattern SPT but also on the side surface of the silicon pattern SPT. The metal film ME can be formed preferably by a sputtering method or the like. However, when the metal film ME is formed by the sputtering method, the metal film ME is easily formed on the upper surface of the gate electrode GE and the upper surface of the silicon pattern SPT, but compared to this, there may be a case where the metal film ME is hardly formed on the side surface of the silicon pattern SPT. In this case, there may be a case where the metal film ME is formed on the entire surface of the silicon pattern SPT on the side surface of the silicon pattern SPT, which is not covered with the sidewall spacer SW2, or a case where the metal film ME is partially formed on the entire surface of the silicon pattern SPT. When the metallic film ME is formed on the entire side surface of the silicon pattern SPT, which is not covered with the sidewall spacer SW2, the structure shown in FIG. 38 is obtained at the stage where the step S12 is completed. When the metallic film ME is partially formed on the side surface of the silicon pattern SPT, which is not covered with the sidewall spacer SW2, the structure shown in FIG. 39 is obtained at the stage where the step S12 is completed.

Figure 39:
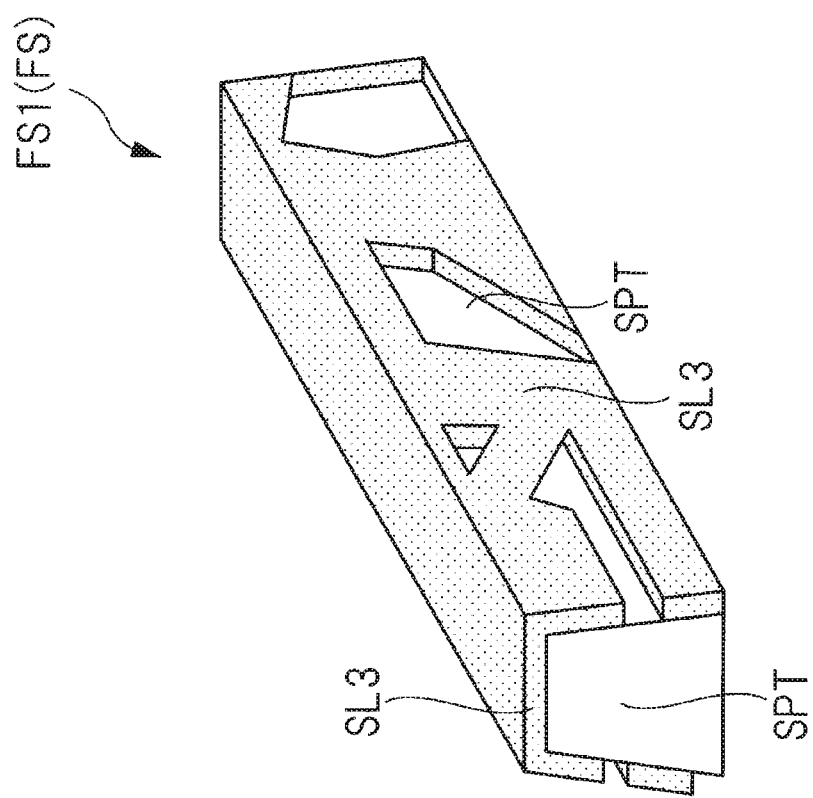
FIG. 39 is a perspective view of a fuse element.

Here, FIGS. 38 and 39 are perspective views of the fuse element forming area 1B in the same process step as that of FIG. 21. However, only the fuse element portion FS1 of the fuse element FS is illustrated in FIGS. 38 and 39, and the contact portion CT1, CT2 of the fuse element FS is not illustrated. Accordingly, FIGS. 38 and 39 correspond to perspective views of the fuse element portion FS1 of the fuse element FS.

In FIG. 38, the metallic silicide layers SL3 are formed on substantially the entire side surfaces of the silicon patterns SPTs which are not covered with the sidewall spacers SW2. In FIG. 39, the metallic silicide layers SL3 are partially formed on the side surfaces of the silicon patterns SPTs that are not covered with the sidewall spacers SW2.

Also in FIG. 39, since the metallic silicide layers SL3 are formed on the side surfaces of the silicon patterns SPTs, variations in the resistance values of the fuse elements after cutting are suppressed, and the resistance values of the fuse elements after cutting are increased, so that the reliability of the semiconductor device including the fuse elements can be improved. Therefore, not only the case of FIG. 38 but also the case of FIG. 39 is included in the present embodiment.

In the case of FIG. 38, the area of the metallic silicide layers SL3 formed on the side surfaces of the silicon patterns SPTs can be increased as compared with the case of FIG. 39. Therefore, compared with the case of FIG. 39, in the case of FIG. 38, the effect of suppressing the variation in resistance value of the fuse element after cutting and increasing the resistance value of the fuse element after cutting can be further enhanced, so that the reliability of the semiconductor device including the fuse element can be further enhanced.

In addition, when the silicon pattern SPT (the cross-sectional shape of FIG. 3) has a tapered shape, the metal silicide layer SL3 is easily formed on the side of the silicon pattern SPT. Since the gate electrode GE and the silicon pattern SPT are formed in the same process, when the silicon pattern SPT (the cross-sectional shape in FIG. 3) has a tapered shape, the gate electrode GE (the cross-sectional shape in FIG. 1) also has a tapered shape.

In addition, in the case of FIG. 38 as well as in the case of FIG. 39, it can be confirmed that h3>h4 holds for the heights h3 and h4 by comparing an arbitrary cross section (a cross section along the gate length direction) of the gate electrode GE with an arbitrary cross section (a cross section substantially perpendicular to the extending direction of the fuse element FS) of the fuse element FS.

Figure 41A:
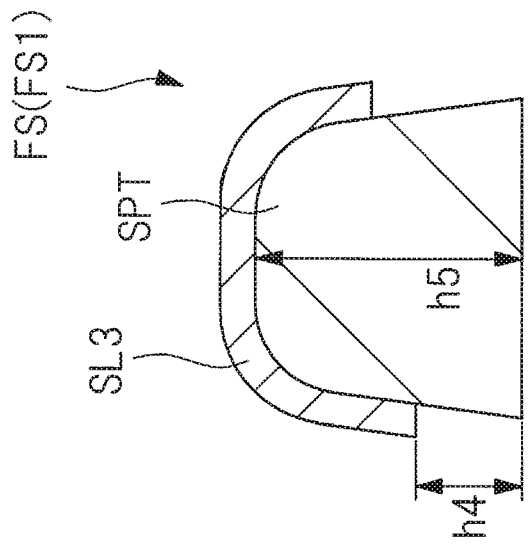
FIG. 41(A) and FIG. 41(B) are cross-sectional views of the gate electrode and the fuse element.
Figure 41B:
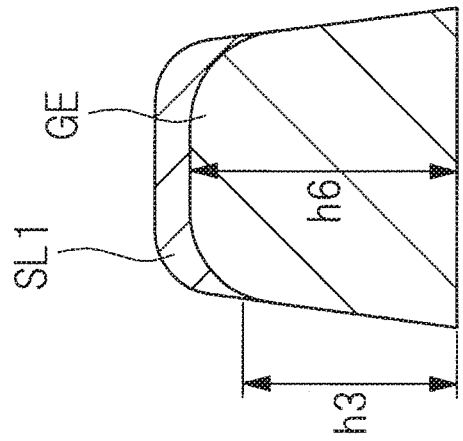
Figure 42A:
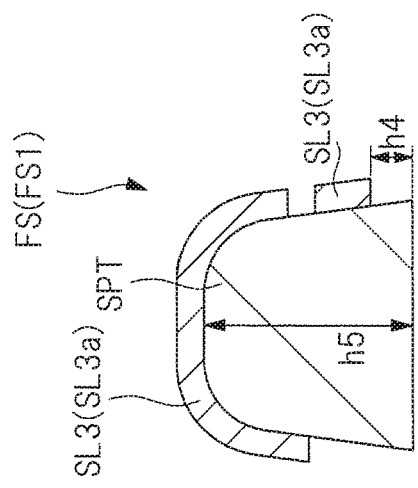
FIG. 42(A) and FIG. 42(B) are cross-sectional views of the gate electrode and the fuse element.
Figure 42B:
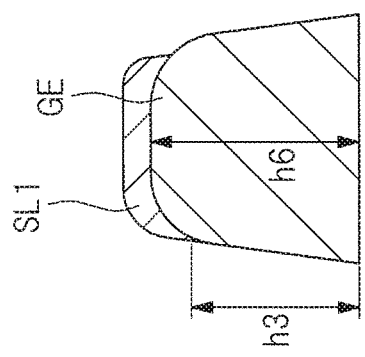

FIGS. 40 to 42 are cross-sectional views of the gate electrode GE and the fuse element FS in the present embodiment. Each of FIGS. 40 to 42 shows a cross section (a cross section corresponding to FIG. 1) of the gate electrode GE, and each of FIGS. 40 to 42 shows a cross section (b cross section corresponding to FIG. 3) of the fuse element FS. In FIGS. 40 to 42, only the gate electrode GE and the metal silicide layer SL1 formed on the surface of the gate electrode GE are shown in (a), and in FIGS. 40 to 42, only the silicon pattern SPT and the metal silicide layer SL3 formed on the surface of the gate electrode GE are shown in (b).

For easy understanding of the heights h3, h4, and h5, the heights h3, h4, and h5 and the height (thickness) h6 of the gate electrode GE are shown in FIGS. 40 to 42.

The height (thickness) h5 of the silicon pattern SPT corresponds to the height (distance) from the bottom surface of the silicon pattern SPT to the top portion (uppermost portion) of the silicon pattern SPT in the cross section (cross section view) perpendicular to the extension direction of the silicon pattern SPT. The height (thickness) h6 of the gate electrode GE corresponds to the height (distance) from the bottom surface of the gate electrode GE to the top portion (uppermost portion) of the gate electrode GE in a cross-section (cross-sectional view) perpendicular to the gate width direction of the gate electrode GE. Since the gate electrode GE and the silicon pattern SPT are formed by patterning the common silicon film PS, the height h6 of the gate electrode GE and the height h5 of the silicon pattern SPT are substantially the same (h5=h6).

In FIG. 42, the metal silicide layer SL3a continuously formed from the upper surface to the side surface of the silicon pattern SPT and the metal silicide layer SL3b formed below the side surface of the silicon pattern SPT appear to be separated from each other, but in reality, as can be seen from FIG. 39, the metal silicide layer SL3a and the metal silicide layer SL3b are integrally formed (connected). That is, the metal silicide layer SL3a and the metal silicide layer SL3b are integrally connected to form the metal silicide layer SL3. Therefore, when a cutting current is applied to the fuse element FS, Joule heat generated in the metal silicide layer SL3 is conducted to the silicon pattern SPT not only from the metal silicide layer SL3a but also from the metal silicide layer SL3b. Therefore, in FIG. 42, the height h 4 corresponds to the height from the lower surface of the silicon pattern SPT to the lower end of the metallic silicide layers SL3b formed on the side surfaces of the silicon pattern SPT.

The invention made by the present inventor has been described above in detail based on the embodiment, but the present invention is not limited to the embodiment described above, and it is needless to say that various modifications can be made without departing from the gist thereof.

What is claimed is:

1. A semiconductor device, comprising:
   a semiconductor substrate;
   an element isolation region formed on the semiconductor substrate;
   a gate electrode for MISFET formed on the semiconductor substrate with a gate insulating film interposed between the semiconductor substrate and the gate electrode;
   a first sidewall spacer formed on a side surface of the gate electrode;
   a silicon pattern for a fuse element formed on the element isolation region;
   a first metal silicide layer formed on an upper surface and a side surface of the silicon pattern; and
   a second metal silicide layer formed on an upper surface of the gate electrode,
   wherein a first height from a lower surface of the silicon pattern to a lower end of the first metal silicide layer in a cross section perpendicular to an extension direction of the silicon pattern is lower than a second height from a lower surface of the gate electrode to a lower end of the second metal silicide layer in a cross section perpendicular to a gate width direction of the gate electrode.

2. The semiconductor device according to claim 1, wherein the semiconductor device has the first height not more than 0.7 times the second height.

3. The semiconductor device according to claim 1, wherein the first height is not more than 0.7 times a height of the silicon pattern.

4. The semiconductor device according to claim 1, wherein the first metal silicide layer and the second metal silicide layer have the same metal element each other.

5. The semiconductor device according to claim 1, wherein a height of the silicon pattern and a height of the gate electrode are the same.

6. The semiconductor device according to claim 1, wherein a sidewall spacer is not formed at a position adjacent to the silicon pattern.

7. The semiconductor device according to claim 1, further comprising:
   a second sidewall spacer adjacent to the silicon pattern,
   wherein a height of the second sidewall spacer is lower than a height of the first sidewall spacer, and
   wherein the first metal silicide layer is formed on a side surface of the silicon pattern in a portion not covered with the second sidewall spacer.

8. The semiconductor device according to claim 1, wherein the fuse element is formed by the silicon pattern and the first metal silicide layer, and the fuse element is a current fusing type fuse element.

9. The semiconductor device according to claim 1, further comprising:
   an interlayer insulating layer formed on the semiconductor substrate so as to cover the gate electrode, the first sidewall spacer, the silicon pattern, the first metal silicide layer, and the second metal silicide layer; and
   a first conductive plug and a second conductive plug embedded in the interlayer insulating layer,
   wherein the fuse element is formed by the silicon pattern,
   wherein the first conductive plug and the second conductive plug are disposed on the first metal silicide layer,
   wherein the first conductive plug and the second conductive plug are electrically connected to the first metal silicide layer respectively, and
   wherein when cutting the fuse element, a current passing through the fuse element is caused to flow between the first conductive plug and the second conductive plug, whereby the fuse element is cut.

10. The semiconductor device according to claim 1, further comprising:
    semiconductor regions for sources or drains of the MISFET formed at positions on both sides of the gate electrode in the semiconductor substrate.

11. A method of manufacturing a semiconductor device comprising the step of:
    (a) preparing a semiconductor substrate;
    (b) forming an element isolation region made of an insulator on the semiconductor substrate;
    (c) after the step (b), forming a gate electrode for MISFET on the semiconductor substrate with a gate insulating film interposed therebetween; and
    forming a silicon pattern for a fuse element on the element isolation region;
    (d) after the step (c) forming a first sidewall spacer on a side surface of the gate electrode; and
    forming a second sidewall spacer on a side surface of the silicon pattern;
    (e) after the step (d) forming semiconductor region for source or drain of the MISFET on the semiconductor substrate by ion implantation;
    (f) after the step (e) forming a mask layer covering the gate electrode and the first sidewall spacer and exposing the silicon pattern and the second sidewall spacer;
    (g) after the step (f), etching the second sidewall spacer;
    (h) after the step (g), removing the mask layer;
    (i) after the step (h) forming a metal film on the semiconductor substrate so as to cover the gate electrode, the first sidewall spacer, and the silicon pattern;
    (j) after the step (i) reacting the metal film with the semiconductor region, the gate electrode, and the silicon pattern by heat treatment; and
    (k) after the step (j) removing the metal film that has not reacted in the step (j),
    wherein, in the step (j), the silicon pattern and the metal film react with each other to form a first metal silicide layer on an upper surface and the side surface of the silicon pattern, the gate electrode and the metal film react with each other to form a second metal silicide layer on an upper surface of the gate electrode, and the semiconductor region and the metal film react with each other to form a third metal silicide layer on an upper surface of the semiconductor region.

12. The method of manufacturing a semiconductor device according to claim 11, wherein a first height from a lower surface of the silicon pattern to a lower end of the first metal silicide layer in a cross section perpendicular to an extension direction of the silicon pattern is lower than a second height from a lower surface of the gate electrode to a lower end of the second metal silicide layer in a cross section perpendicular to a gate width direction of the gate electrode.

13. The method of manufacturing a semiconductor device according to claim 11, wherein, in the step (g), the second sidewall spacer is removed by etching.

14. The method of manufacturing a semiconductor device according to claim 11, wherein, in the step (g), a height of the second sidewall spacer is reduced by etching.

15. The method of manufacturing a semiconductor device according to claim 14, wherein the height of the second sidewall spacer immediately after the etching of the step (g) is 0.7 times or less of the height of the second sidewall spacer immediately before the etching of the step (g).

16. The method of manufacturing a semiconductor device according to claim 11,
wherein the fuse element is formed by the silicon pattern and the first metal silicide layer, and
wherein the fuse element is a current fusing type fuse element.

17. The method of manufacturing a semiconductor device according to claim 11, wherein the step (c) comprising the step of:
(c1) forming the gate insulating film on the semiconductor substrate;
(c2) forming a silicon film on the gate insulating film and the element isolation region after the step (c1); and
(c3) forming the gate electrode and the silicon pattern by patterning the silicon film after the step (c2).

* * * * *